(12) United States Patent
Penley et al.

(10) Patent No.: US 11,841,036 B2
(45) Date of Patent: *Dec. 12, 2023

(54) LAMINAR FLOW RESTRICTOR AND SEAL FOR SAME

(71) Applicant: Ichor Systems, Inc., Fremont, CA (US)

(72) Inventors: Sean Joseph Penley, Sparks, NV (US); Zachariah Ezekiel McIntyre, Houston, TX (US); Tyler James Wright, Reno, NV (US); Matthew Eric Kovacic, Reno, NV (US); Christopher Bryant Davis, Georgetown, TX (US)

(73) Assignee: Ichor Systems, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 17/710,290

(22) Filed: Mar. 31, 2022

(65) Prior Publication Data

US 2022/0220986 A1    Jul. 14, 2022

Related U.S. Application Data

(63) Continuation-in-part of application No. 16/985,635, filed on Aug. 5, 2020, now Pat. No. 11,585,444, and a continuation-in-part of application No. 16/985,540, filed on Aug. 5, 2020, now Pat. No. 11,639,865.

(60) Provisional application No. 62/882,794, filed on Aug. 5, 2019, provisional application No. 62/882,814, filed on Aug. 5, 2019.

(51) Int. Cl.
| | |
|---|---|
| *F15D 1/02* | (2006.01) |
| *F16K 1/32* | (2006.01) |
| *H01L 21/67* | (2006.01) |

(52) U.S. Cl.
CPC .............. *F15D 1/025* (2013.01); *F16K 1/32* (2013.01); *H01L 21/67017* (2013.01)

(58) Field of Classification Search
CPC ...... F15D 1/025; G01F 1/40; F16L 55/02727; F16L 55/0279; F16L 55/02709; F16L 55/02718; F16L 55/02763; F16K 47/08
USPC ........................................................ 138/42
See application file for complete search history.

(56) References Cited

U.S. PATENT DOCUMENTS

| | | | |
|---|---|---|---|
| 1,883,720 A | 10/1932 | Grimes | |
| 2,173,022 A | 9/1939 | Mitchell | |
| 2,672,159 A | 3/1954 | Walton | |
| 3,018,799 A | 1/1962 | Hartzell | |
| 3,071,160 A | 1/1963 | Weichbrod | |
| 3,145,529 A | 8/1964 | Maloof | |

(Continued)

FOREIGN PATENT DOCUMENTS

| | | |
|---|---|---|
| JP | 2005509514 A | 4/2005 |
| JP | 2006294678 A | 10/2006 |

(Continued)

*Primary Examiner* — Michael R Reid
(74) *Attorney, Agent, or Firm* — The Belles Group, P.C.

(57) ABSTRACT

Apparatuses for controlling gas flow are important components for delivering process gases for semiconductor fabrication. These apparatuses for controlling gas flow frequently rely on flow restrictors which can provide a known flow impedance of the process gas. In one embodiment, a flow restrictor is disclosed, the flow restrictor constructed of a plurality of layers, one or more of the layers having a flow passage therein that extends from a first aperture at a first end of the flow restrictor to a second aperture at a second end of the flow restrictor.

19 Claims, 57 Drawing Sheets

(56) References Cited

U.S. PATENT DOCUMENTS

| | | |
|---|---|---|
| 3,789,880 A | 2/1974 | Armstrong |
| 3,851,526 A | 12/1974 | Drexel |
| 3,921,672 A | 11/1975 | Arnold |
| 4,070,005 A | 1/1978 | McJones |
| 4,079,754 A * | 3/1978 | Porter .................. F15D 1/02 138/42 |
| 4,450,718 A | 5/1984 | Hartemink |
| 4,497,202 A | 2/1985 | Mermelstein |
| 4,662,401 A | 5/1987 | Zingg |
| 4,911,481 A | 3/1990 | Oberdorfer-Bogel |
| 4,930,791 A | 6/1990 | Ungchusri |
| 5,070,909 A | 12/1991 | Davenport |
| 5,267,584 A | 12/1993 | Smith |
| 5,318,073 A | 6/1994 | Kendrick |
| 5,507,468 A | 4/1996 | Evans |
| 5,576,498 A | 11/1996 | Shambayati |
| 5,769,122 A | 6/1998 | Baumann et al. |
| 5,836,356 A | 11/1998 | Desai |
| 5,863,129 A | 1/1999 | Smith |
| 6,161,614 A | 12/2000 | Woodhull, Jr. et al. |
| 6,539,968 B1 | 4/2003 | White |
| 6,615,874 B2 | 9/2003 | Thurston et al. |
| 6,799,602 B2 | 10/2004 | Staton et al. |
| 7,241,423 B2 | 7/2007 | Golbig |
| 7,363,940 B2 | 4/2008 | Oberley |
| 7,431,045 B2 | 10/2008 | Mudd et al. |
| 8,109,296 B2 | 2/2012 | Minegishi et al. |
| 8,365,765 B2 | 2/2013 | Bell |
| 8,376,312 B2 | 2/2013 | Mudd et al. |
| 8,459,305 B2 | 6/2013 | Sutliff |
| 9,109,736 B2 | 8/2015 | Yada et al. |
| 10,386,003 B2 | 8/2019 | Kerr |
| 2003/0150560 A1 | 8/2003 | Kinnard |
| 2004/0011198 A1 | 1/2004 | Keefer et al. |
| 2004/0163539 A1 | 8/2004 | Fang |
| 2005/0016604 A1 | 1/2005 | Steinke et al. |
| 2006/0254752 A1 | 11/2006 | Narakino et al. |
| 2006/0275185 A1 | 12/2006 | Tonkovich et al. |
| 2009/0230342 A1 | 9/2009 | Komoto et al. |
| 2011/0232843 A1 | 9/2011 | Bowman et al. |
| 2011/0297263 A1 | 12/2011 | Atkins |
| 2012/0111271 A1 | 5/2012 | Begarney et al. |
| 2012/0299252 A1 | 11/2012 | Singh |
| 2013/0037153 A1 | 2/2013 | Schommer |
| 2013/0186499 A1 | 7/2013 | Yada et al. |
| 2013/0299144 A1 | 11/2013 | Van Lieu et al. |
| 2014/0190578 A1 | 7/2014 | Hayashi |
| 2016/0124439 A1 | 5/2016 | Yasuda et al. |
| 2017/0025299 A1 | 1/2017 | Sasaki et al. |
| 2017/0241583 A1 | 8/2017 | Chinazi |
| 2017/0269614 A1 | 9/2017 | Kuru |
| 2018/0188700 A1 | 7/2018 | Penley et al. |

FOREIGN PATENT DOCUMENTS

| | | |
|---|---|---|
| JP | 2007-041870 | 2/2007 |
| JP | 2017057129 A | 3/2017 |

* cited by examiner

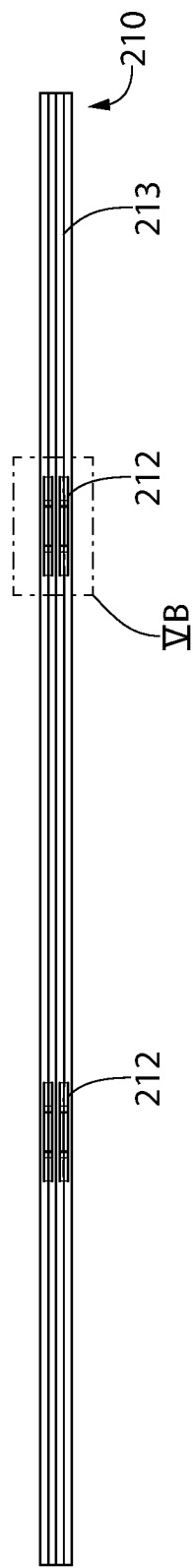

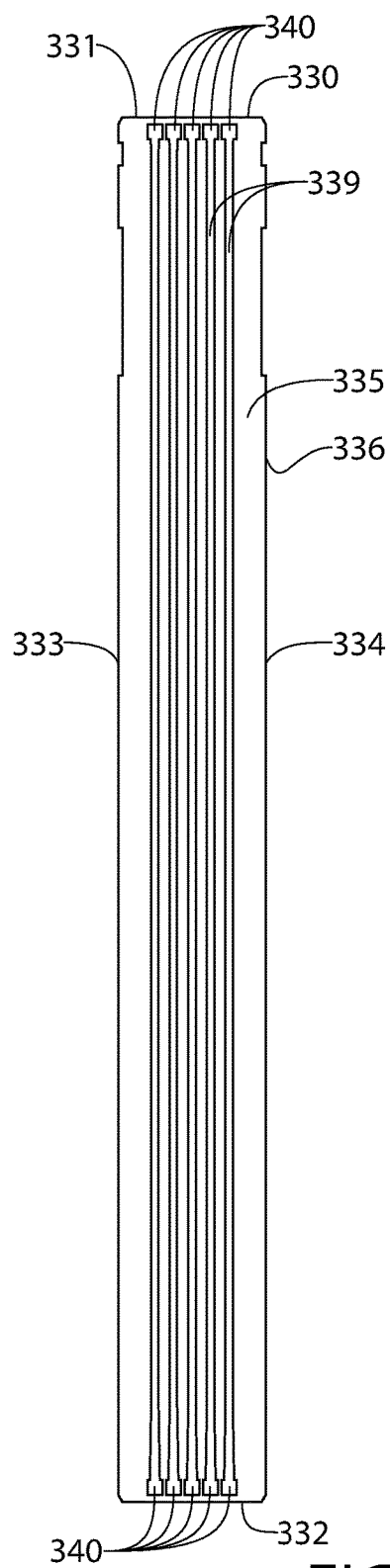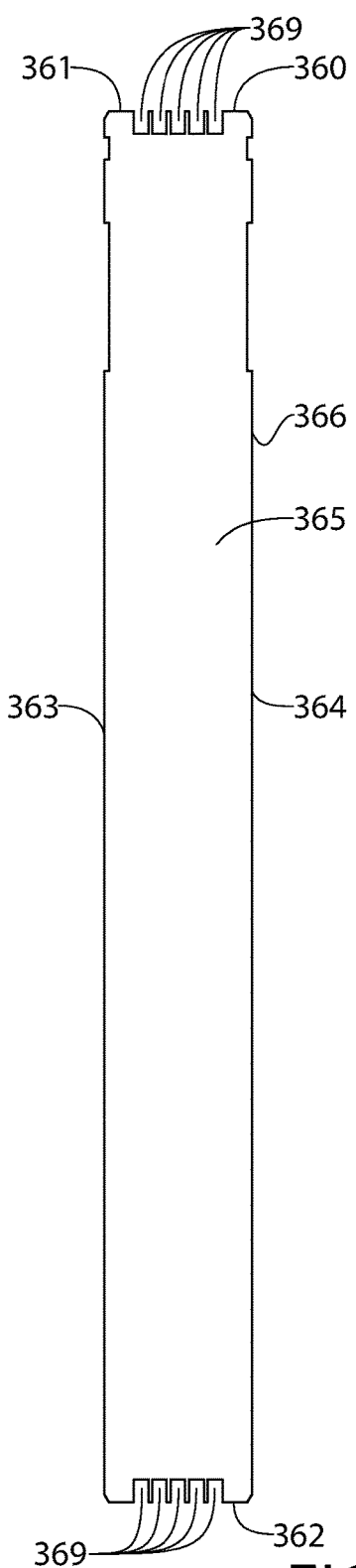
FIG. 15
FIG. 16

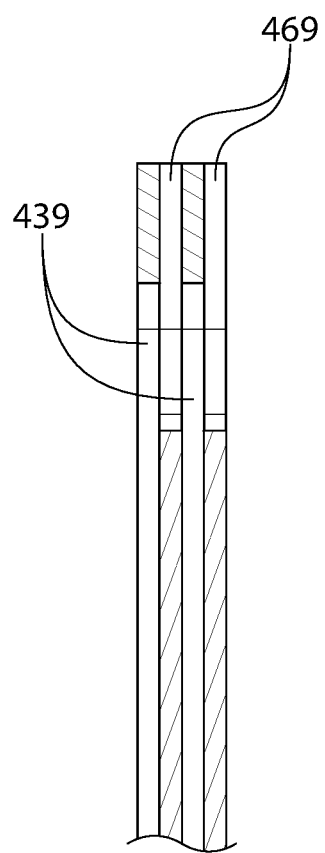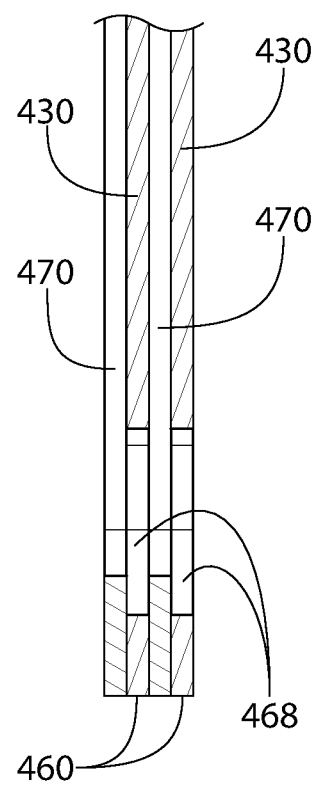
FIG. 20

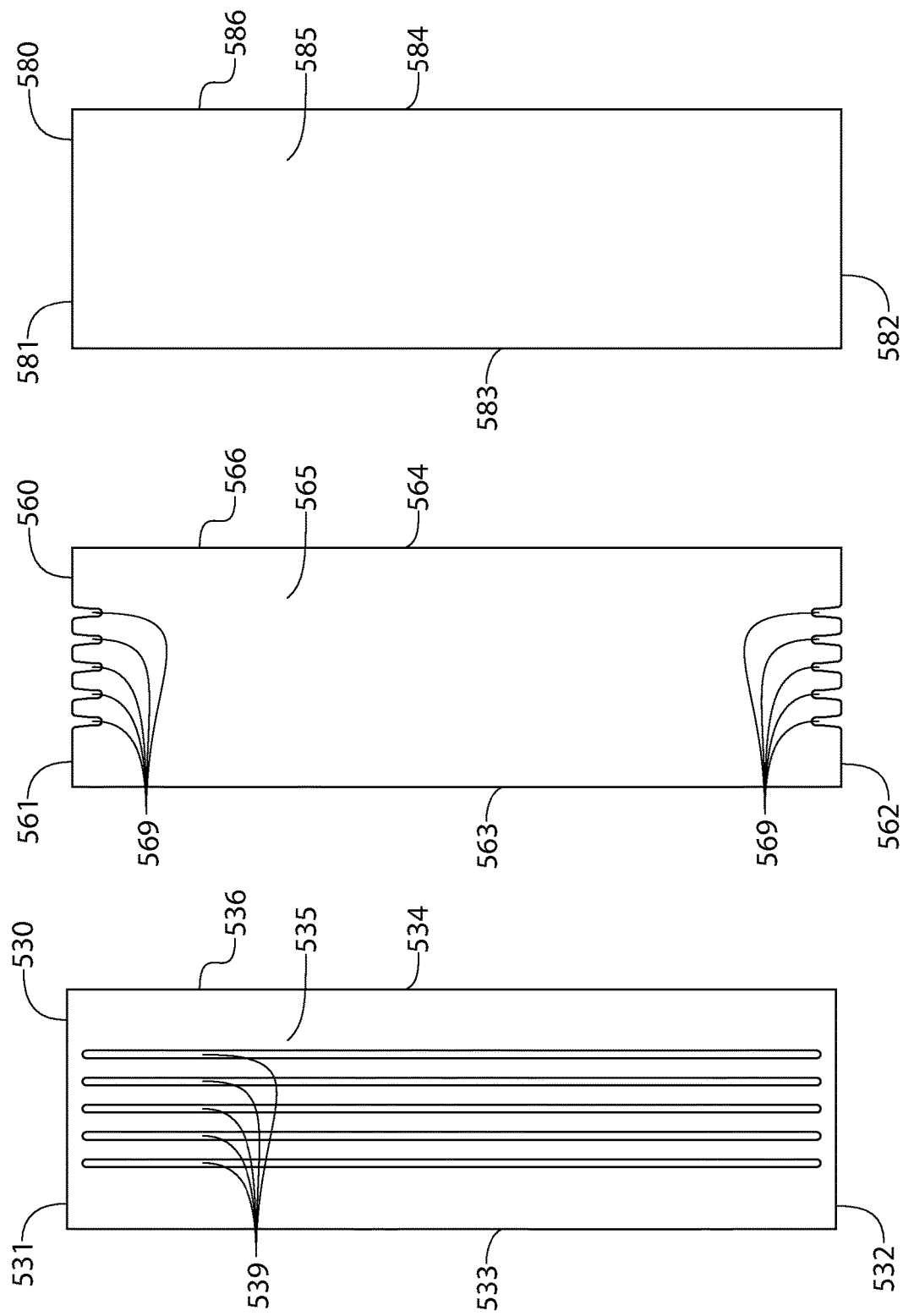

LAMINAR FLOW RESTRICTOR AND SEAL FOR SAME

CROSS REFERENCE TO RELATED APPLICATIONS

The present application is (1) a continuation in part of U.S. patent application Ser. No. 16/985,540, filed Aug. 5, 2020, which in turn claims the benefit of U.S. Provisional Patent Application No. 62/882,794, filed Aug. 5, 2019; and (2) a continuation in part of U.S. patent application Ser. No. 16/985,635, filed Aug. 5, 2020, which in turn claims the benefit of U.S. Provisional Patent Application No. 62/882,814, filed Aug. 5, 2019, the entireties of which are incorporated herein by reference.

BACKGROUND OF THE INVENTION

Mass flow control has been one of the key technologies in semiconductor chip fabrication. Apparatuses for controlling mass flow are important for delivering known flow rates of process gases for semiconductor fabrication and other industrial processes. Such devices are used to measure and accurately control the flow of fluids for a variety of applications. This control may be achieved through the use of precisely calibrated laminar flow restrictors which are effectively sealed to prevent bypass flow pas the laminar flow restrictors.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases. In order to improve the consistency in gas delivery, improved flow restrictors and associated seals are desired.

SUMMARY OF THE INVENTION

The present technology is directed to a laminar flow restrictor for use in a mass flow controller or other gas delivery device and seals to seal the aforementioned laminar flow restrictors. One or more of these gas delivery devices may be used in a wide range of processes such as semiconductor chip fabrication, solar panel fabrication, etc.

In one implementation, the invention is a flow restrictor for restricting the flow of a gas. The flow restrictor has a first end, a second end, and a longitudinal axis extending from the first end to the second end. A plurality of first layers extend from the first end to the second end along the longitudinal axis. A plurality of second layers extend from the first end to the second end along the longitudinal axis. A first aperture at the first end is defined by a first layer of the plurality of first layers and the plurality of second layers. A second aperture at the second end is defined by the first layer of the plurality of first layers and the plurality of second layers. A flow passage is defined by the first layer of the plurality of first layers and the plurality of second layers, the flow passage extending from the first aperture to the second aperture.

In another implementation, the invention is a mass flow control apparatus for delivery of a fluid, the mass flow control apparatus having a valve comprising an inlet passage, an outlet passage, a valve seat, and a closure member. The mass flow control apparatus also has a flow restrictor, the flow restrictor positioned in one of the inlet passage or the outlet passage. The flow restrictor has a first end, a second end, and a longitudinal axis extending from the first end to the second end. A plurality of layers extend substantially parallel to the longitudinal axis. A first aperture is located at the first end and a second aperture is located at the second end. A flow passage is defined by the plurality of layers, the flow passage fluidly coupled to the first aperture and the second aperture.

In yet another implementation, the invention is a method of manufacturing a flow restrictor. First, a plurality of layer blanks are provided, the layer blanks having a first edge, a second edge opposite the first edge, a third edge, a fourth edge opposite the third edge, a front face, and a rear face opposite the front face. A first cavity is formed in the front face of a first one of the plurality of layer blanks. The plurality of layer blanks are stacked. Subsequently, the plurality of layer blanks are bonded to form a resistor stack having a first unfinished end and an opposite second unfinished end. The first unfinished end of the resistor stack is formed by the first edges of the plurality of layer blanks and the second unfinished end of the resistor stack is formed by the second edges of the plurality of layer blanks. Finally, material is removed from the first unfinished end of the layer stack to expose the first cavity and form a first aperture.

In one implementation, the invention is a seal for a gas flow restrictor, the seal having a first end, a second end, and an aperture for receiving the flow restrictor to form a fluid tight connection between the flow restrictor and the seal.

In another implementation, the invention is a valve assembly, the valve assembly having a valve, a flow restrictor, and a seal. The valve has a passage. The flow restrictor has a first end, a second end, a longitudinal axis extending from the first end to the second end, and a sealing portion located between the first end and the second end along the longitudinal axis. The seal is in contact with the sealing portion of the flow restrictor and the passage of the valve.

In yet a further implementation, the invention is a valve assembly, the valve assembly having a valve, the valve having a first passage, a second passage, a first sealing recess, and a second recess. The valve assembly has a base having a third sealing recess and a fourth sealing recess. The valve assembly has a flow restrictor, the flow restrictor having a first end, a second end, a longitudinal axis extending from the first end to the second end, and a surface of the flow restrictor located between the first end and the second end along the longitudinal axis. Finally, the valve assembly has a seal in contact with the surface of the flow restrictor and the first sealing recess of the valve.

In another implementation, the invention is a valve assembly, the valve assembly having a valve, a flow restrictor, and a seal. The valve has a port, a passage, and a basin, the passage extending between the port and a floor of the basin. The flow restrictor has a first end, a second end, a longitudinal axis extending from the first end to the second end, and a sealing portion located between the first end and the second end along the longitudinal axis. The seal is in contact with both the sealing portion of the flow restrictor and the floor of the basin.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein:

FIG. 5A is an end view of the portion of the flow restrictor of FIG. 4.

FIG. 15 is a top view a first layer of the flow restrictor of FIG. 10.

FIG. 16 is a top view a second layer of the flow restrictor of FIG. 10.

FIG. 20 is a cross-sectional view of the portion of the flow restrictor of FIG. 17, taken along line XX-XX.

FIG. 27 is a top view of a first layer of the flow restrictor of FIG. 23.

FIG. 28 is a top view of a second layer of the flow restrictor of FIG. 23.

FIG. 29 is a top view of a third layer of the flow restrictor of FIG. 23.

DETAILED DESCRIPTION

Figure 1:
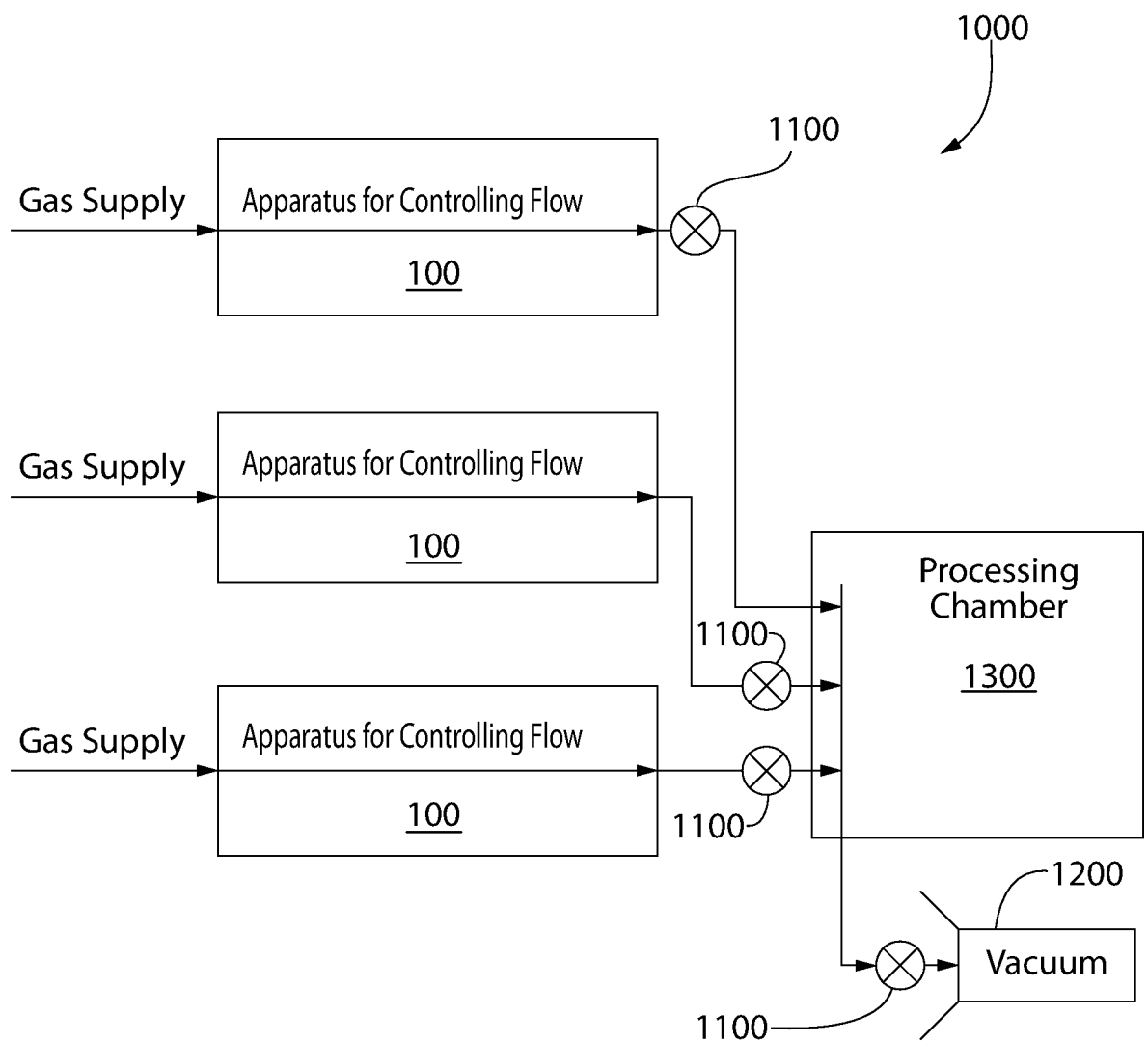
FIG. 1 is a schematic of a process utilizing one or more laminar flow restrictors.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

Section I

The present invention is directed to a laminar flow restrictor for use in an apparatus for controlling gas flow. In some embodiments, the apparatus may function as a mass flow controller to deliver a known mass flow of gas to a semiconductor or similar process. Semiconductor fabrication is one industry which demands high performance in control of gas flows. As semiconductor fabrication techniques have advanced, customers have recognized the need for flow control devices with increased accuracy and repeatability in the mass of the delivered gas flows. Modern semiconductor processes require that the mass of the gas flow is tightly controlled, the response time minimized, and the gas flow is highly accurate. The present invention delivers improved accuracy and repeatability in the delivered flows.

FIG. 1 shows a schematic of an exemplary processing system 1000 utilizing one or more laminar flow restrictors. The processing system 1000 may utilize a plurality of apparatus for controlling flow 100 fluidly coupled to a processing chamber 1300. The plurality of apparatus for controlling flow 100 are used to supply one or more different process gases to the processing chamber 1300. Articles such as semiconductors may be processed within the processing chamber 1300. Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process gases delivered by the plurality of apparatus for controlling flow 100, enabling selective or diffuse distribution of the gas supplied by the plurality of apparatus for controlling flow 100. In addition, the processing system 1000 may further comprise a vacuum source 1200 which is isolated from the processing chamber 1300 by a valve 1100 to enable evacuation of process gases or facilitate purging one or more of the apparatus for controlling flow 100 to enable switching between process gases in the same apparatus for controlling flow 100. Optionally, the apparatus for controlling flow 100 may be mass flow controllers, flow splitters, or any other device which controls the flow of a process gas in a processing system. Furthermore, the valves 1100 may be integrated into the apparatus for controlling flow 100 if so desired.

Processes that may be performed in the processing system 100 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 2:
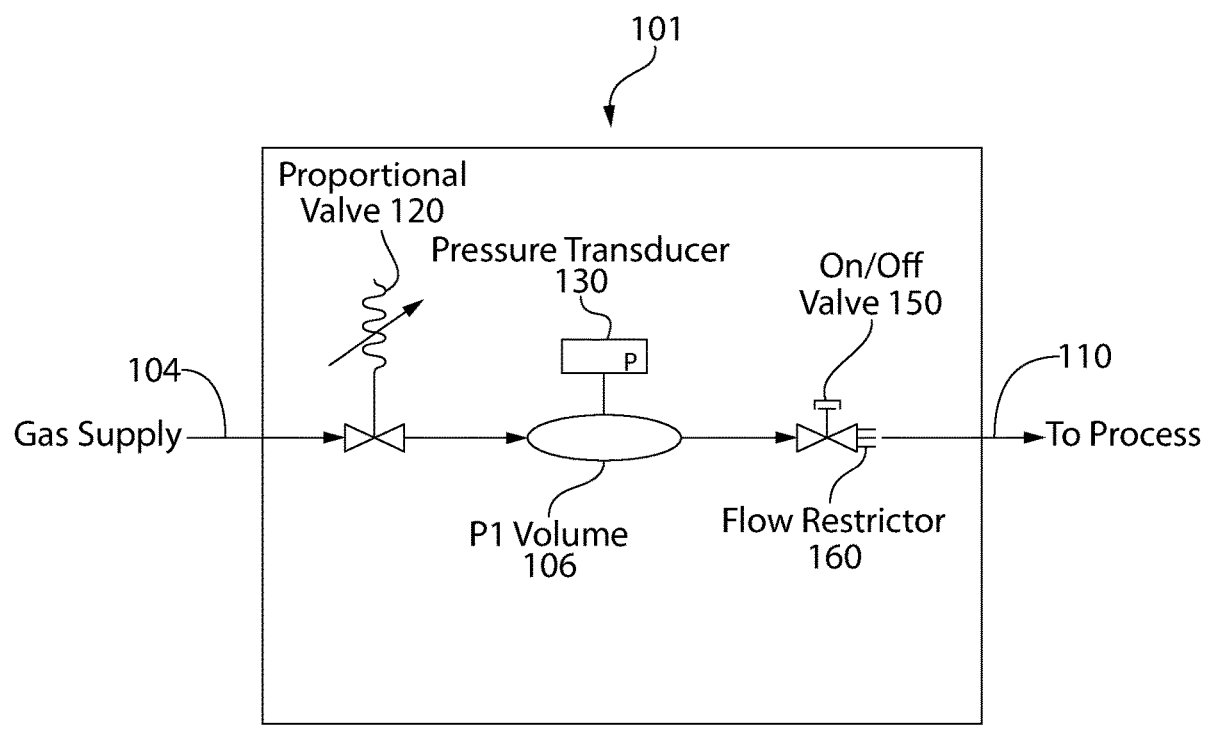
FIG. 2 is a schematic of a mass flow controller as may be utilized in the process of FIG. 1.

FIG. 2 shows a schematic of an exemplary mass flow controller 101, which is one type of apparatus for controlling flow 100 that may be utilized in the processing system 1000. The mass flow controller 101 has a gas supply of a process gas fluidly coupled to an inlet 104. The inlet is fluidly coupled to a proportional valve 120 which is capable of varying the volume of process gas flowing through the proportional valve 120. The proportional valve 120 meters the mass flow of process gas which passes to the P1 volume 106. The proportional valve 120 is capable of providing proportional control of the process gas such that it need not be fully open or closed, but instead may have intermediate states to permit control of the mass flow rate of process gas.

A P1 volume 106 is fluidly coupled to the proportional valve 120, the P1 volume 106 being the sum of all the volume within the mass flow controller 101 between the proportional valve 120 and a flow restrictor 160. A pressure transducer 130 is fluidly coupled to the P1 volume 106 to enable measurement of the pressure within the P1 volume 106. An on/off valve 150 is located between the flow restrictor 160 and the proportional valve 120 and may be used to completely halt flow of the process gas out of the P1 volume 106. Optionally, the flow restrictor 160 may be located between the on/off valve 150 and the proportional valve 120 in an alternate configuration. Finally, the flow restrictor 160 is fluidly coupled to an outlet 110 of the mass flow controller 101. In the processing system, the outlet 110 is fluidly coupled to a valve 1100 or directly to the processing chamber 1300.

Internal to the first on/off valve 150 is a valve seat and a closure member. When the apparatus 100 is delivering process gas, the first on/off valve 150 is in an open state, such that the valve seat and the closure member are not in contact. This permits flow of the process gas, and provides a negligible restriction to fluid flow. When the first on/off valve 150 is in a closed state the closure member and the valve seat are biased into contact by a spring, stopping the flow of process gas through the first on/off valve 150.

The flow restrictor 160 is used, in combination with the proportional valve 120, to meter flow of the process gas. In most embodiments, the flow restrictor 160 provides a known restriction to fluid flow. The first characterized flow restrictor 160 may be selected to have a specific flow impedance so as to deliver a desired range of mass flow rates of a given process gas. The flow restrictor 160 has a greater resistance to flow than the passages upstream and downstream of the flow restrictor 160.

Optionally, the mass flow controller 101 comprises one or more P2 pressure transducers downstream of the flow restrictor 160 and the on/off valve 150. The P2 pressure transducer is used to measure the pressure differential across the flow restrictor 160. In some embodiments, the P2 pressure downstream of the flow restrictor 160 may be obtained from another apparatus 100 connected to the processing chamber, with the readings communicated to the mass flow controller 101.

Optionally, temperature sensors may be employed to further enhance the accuracy of the mass flow controller 101. They may be mounted in the base of the mass flow controller 101 near the P1 volume 106. Additional temperature sensors may be employed in a variety of locations, including the proportional valve 120, the pressure transducer 130, and the on/off valve 150.

Figure 3:
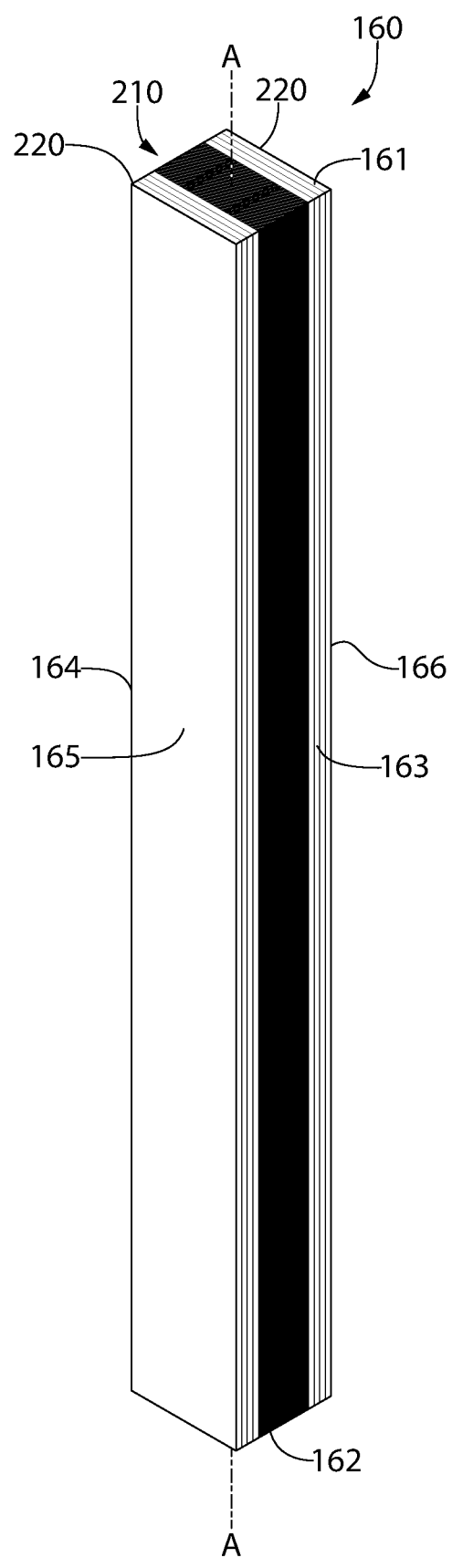
FIG. 3 is a perspective view of a first embodiment of a laminar flow restrictor as may be utilized in the mass flow controller of FIG. 2.
Figure 4:
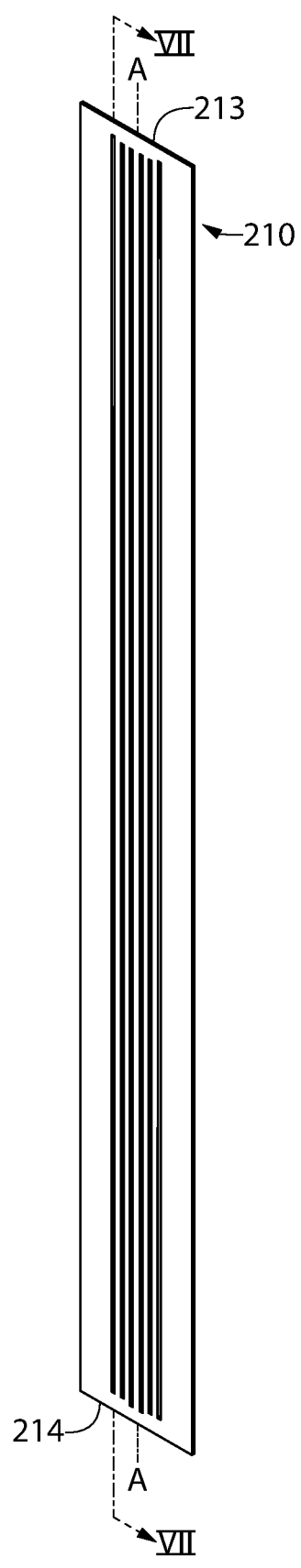
FIG. 4 is a perspective view illustrating a portion of the layers forming the flow restrictor of FIG. 3.

Turning to FIGS. 3-9, a first embodiment of the flow restrictor 160 is shown in greater detail. The flow restrictor 160 is constructed as a plurality of layers forming a restrictor stack 170. The restrictor stack 170 may take the form of an elongated rectangular shape as shown in FIG. 3. The flow restrictor 160 extends from a first end 161 to a second end 162 along a longitudinal axis A-A. A plurality of layers 210 comprising flow passages are sandwiched between a plurality of outer layers 220 which do not comprise flow passages. The flow restrictor 160 has a first side 163 formed of the pluralities of layers 210, 220 and an opposite second side 164. The flow restrictor 160 further comprises a front face 165 and an opposite rear face 166. The outer layers 220 enclose the flow passages on opposite sides of the layers 210 comprising flow passages. The outer layers 220 may or may not have the same thickness as the layers 210 comprising flow passages. A selection of the layers 210 is shown in FIG. 4, which illustrates portions of the flow passages and the configuration of the layers 210. Each of the layers 210 extend from a first end 213 to a second end 214. Portions of the plurality of flow passages can be seen in FIG. 4. The details of the flow passages will be discussed in greater detail below.

Figure 5B:
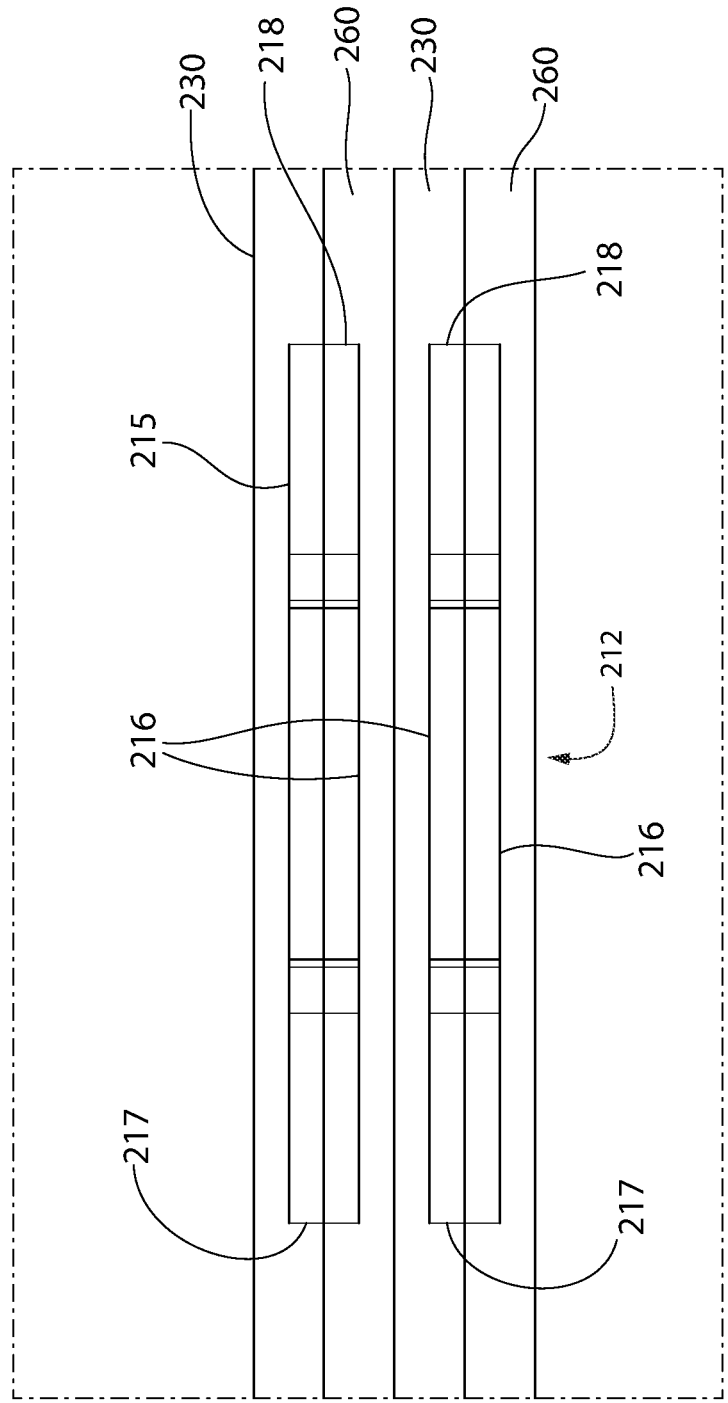
FIG. 5B is a detail view of the area VB of FIG. 5A.

Turning to FIGS. 5A and 5B, the layers 210 comprise a plurality of apertures 212 formed at opposite ends 213, 214 of the layers 210. This enables gas to flow along the layers 210 from the first end 213 to the second end 214 along the longitudinal axis A-A. In alternate embodiments, the apertures 212 need not be on opposite ends and may instead be formed on adjacent sides or may be formed exclusively on a single end. The apertures 212 may also be formed so that gas flows across the shorter direction of the rectangular layers 210, perpendicular to the longitudinal axis A-A. The layers 210 also need not be rectangular and may be square or any other desired shape. It is further contemplated that an aperture may be formed into the plane of the layers 210, permitting gas to flow perpendicular to the planes of the layers 210, then turn a corner and flow in the plane of the layers 210. The specific arrangement of the apertures 212, the shape of the layers 210, and the shape of the resulting flow restrictor 160 may be adapted as desired depending on the shape of the flow passage which receives the resulting flow restrictor 160. It is even contemplated that the flow restrictor 160 may have an annular configuration, with apertures 212 formed into a circumference of the flow restrictor 160 and/or apertures 212 formed so that gas flows perpendicular to the planes of some or all of the layers 210.

Figure 6:
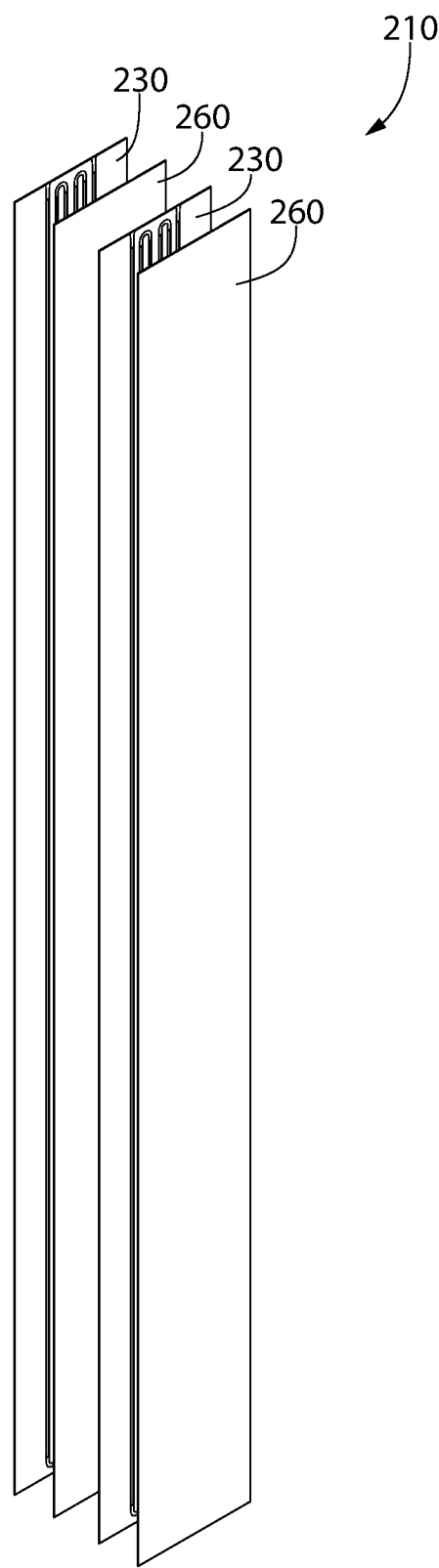
FIG. 6 is an exploded perspective view of the portion of the flow restrictor of FIG. 4.
Figure 7:
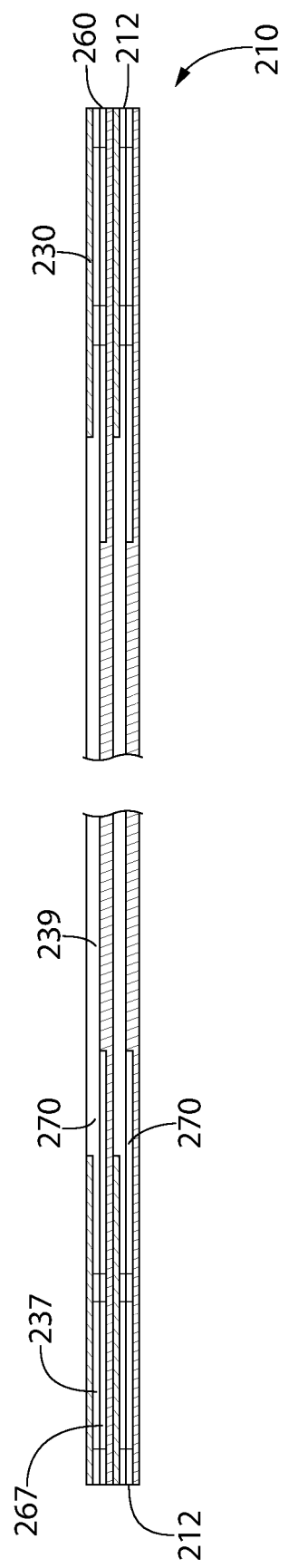
FIG. 7 is a cross-sectional view of the portion of the flow restrictor of FIG. 4, taken along line VII-VII.
Figure 8:
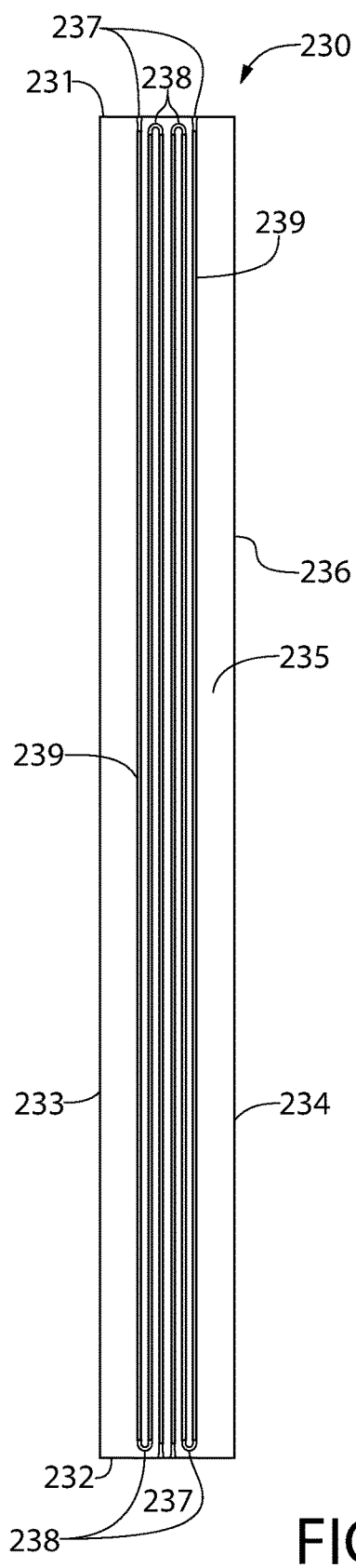
FIG. 8 is a top view of a first layer of the flow restrictor of FIG. 3.
Figure 9:
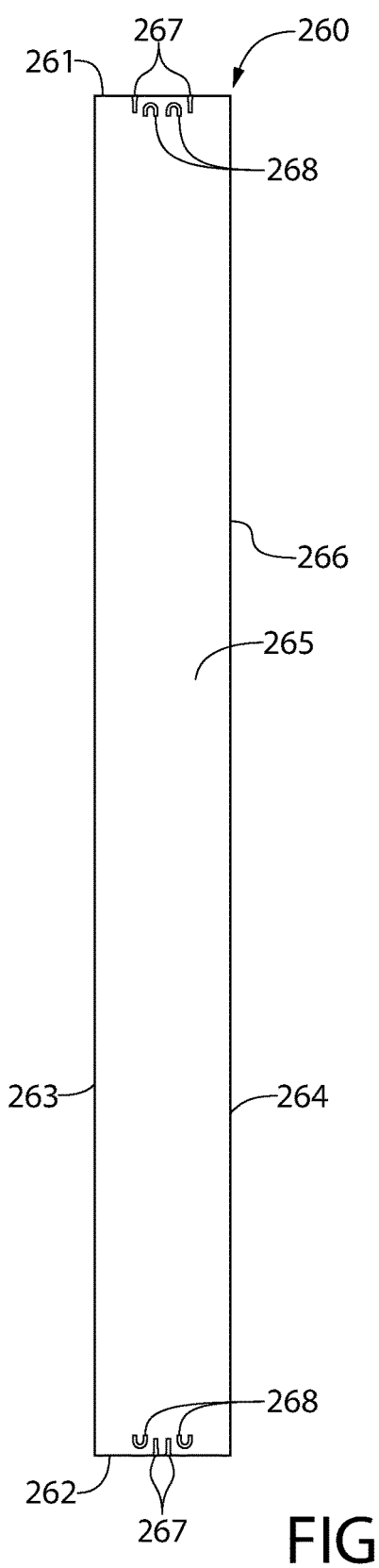
FIG. 9 is a top view of a second layer of the flow restrictor of FIG. 3.

FIG. 6 shows an exploded view of the layers 210. The layers 210 comprise two first layers 230 and two second layers 260. As best seen in FIGS. 8 and 9, the first layer 230 has a first side 231, a second side 232, a third side 233, a fourth side 234, a front face 235, and an opposite rear face 236. The second layer 260 has a first side 261, a second side 262, a third side 263, a fourth side 264, a front face 265, and an opposite rear face 266. The first layer 230 has a series of flow passages comprising entry passages 237, U passages 238, and longitudinal passages 239. The entry passages and the U passages are each only formed into a portion of the thickness of the first layer 230 while the longitudinal passages 239 extend through the entirety of the thickness of the first layer 230. The second layer 260 also has entry passages 267 and U passages 268 formed into the front face 265 that correspond to the entry passages 237 and U passages 238 of the first layer 240. When a first layer 230 and a second layer 260 are stacked with the front faces 235, 265 facing one another, the entry passages 237, 267 form apertures 212 on the first and second sides 231, 261, 232, 262 of the layers 230, 260. As is best shown in FIG. 7, in combination with additional first layers 230 and second layers 260, a plurality of flow passages 270 are formed, extending from apertures 212 on one end 213 of the plurality of layers 210 to the opposite second end 214 of the plurality of layers 210.

Returning to FIG. 5A, the apertures 212 have a first edge 215, a second edge 216, a third edge 217, and a fourth edge 218. The first edge 215 is formed by the first layer 230, the second edge 216 is formed by the second layer 260, and the third and fourth edges 217, 218 are each formed by a portion of the first layer 230 and a portion of the second layer 260.

The flow passages 270 may be varied in any desired manner to achieve a desired flow impedance. For instance, the number of flow passages 270 may be increased or decreased by reducing or increasing the number of the plurality of layers 210. Furthermore, the length of the flow passages 270 may be increased or decreased by changing the number of times that the flow passages 270 double back on themselves, changing the resulting number of U passages 238, 268 and longitudinal passages 239. A greater or fewer number of flow passages 270 may be formed into pairs of first and second layers 230, 260. The width of the flow passages 270 may also be increased or decreased, and the thickness of the first and second layers 230, 260 may be varied. Indeed, it is not necessary that the same thickness be used for every pair of first and second layers 230, 260. Each layer within the plurality of layers 210 could be individually varied to alter the resulting flow impedance of the flow restrictor 160.

The flow restrictor 160 is manufactured by first etching each of the layers 210 individually or in an array. The layers 210 may all be formed of the same material or may be formed of different materials. The etching may be carried out in a single step or in a series of steps to achieve the multiple depths required. Alternative processes such as laser ablation, micromachining, or other known processes may also be used. Once the plurality of layers 210 have been formed, they are assembled with the non-etched outer layers 220 and joined by diffusion bonding. Again, alternative techniques such as conventional bonding with adhesives, welding, or similar processes may also be used as is known in the art. The resulting stack of layers 210, 220 is joined, sealing the flow passages 270 and forming the flow restrictor 160. Subsequent finishing steps can be performed to alter the overall shape or size of the flow restrictor 160 to suit the dimensions of the flow passages into which the flow restrictor 160 is installed. These processes may include grinding, machining, laser cutting, water jetting, or other known techniques. Indeed, the flow restrictor 160 does not need to remain rectangular and may be formed into cylindrical shapes as will be discussed further below.

Figure 10:
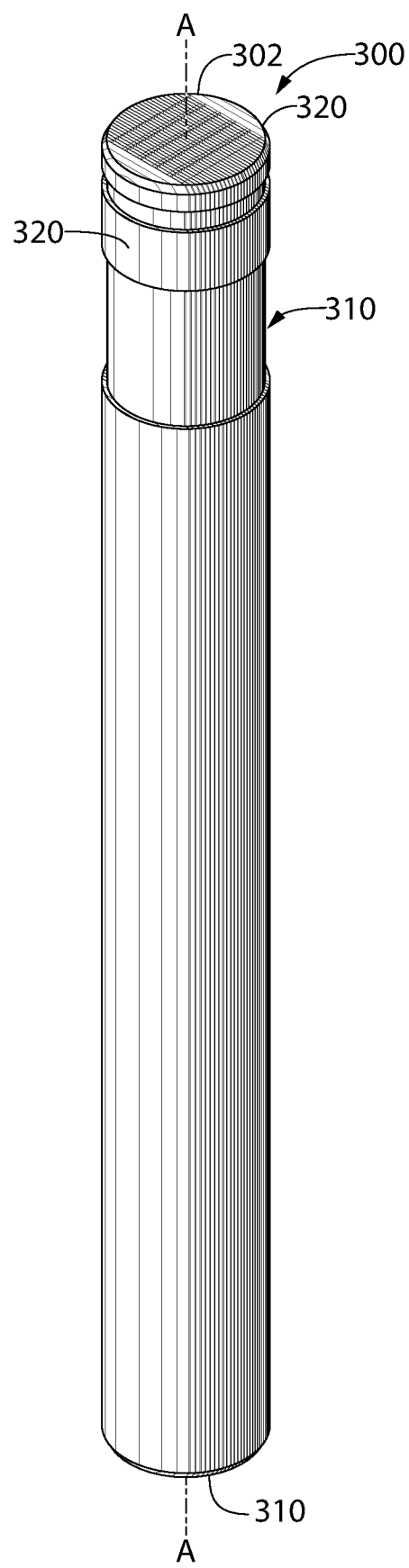
FIG. 10 is a perspective view of a second embodiment of a laminar flow restrictor.

Turning to FIGS. 10-16, a second embodiment of the flow restrictor 300 is best shown in FIG. 10. Where not explicitly noted, the reference numerals are identical to those of the first embodiment of the flow restrictor 160. The second embodiment of the flow restrictor 300 extends from a first end 302 to a second end 303 along a longitudinal axis A-A and is also formed of a plurality of layers 310 having flow passages and a plurality of outer layers 320 which do not have flow passages. After bonding, the layers 310, 320 are post-processed into a cylindrical shape which facilitates insertion into a cylindrical bore, enabling easy installation of the flow restrictor 300 into a valve or other flow device.

Figure 11:
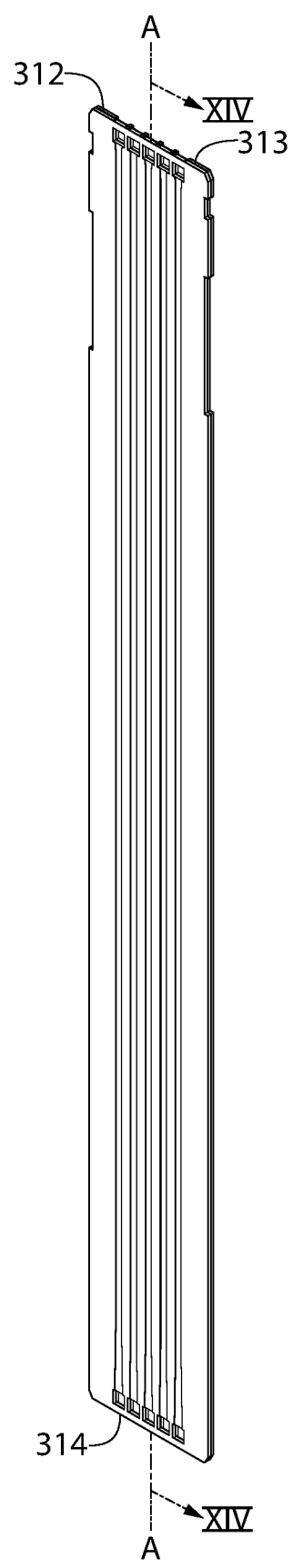
FIG. 11 is a perspective view illustrating a portion of the layers forming the flow restrictor of FIG. 10.
Figure 12A:
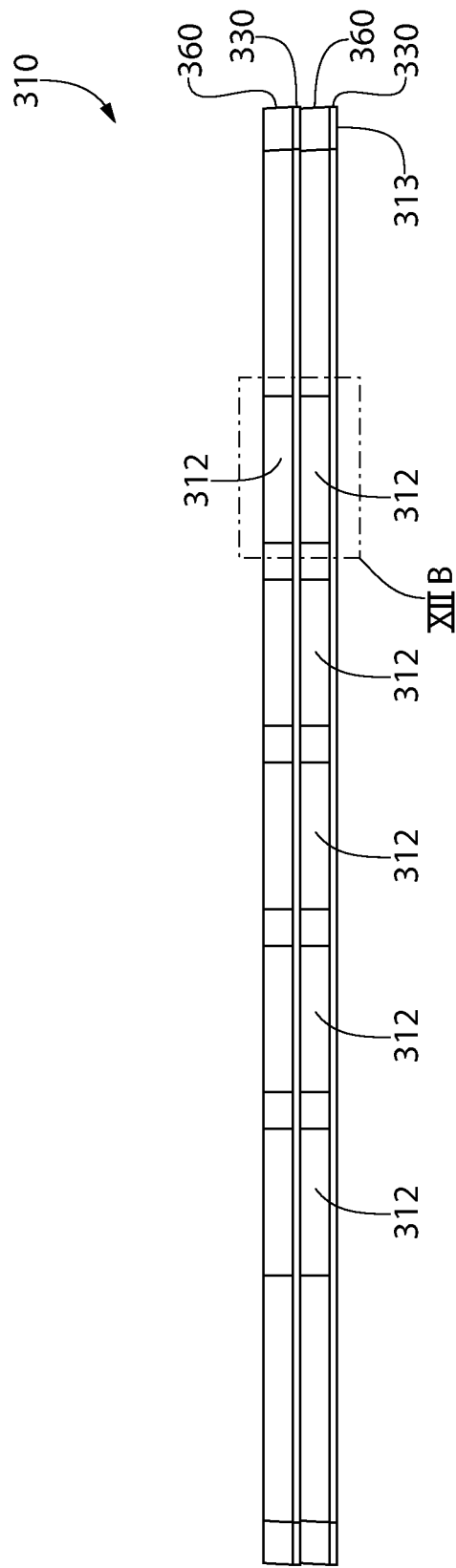
FIG. 12A is an end view of the portion of the flow restrictor of FIG. 11.
Figure 12B:
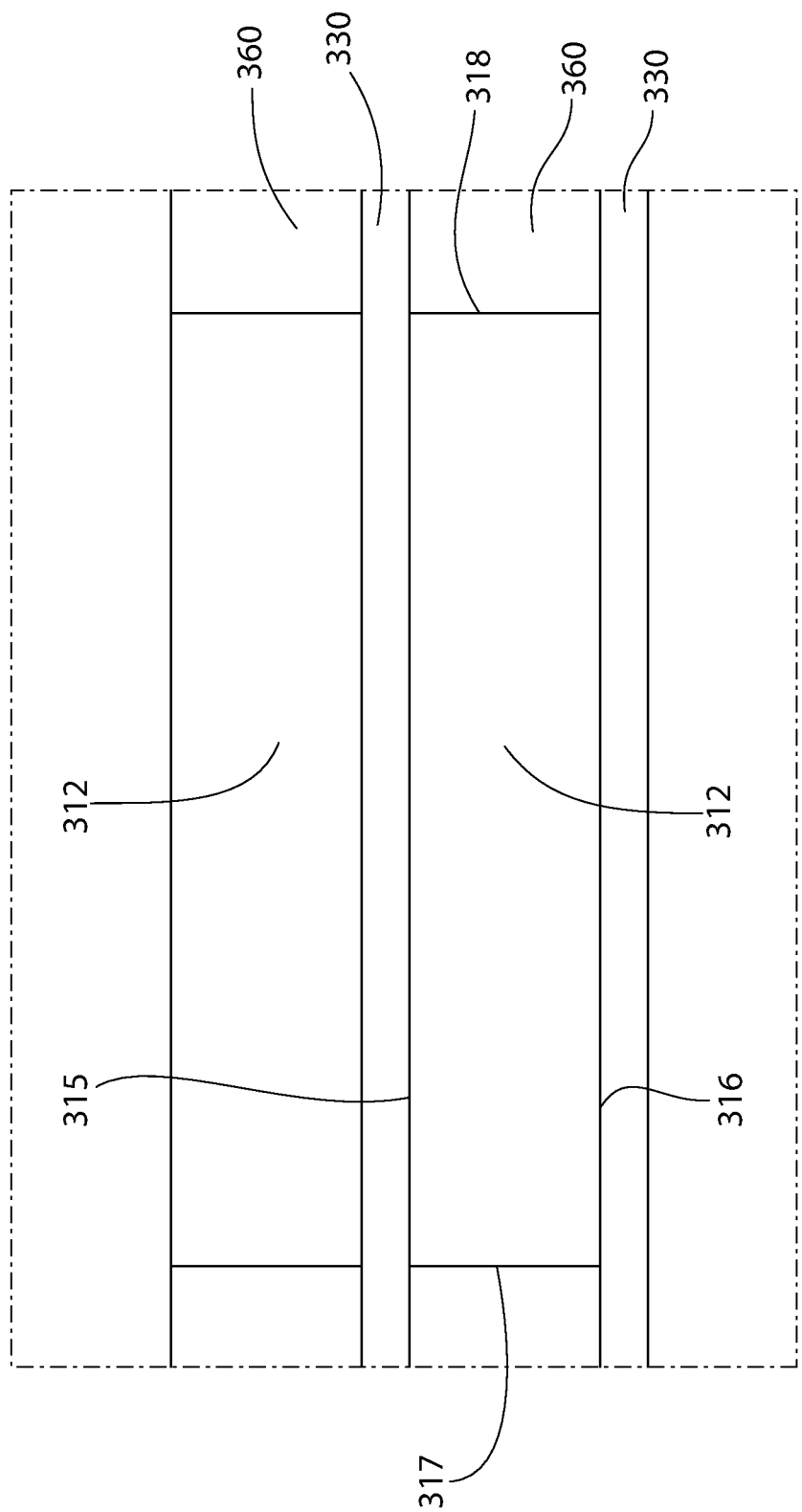
FIG. 12B is a detail view of the area XIIB of FIG. 12A.

As shown in FIG. 11, a selection of the layers 310 are shown in perspective. The layers 310 extend from a first end 313 to a second end 314 opposite the first end 313. FIGS. 12A and 12B best illustrate the apertures 312 formed into the first end 313 of the layers 310. As can also be seen, the layers 310 comprise two first layers 330 and two second layers 360. As best seen in FIG. 12B, the apertures 312 have a first edge 315, a second edge 316 opposite the first edge 315, a third edge 317, and a fourth edge 318 opposite the third edge 317. The first and second edges 315, 316 are formed by the first layers 330. The third and fourth edges 317, 318 are each formed by the second layer 360.

Figure 13:
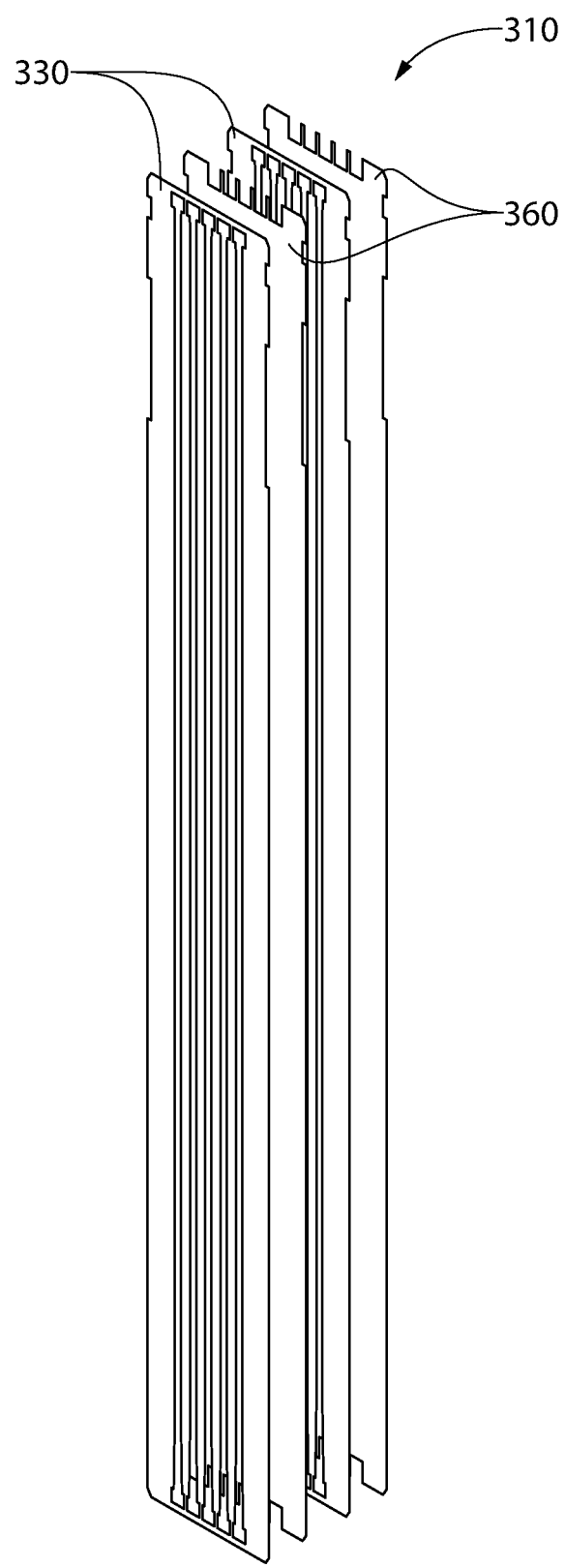
FIG. 13 is an exploded perspective view of the portion of the flow restrictor of FIG. 11.
Figure 14:
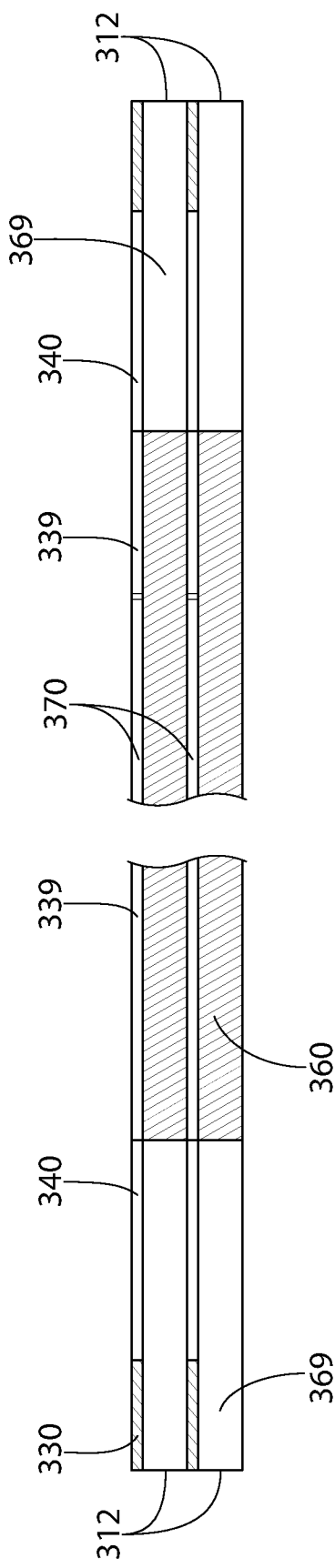
FIG. 14 is a cross-sectional view of the portion of the flow restrictor of FIG. 11, taken along line XIV-XIV.

An exploded view of the layers 310 is shown in FIG. 13, better illustrating the flow passages of the restrictor 300. FIGS. 15 and 16 illustrate the first layer 330 and the second layer 360, respectively. The first layer 330 has a first side 331, a second side 332, a third side 333, a fourth side 334, a front face 335, and an opposite rear face 336. The second layer 360 has a first side 361, a second side 362, a third side 363, a fourth side 364, a front face 365, and an opposite rear face 366. The first layer 330 has a series of longitudinal passages 339 that terminate in layer transition apertures 340. The longitudinal passages 339 and the layer transition apertures 340 extend through the entirety of the first layer 330. The second layer 360 has notches 369 that extend from the first and second sides 361, 362. The notches 369 also extend through the entirety of the second layer 360. As can be best seen in FIG. 14, the apertures 312 are formed by the open ends of the notches 369 when the layers 330, 360 are alternately stacked as shown. Flow passages 370 are formed by the stacking of the layers 330, 360 as shown. In alternate embodiments, the layer transition apertures may be formed in a variety of shapes and may be formed with or without flow passage contouring at the ends of the channel, or with contouring of different shapes.

Once again, a plurality of the layers 330, 360 are stacked and assembled with the outer layers 320. The layers are then bonded through diffusion bonding or a similar technique. The resulting resistor stack is then ground or machined into a cylindrical shape as shown in FIG. 10. This cylindrical shape also incorporates annular grooves which facilitate the mounting of a seal which seals the flow restrictor 300 into a bore of a device to ensure that the only gas passing by the flow restrictor 300 must pass through the passages 370. In other embodiments, the final part may be machined into different shapes, or alternatively left in its raw shape formed by the bonded resistor stack.

Figure 17:
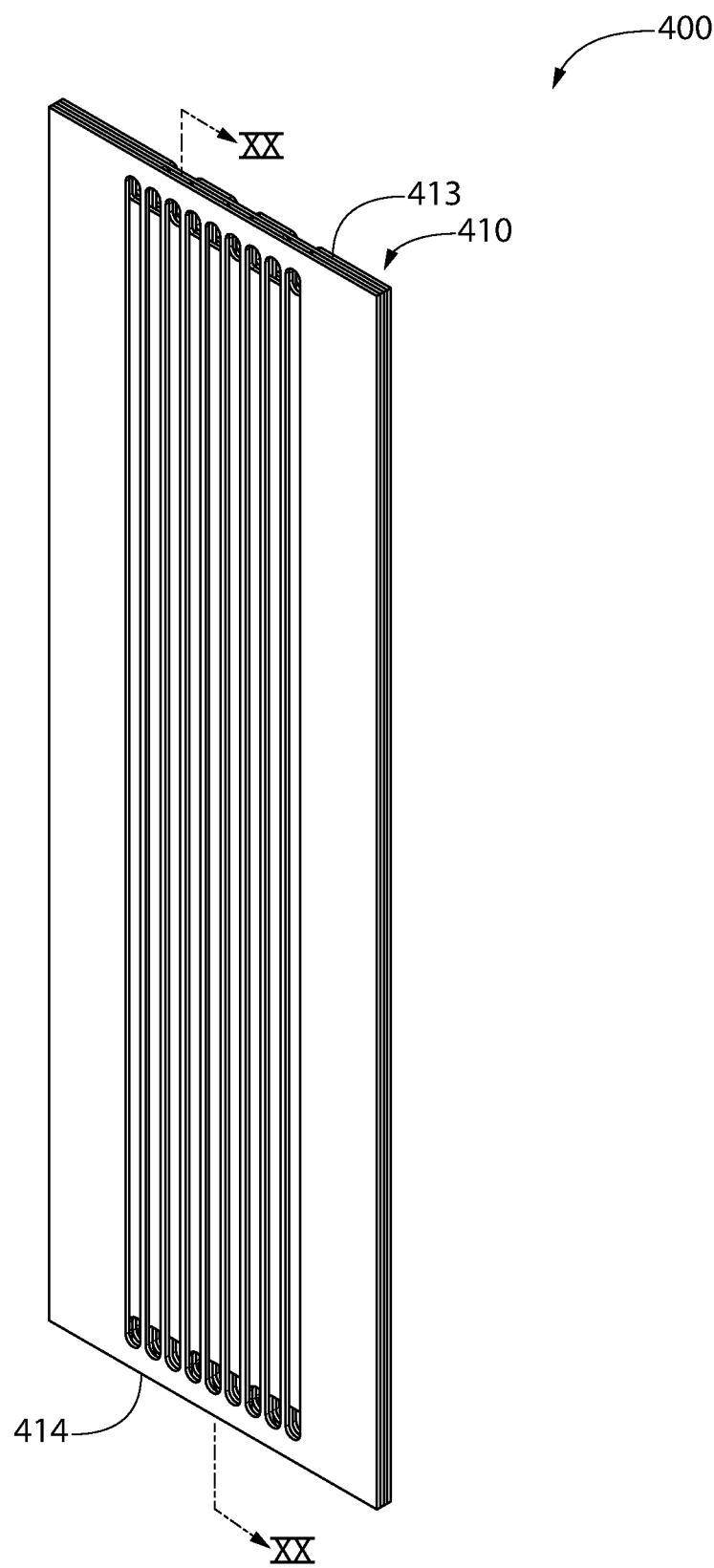
FIG. 17 is a perspective view of a portion of a third embodiment of a laminar flow restrictor.
Figure 18:
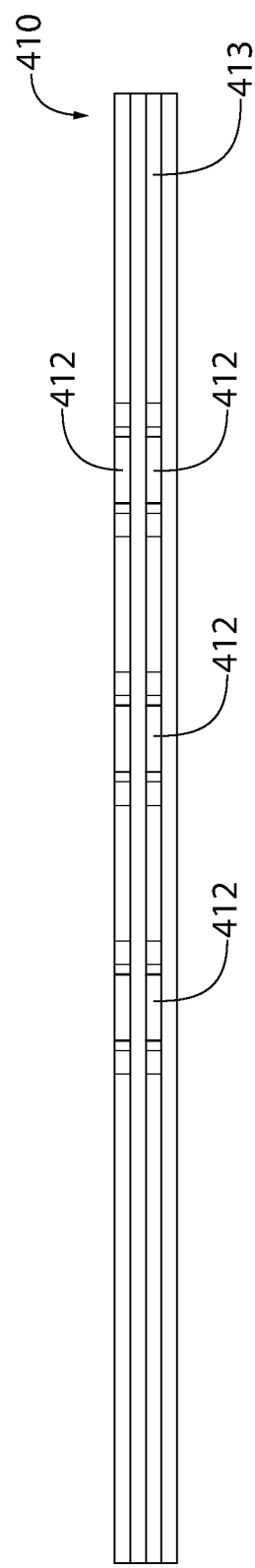
FIG. 18 is an end view of the portion of the flow restrictor of FIG. 17.
Figure 19:
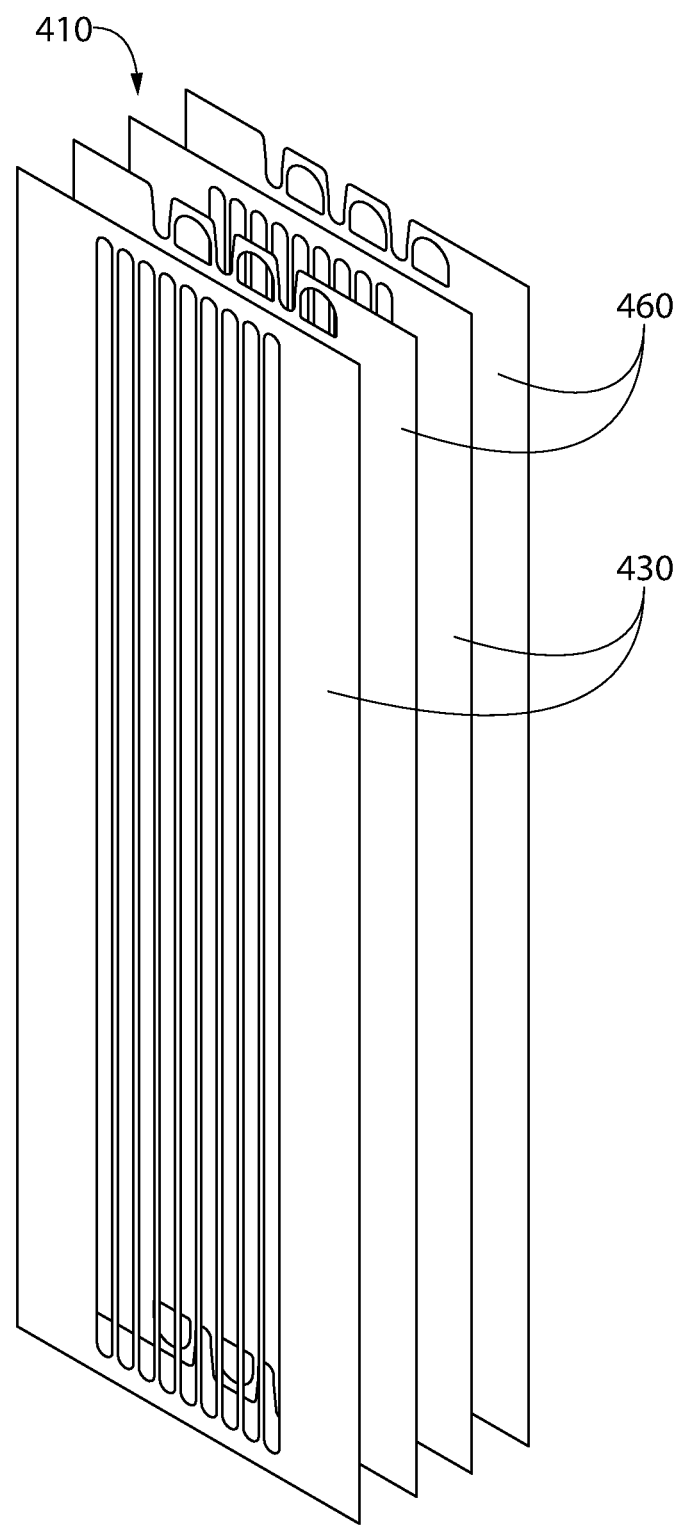
FIG. 19 is an exploded perspective view of the portion of the flow restrictor of FIG. 17.

A third embodiment of the flow restrictor 400 is shown in FIGS. 17-22. FIG. 17 shows a selection of the plurality of layers 410 forming the flow passages of the flow restrictor 400. The outer layers are not shown in this embodiment as they are substantially identical to those of the other embodiments. The plurality of layers 410 extend from a first end 413 to a second end 414 opposite the first end 413. As best shown in FIG. 18, apertures 412 are formed in the first end 413 and the second end 414 to permit passage of gas into and out of the flow restrictor 400. FIG. 19 shows an exploded view of the plurality of layers 410 to better illustrate the flow passages. As can be seen, the plurality of layers 410 comprise two first layers 430 and two second layers 460.

Figure 21:
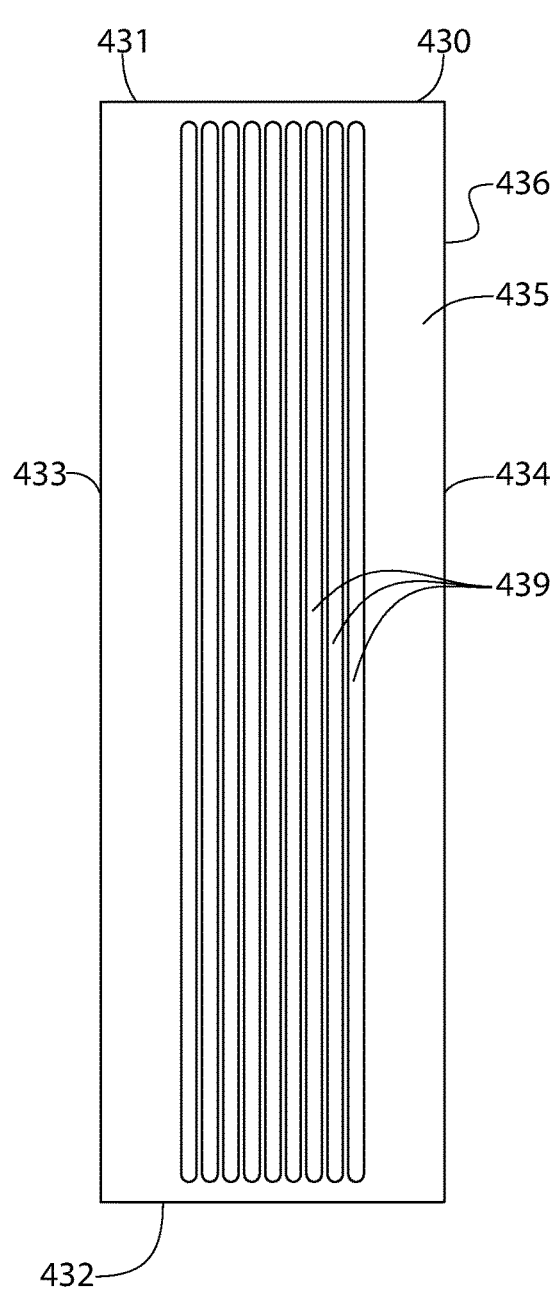
FIG. 21 is a top view of a first layer of the flow restrictor of FIG. 17.
Figure 22:
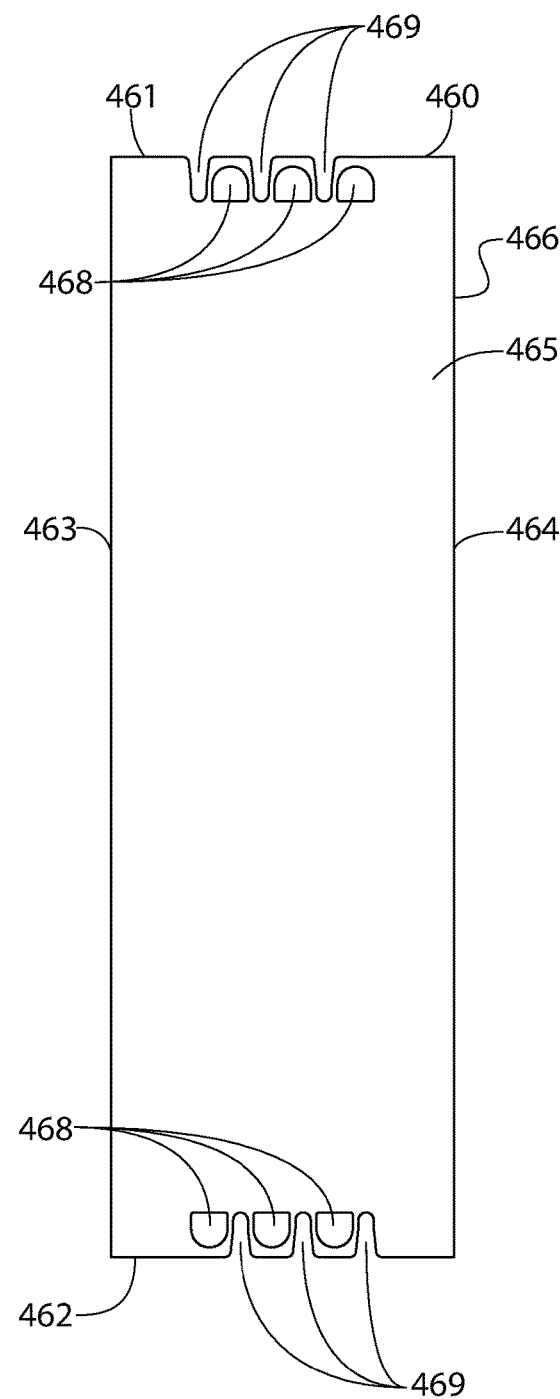
FIG. 22 is a top view of a second layer of the flow restrictor of FIG. 17.

FIGS. 21 and 22 illustrate the first layer 430 and the second layer 460, respectively. The first layer 430 has a first side 431, a second side 432, a third side 433, a fourth side 434, a front face 435, and an opposite rear face 436. The second layer 460 has a first side 461, a second side 462, a third side 463, a fourth side 464, a front face 465, and an opposite rear face 466. The first layer 430 has a series of longitudinal passages 439 having an elongated configuration with straight sides and a radius at each end. The second layer 460 has notches 469 that transition from a u-shape having parallel sides to angled sides which increase in width as they approach the first side 461 or second side 462 of the second layer 460. The notches 469 overlap with the longitudinal passages 439 when the first and second layers are aligned. The second layer 460 also has D-shaped apertures 468 which allow the connection of two adjacent longitudinal passages 439 to increase the effective length of the flow passage from one aperture 412 to another aperture 412. There is no limit to the number of D-shaped apertures 468 which may be employed. Furthermore, there is no need to limit the apertures 468 to a D shape, and they may be any desired shape to facilitate a connection between adjacent longitudinal passages 439. In alternate embodiments the notches 469 can be shaped differently. For instance, shapes such as rectangular, wedge, or other shapes may be used. Additionally, longitudinal passages 439 can have contouring in them to improve flow characteristics. Thus, the longitudinal passages 439 need not be formed with a constant width, and may have varying widths at either ends or anywhere along their length. In yet further embodiments a third layer (or a plurality of layers) can be interleaved between the first layer 430 and the second layer 460 such that each first layer 430 only contacts one second layer 460, and the apertures 468 between subsequent sheets do not allow flow transitions except for adjacent first and second layers 430, 460.

As can be best seen in FIG. 20, the apertures 412 are formed by the open ends of the notches 469 when the layers 430, 460 are alternately stacked as shown. Flow passages 470 are formed by the stacking of the layers 430, 460 as shown. The layers 430, 460 are of equal thickness in this embodiment, but may have different thicknesses if desired.

Figure 23:
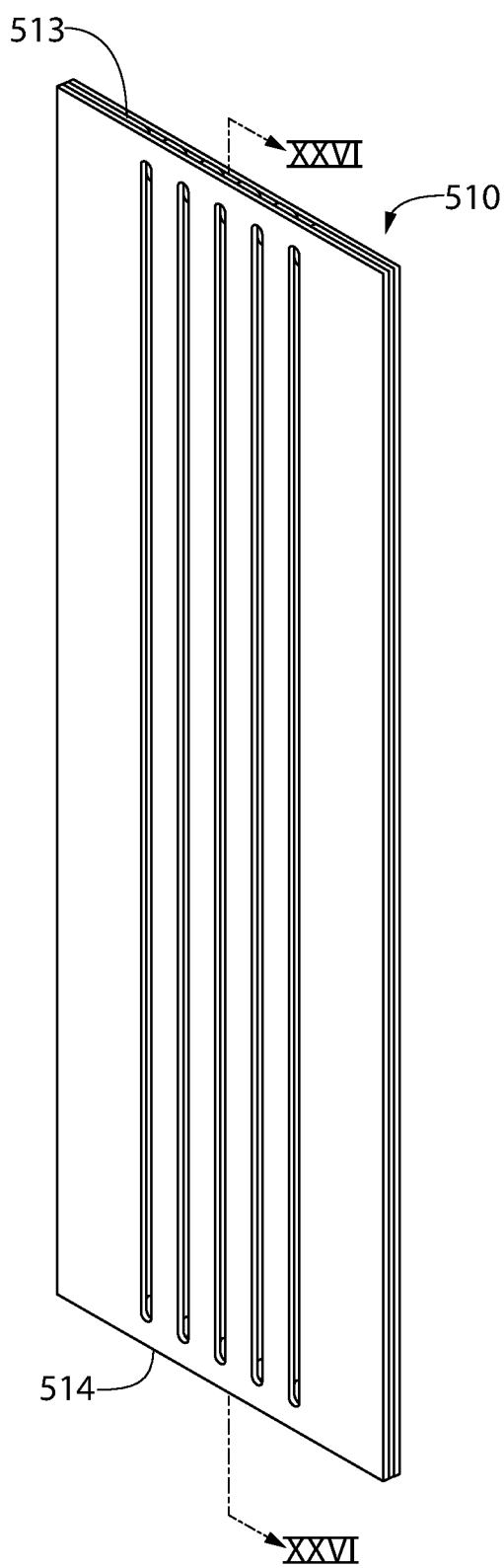
FIG. 23 is a perspective view of a portion of a fourth embodiment of a laminar flow restrictor.
Figure 24:
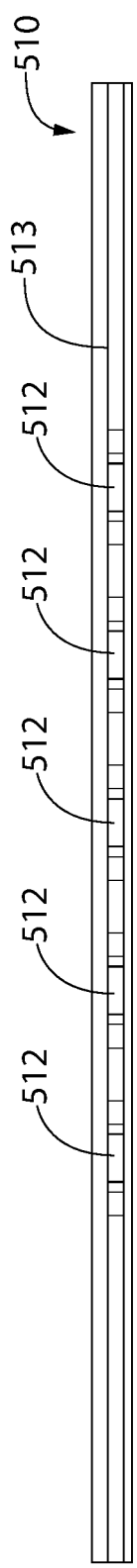
FIG. 24 is an end view of the portion of the flow restrictor of FIG. 23.
Figure 25:
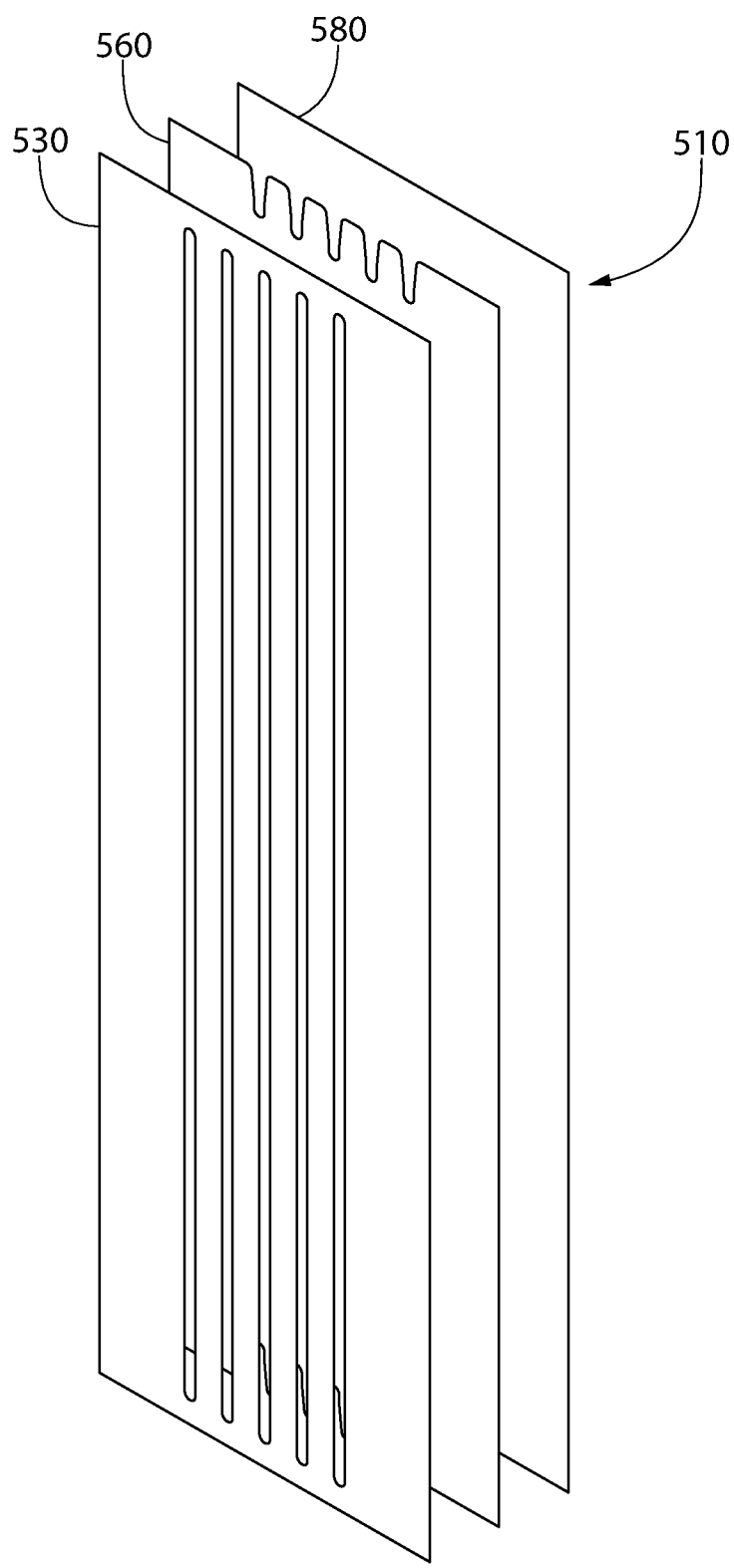
FIG. 25 is an exploded perspective view of the portion of the flow restrictor of FIG. 23.
Figure 26:
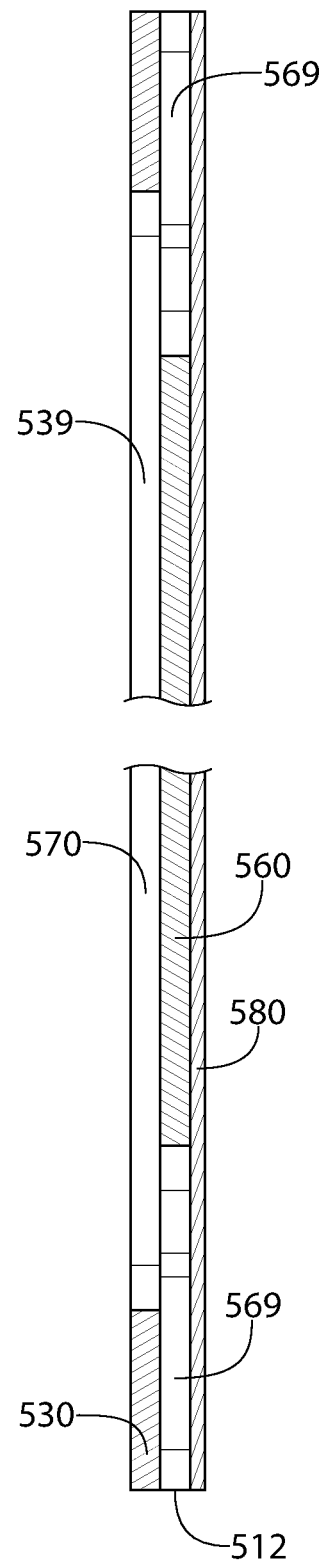
FIG. 26 is a cross-sectional view of the portion of the flow restrictor of FIG. 23, taken along line XXVI-XXVI.

A fourth embodiment of the flow restrictor 500 is shown in FIGS. 23-29. FIG. 23 shows a selection of the plurality of layers 510 forming the flow passages of the flow restrictor 500. The outer layers are not shown in this embodiment as they are substantially identical to those of the other embodiments. The plurality of layers 510 extend from a first end 513 to a second end 514 opposite the first end 513. As best shown in FIG. 24, apertures 512 are formed in the first end 513 and the second end 514 to permit passage of gas into and out of the flow restrictor 500. FIG. 25 shows an exploded view of the plurality of layers 510 to better illustrate the flow passages. As can be seen, the plurality of layers 510 comprise a first layer 530, a second layer 560, and a third layer 580.

FIGS. 27-29 illustrate the first layer 530, the second layer 560, and the third layer 580, respectively. The first layer 530 has a first side 531, a second side 532, a third side 533, a fourth side 534, a front face 535, and an opposite rear face 536. The second layer 560 has a first side 561, a second side 562, a third side 563, a fourth side 564, a front face 565, and an opposite rear face 566. The first layer 530 has a series of longitudinal passages 539 having an elongate configuration with straight sides and a radius at each end. The second layer 560 has notches 569 that transition from a u-shape having parallel sides to angled sides which increase in width as they approach the first side 561 or second side 562 of the second layer 560. The notches 569 overlap with the longitudinal passages 539 when the first and second layers are aligned. The third layer 580 has a first side 581, a second side 582, a third side 583, a fourth side 584, a front face 585, and an opposite rear face 586. As can be best seen in FIG. 26, the apertures 512 are formed by the open ends of the notches 569 when the layers 530, 560 are alternately stacked as shown. Flow passages 570 are formed by the stacking of the layers 530, 560 as shown. The layers 530, 560 are of equal thickness in this embodiment, but may have different thicknesses if desired. The third layer may be useful for decreasing the density of the flow passages, ensuring that flow is more evenly distributed across the cross-sectional area of the flow restrictor 500. This is particularly useful for producing very high flow impedance flow restrictors.

Figure 30:
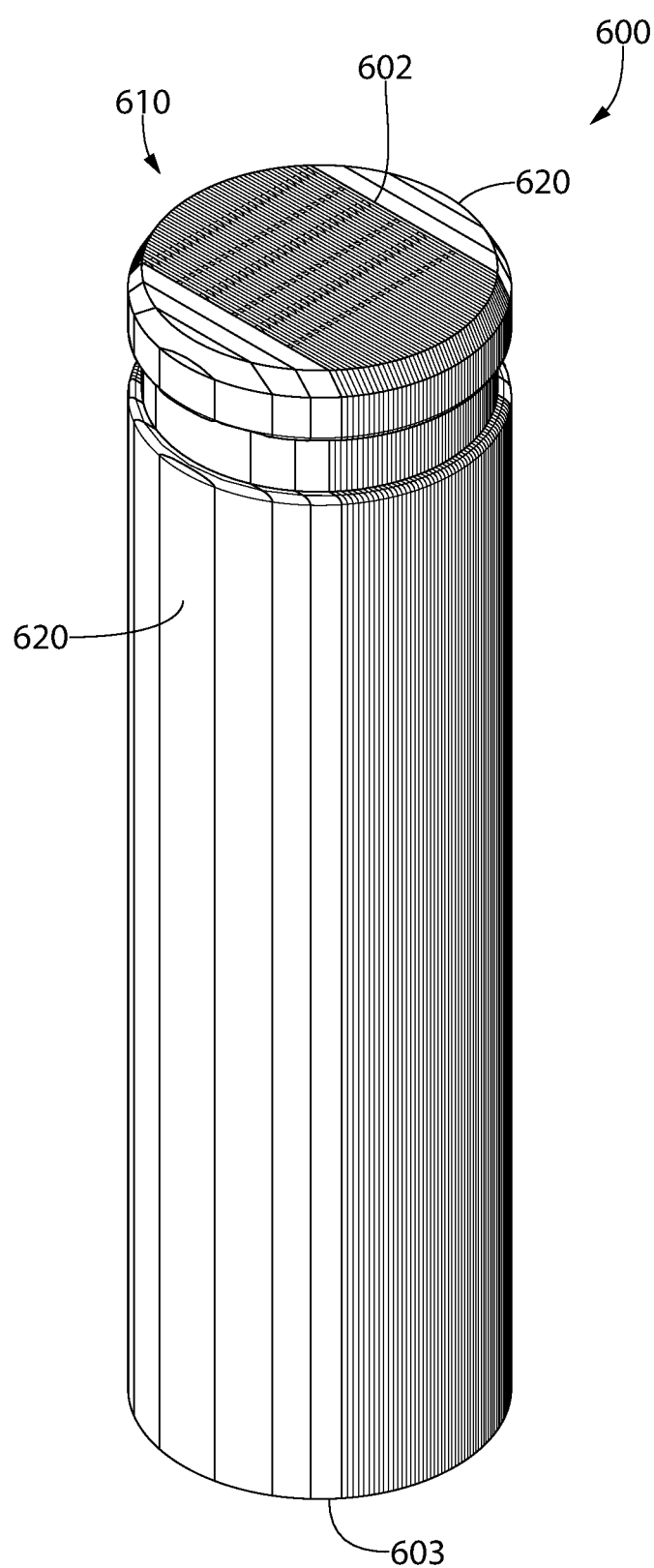
FIG. 30 is a perspective view of a fifth embodiment of a laminar flow restrictor.
Figure 31:
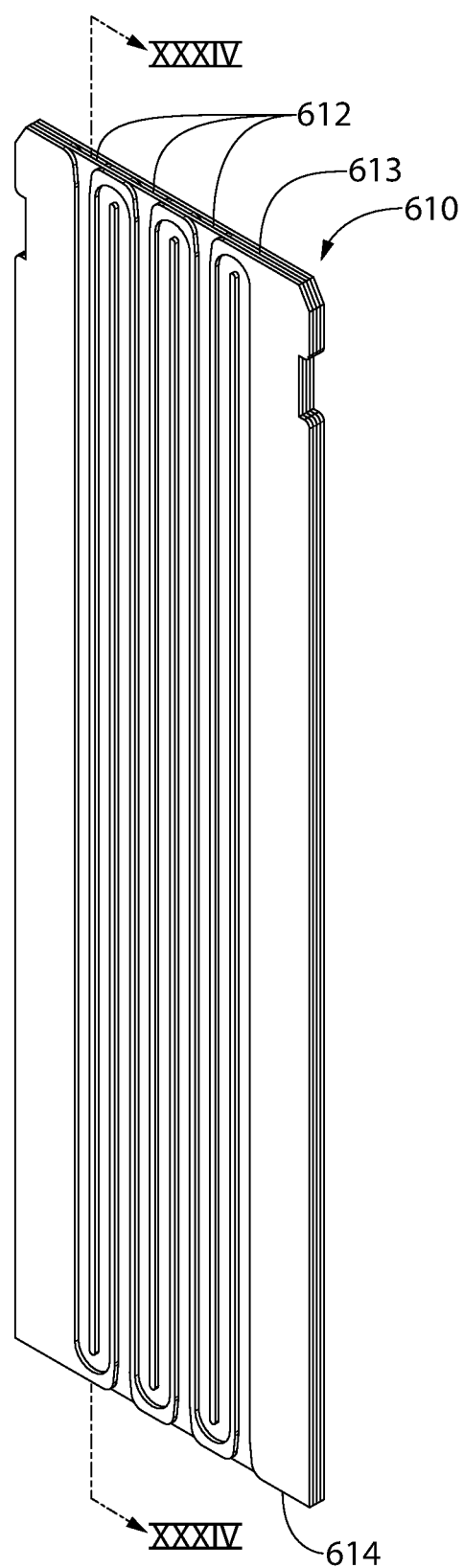
FIG. 31 is a perspective view illustrating a portion of the layers forming the flow restrictor of FIG. 30.
Figure 32:
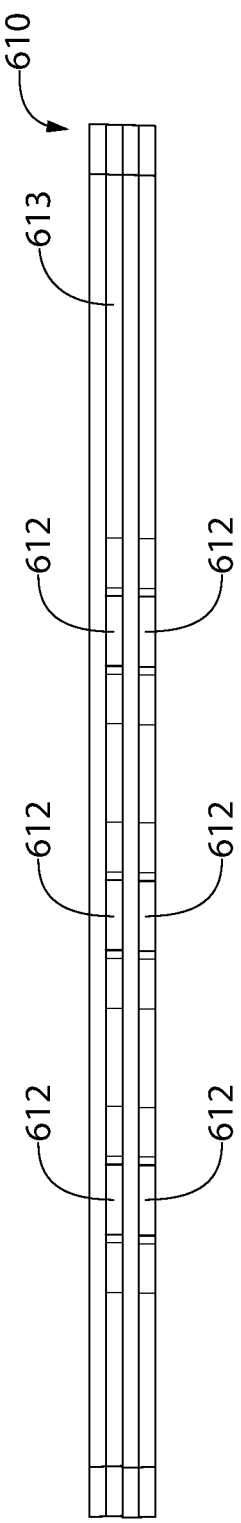
FIG. 32 is an end view of the portion of the flow restrictor of FIG. 31.
Figure 33:
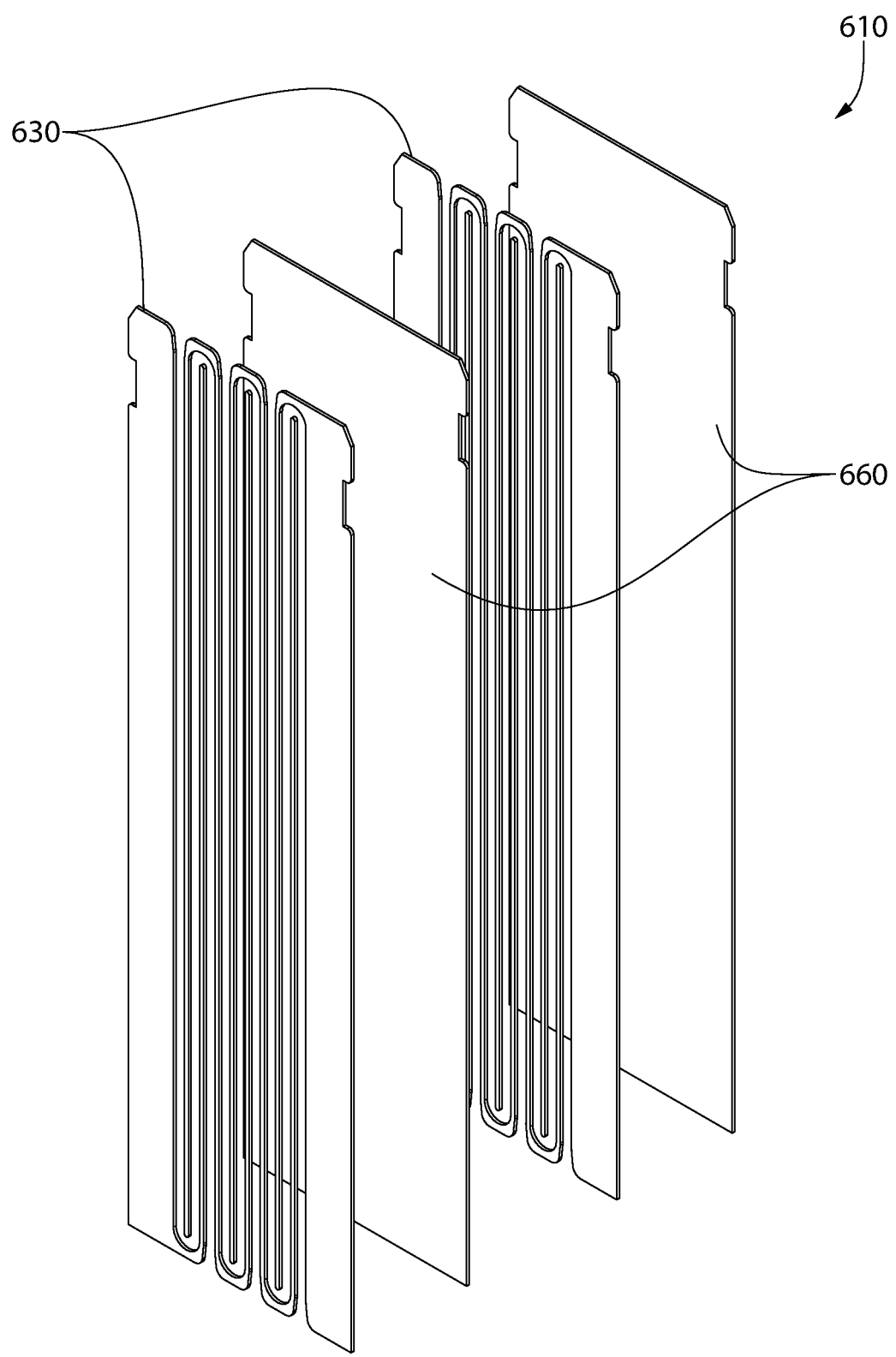
FIG. 33 is an exploded perspective view of the portion of the flow restrictor of FIG. 31.

A fifth embodiment of the flow restrictor 600 is shown in FIGS. 30-36. FIG. 30 shows the flow restrictor 600 in perspective. The flow restrictor 600 extends from a first end 602 to a second end 603 and has outer layers 620 which surround layers 610 which have flow passages therein. A selection of the layers 610 are shown in FIG. 31 in perspective view. These layers 610 extend from a first end 613 to a second end 614, with apertures 612 on the first and second ends 613, 614. An exploded view of the layers 610 is shown in FIG. 33, illustrating two first layers 630 and two second layers 660.

Figures 35, 36:
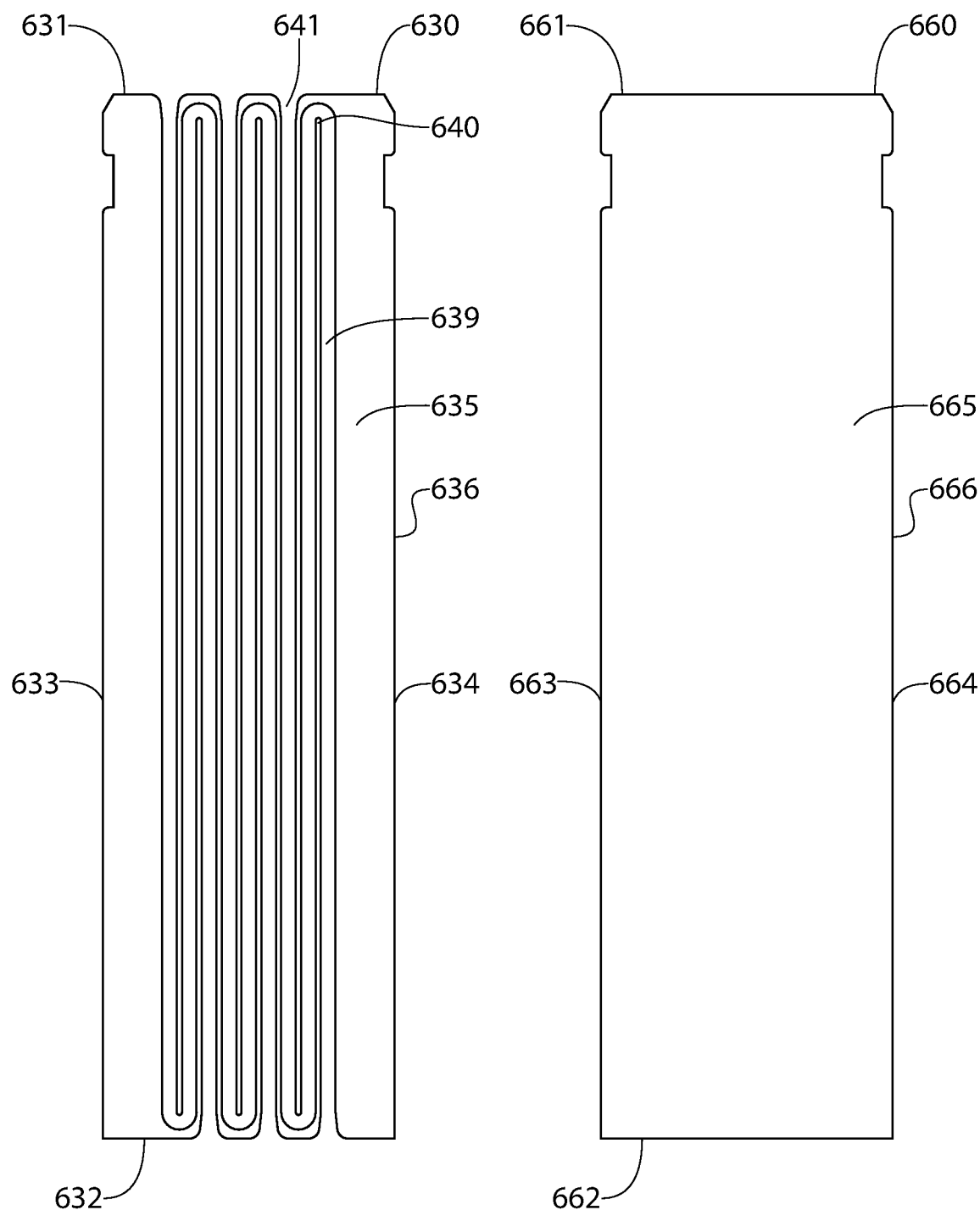
FIG. 35 is a top view a first layer of the flow restrictor of FIG. 31.
FIG. 36 is a top view a second layer of the flow restrictor of FIG. 31.

The first layer 630 and the second layer 660 are illustrated in FIGS. 35 and 36. The first layer 630 has a first side 631, a second side 632, a third side 633, a fourth side 634, a front face 635, and an opposite rear face 636. The second layer 660 has a first side 661, a second side 662, a third side 663, a fourth side 664, a front face 665, and an opposite rear face 666. The first layer 630 has a series of longitudinal passages 639 having an elongated configuration which meet with U shaped portions 640 or with openings 641. The second layer 660 is free of any flow passages or other features. As can be seen, in the flow restrictor 600, gas remains exclusively on a single layer 630 and does not transition between first and second layers 630, 660. Instead, it enters through an opening 641 at the first side 631, travels down a longitudinal passage 639, returns along a U shaped portion 640 at least two times, then exits through an opening 641 on the second side 632. The exact flow path may be altered to zig-zag, utilize more than two U shaped portions 640, no U shaped portions 640, or take any other path on the layer 630. However, it never flows through the second layer 660 in this embodiment. The longitudinal passages 639, U shaped portions 640, and openings 641 all extend through the entirety of the thickness of the first layer 630. In alternate configurations, single sheet flow may be obtained by forming the flow passage depth only partially through the sheet such that the sheet dimensions remain intact during assembly prior to bonding.

Figure 34:
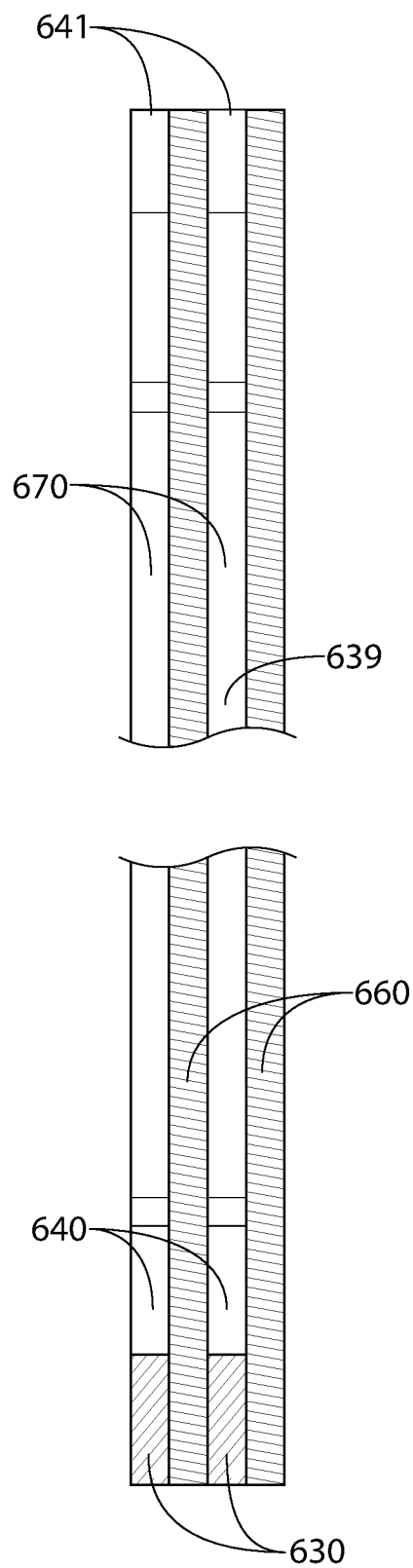
FIG. 34 is a cross-sectional view of the portion of the flow restrictor of FIG. 31, taken along line XXXIV-XXXIV.

As best shown in FIG. 34, flow passages 670 are formed by the stacking of the layers 630, 660 as shown. The layers 630, 660 are of equal thickness in this embodiment, but may have different thicknesses if desired. The layers 630, 660 are formed individually of different materials having a different reactivity when subjected to etching chemicals. The material of the first layer 630 may be more reactive than the material of the second layer 660, facilitating effective etching of the first layer 630 without significant etching of the second layer 660. Layer pairs are formed by assembling one first layer 630 with one second layer 660. The layer pairs are then diffusion bonded so they cannot be readily separated. As discussed above, other bonding techniques may be utilized. Then, the layer pairs are etched so that the flow passages 670 are formed into the first layer 630 without etching the second layer 660. The layer pairs are then assembled into the plurality of layers 610 having flow passages 670. Outer layers 620 are also assembled with the plurality of layers 610 having the flow passages 670. Finally, the layers 610, 620 are diffusion bonded together. Optionally, post processing such as grinding may be used to form the flow restrictor 600 and adapt it for installation into a flow passage of a device.

It should be noted that the flow passages do not need to extend straight from one end of the flow restrictor to the other end of the flow restrictor, or double back in parallel rows. Instead, it is conceived that the flow passages may zig-zag, arc, or take any other path needed to achieve the desired flow impedance in the completed flow restrictor. Multiple layer transitions may also be made, enabling the use of flow passages which fork and rejoin, transition across more than two or three layers, or the like. It is further conceived that flow restrictors may incorporate features of specific embodiments in combination, such that a hybrid of the disclosed embodiments may be constructed. The above-disclosed restrictor designs can be used to achieve highly laminar flow and high part to part reproducibility. This high reproducibility reduces calibration requirements when manufacturing flow control devices utilizing one or more laminar flow elements.

Figure 37:
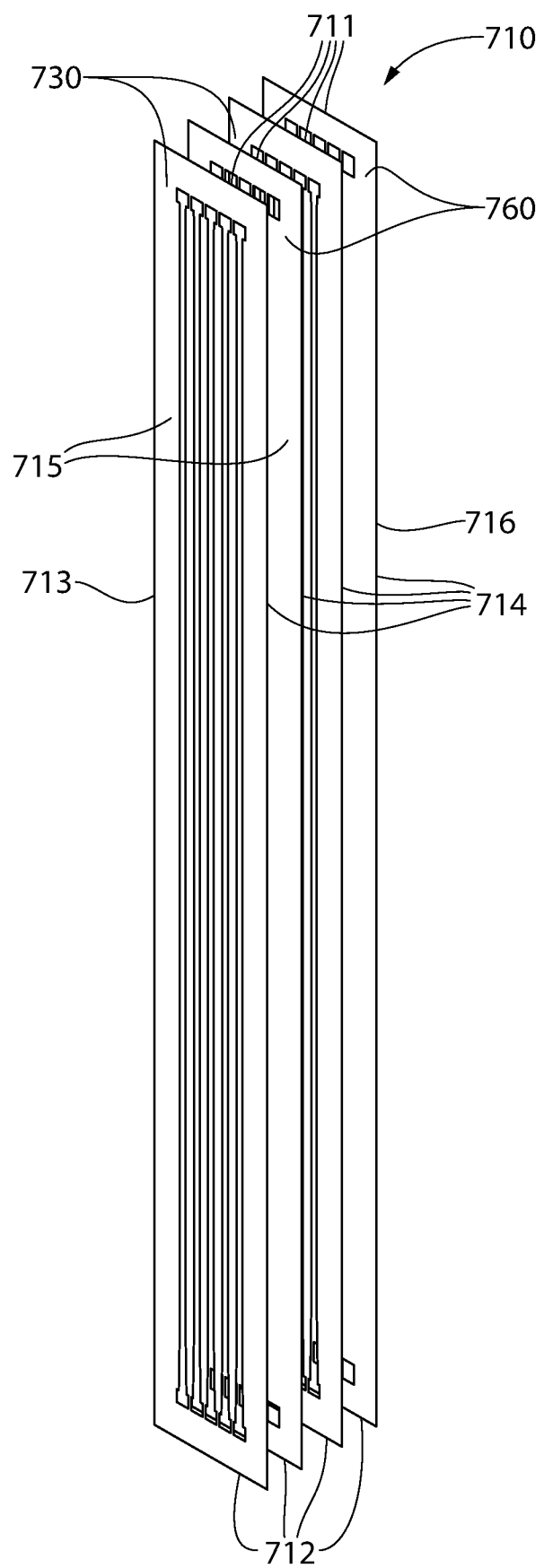
FIG. 37 is an exploded perspective view of a plurality of layer blanks illustrating methods of manufacturing the disclosed flow restrictors.
Figure 38:
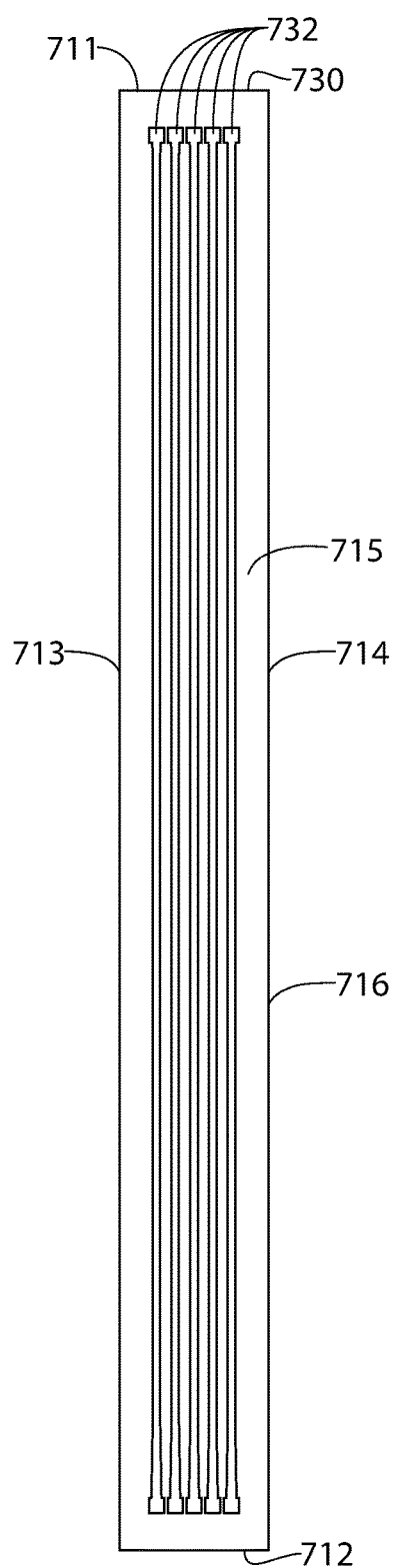
FIG. 38 is a top view of a first layer of the invention of FIG. 37.
Figure 39:
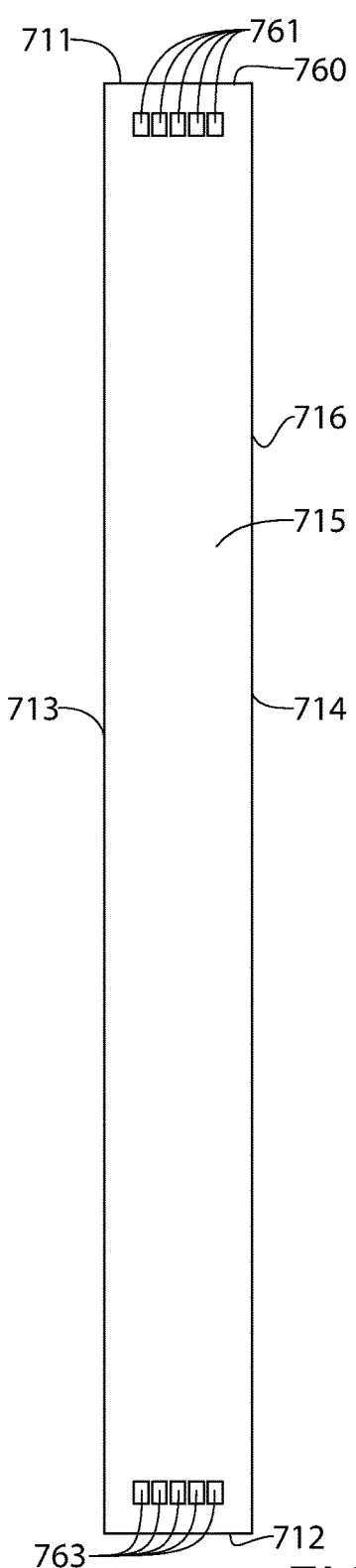
FIG. 39 is a top view of a second layer of the invention of FIG. 37.

Details illustrating a method of forming the flow restrictors according to the present invention are shown in FIGS. 37-41. FIG. 37 shows a plurality of layer blanks 710 in an exploded view. Each of the layer blanks has a first edge 711, a second edge 712 opposite the first edge, a third edge 713, and a fourth edge 714 opposite the third edge. The layer blanks 710 further comprise a front face 715 and a rear face 716 opposite the front face 715. The layer blanks 710 are formed into first layers 730 and second layers 760 as further illustrated in FIGS. 38 and 39. The first layer 730 is modified from a layer blank 710 by forming a second cavity 732 into the first layer 730. The second layer 760 is modified from a layer blank 710 by forming a first cavity 761 and a third cavity 763 into the second layer 760. The first, second, and third cavities 761, 732, 763 are formed into the front faces 715 of their respective first and second layers 730, 760. Preferably the cavities 761, 732, 763 are formed through the thickness of the layers 730, 760. In some embodiments, some or all of the cavities 761, 732, 763 may be formed only partially through the thickness of the layers 730, 760. In the illustrated method, the cavities 761, 732, 763 are formed from the front face 715 to the rear face 716. The cavities 761, 732, 763 are spaced from the first, second, third, and fourth edges 711, 712, 713, 714 of the layer blanks 710.

Figure 40:
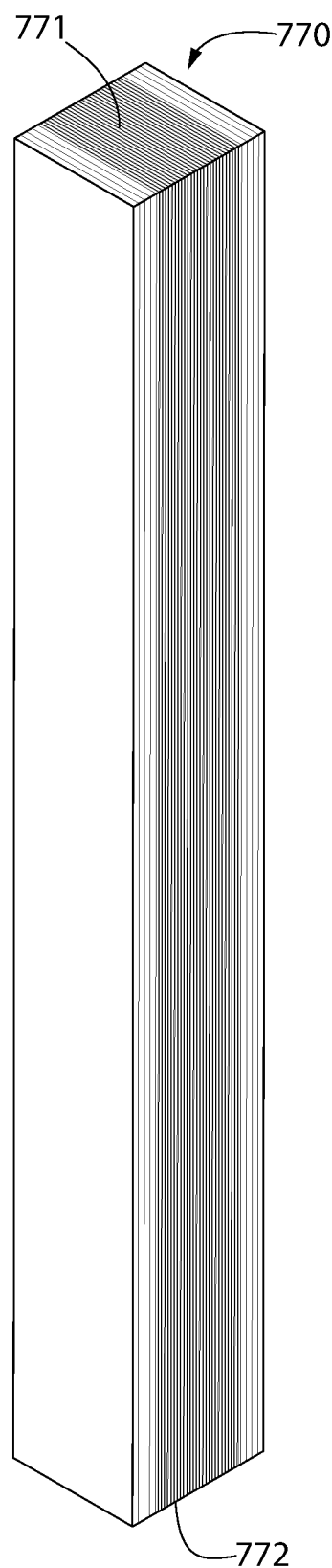
FIG. 40 is a perspective view of a resistor stack prior to finishing according to the invention of FIG. 37.

The cavities 761, 732, 763 are formed by etching the layer blanks 710. Alternate processes are available such as micro-machining, laser ablation, or other known techniques. As illustrated in FIG. 40, a resistor stack 770 is formed from the plurality of layers 730, 760. Subsequent to formation of the cavities 761, 732, 763, the layers 730, 760 are stacked in alternating layers, ensuring that the layers 730, 760 are kept in alignment so that the second cavity 732 overlaps with the first and third cavities 761, 763. The layers 730, 760 are then bonded to form the resistor stack 770 as a unitary component. The layers 730, 760 may be bonded by diffusion bonding, welding, gluing, or any other known technique. In yet other embodiments, the second cavity 732 may be the only cavity and the first and third cavities 761, 763 may be omitted. Thus, it is conceived that the second cavity 732 may be the only cavity required where the flow passages are formed into a single layer.

The resistor stack 770 comprises a first unfinished end 771 formed by the first edges 711 of the first and second layers 730, 760. An opposite second unfinished end 772 is formed by the second edges 712 of the first and second layers 730, 760 of the resistor stack 770. As can be seen, no cavities are exposed on the unfinished ends 771, 772. In alternate embodiments, only one of the layers 730, 760 need have cavities, with the other layers 730, 760 being free of cavities. This allows formation of resistors such as those shown in FIGS. 30-36. In yet other embodiments, three or more different types of layers may be utilized such as is shown in FIGS. 23-27. The layers need not be alternately stacked, but instead may simply be separated from each other. Thus, un-modified layer blanks 710 may be interleaved with the first and second layers if so desired. Any combination of layers can be made so long as at least one flow passage is formed in the finished flow resistor.

Figure 41:
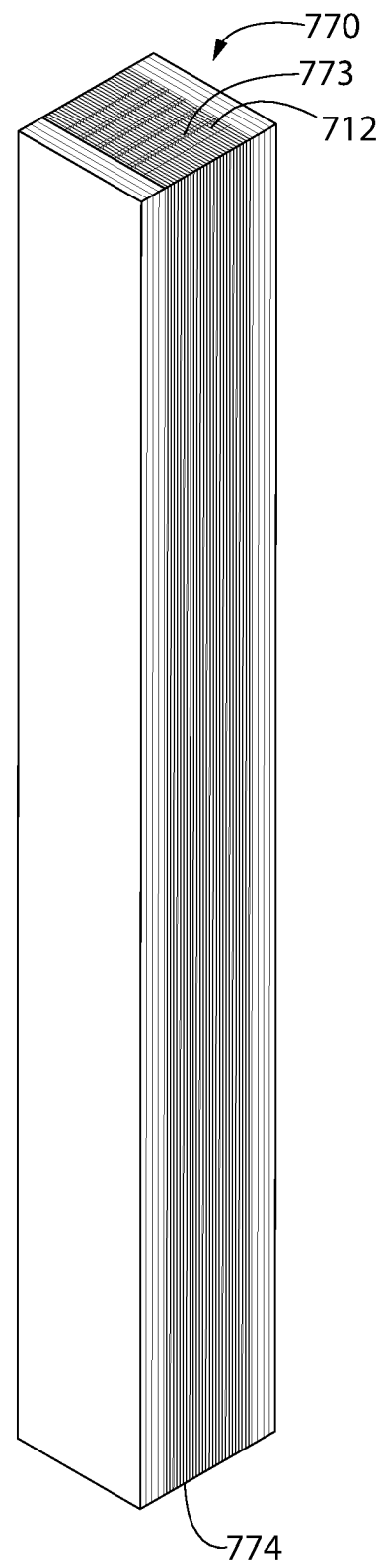
FIG. 41 is a perspective view of a resistor stack after finishing according to the invention of FIG. 37.

FIG. 41 illustrates the resistor stack 770 after finishing operations have been completed. These finishing operations can take one of two alternative forms. In the first process, the unfinished ends 771, 772 are broken off of the resistor stack 770 to expose the first and third cavities 761, 763. The exposed first and third cavities 761, 763 form apertures 712 on first and second finished ends 773, 774. This results in flow passages extending from the apertures 712 on the first finished end 773 to the apertures 712 on the second finished end. Optionally, additional material removal operations can be done to the resistor stack 770 prior to removal of the unfinished ends 771, 772. This has the benefit of minimizing the amount of debris which enters the flow passages, ensuring that the resulting flow restriction closely matches the theoretical flow restriction provided by the flow restrictor. Furthermore, manufacturing repeatability is greatly improved by ensuring that debris cannot enter the flow passages.

In an alternative second process, the unfinished ends 771, 772 of the resistor stack 770 are removed through conventional material removal processes such as machining, milling turning, sawing, grinding, electrical discharge machining, or etching. Once the unfinished ends 771, 772 are removed to form the finished ends 773, 774, the resistor stack 770 is rinsed with deionized water. An electropolish process is used to dissolve any remaining metal particles and produce a surface having very low roughness. Next, deionized water is pumped through the flow passages to flush the electropolishing solution. The resistor stack 770 is then dried and subsequently a nitric acid solution is used to remove any remaining free iron, phosphates, and sulfates. This results in a surface which is extremely clean and free of contaminants.

Section II

The present invention is directed to a seal for a flow restrictor for use in an apparatus for controlling gas flow. In some embodiments, the apparatus may function as a mass flow controller to deliver a known mass flow of gas to a semiconductor or similar process. Semiconductor fabrication is one industry which demands high performance in control of gas flows. As semiconductor fabrication techniques have advanced, customers have recognized the need for flow control devices with increased accuracy and repeatability in the mass of the delivered gas flows. Modern semiconductor processes require that the mass of the gas flow is tightly controlled, the response time minimized, and the gas flow is highly accurate. The present seals ensure that the flow restrictor is sealed into its flow passage more effectively and at a reduced cost.

Figure 42:
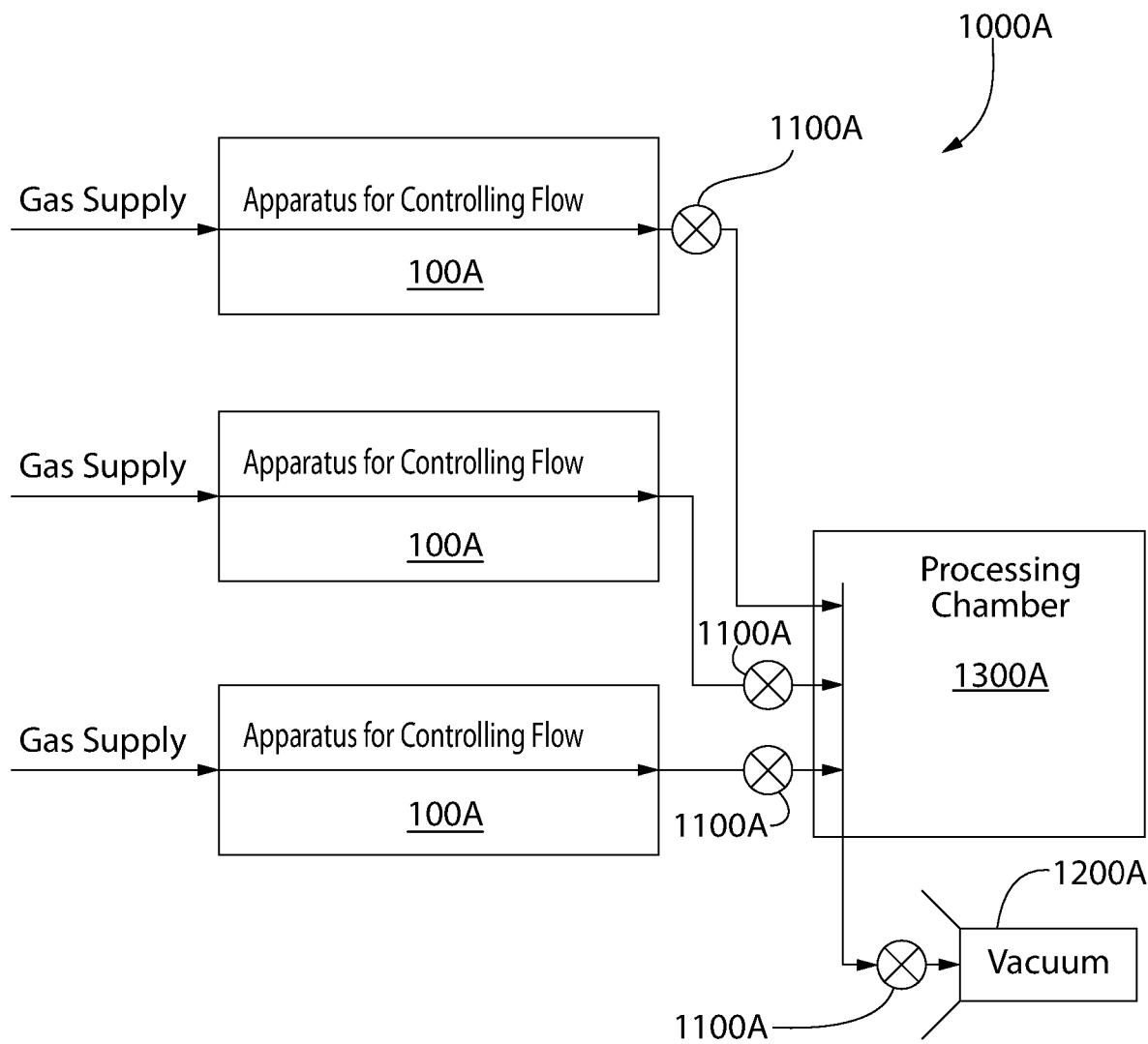
FIG. 42 is a schematic of a process utilizing one or more flow restrictors.

FIG. 42 shows a schematic of an exemplary processing system 1000A utilizing one or more flow restrictors. The processing system 1000A may utilize a plurality of apparatus for controlling flow 100A fluidly coupled to a processing chamber 1300A. The plurality of apparatus for controlling flow 100A are used to supply one or more different process gases to the processing chamber 1300A. Articles such as semiconductors may be processed within the processing chamber 1300A. Valves 1100A isolate each of the apparatus for controlling flow 100A from the processing chamber 1300A, enabling each of the apparatus for controlling flow 100A to be selectively connected or isolated from the processing chamber 1300A, facilitating a wide variety of different processing steps. The processing chamber 1300A may contain an applicator to apply process gases delivered by the plurality of apparatus for controlling flow 100A, enabling selective or diffuse distribution of the gas supplied by the plurality of apparatus for controlling flow 100A. In addition, the processing system 1000A may further comprise a vacuum source 1200A which is isolated from the processing chamber 1300A by a valve 1100A to enable evacuation of process gases or facilitate purging one or more of the apparatus for controlling flow 100A to enable switching between process gases in the same apparatus for controlling flow 100A. Optionally, the apparatus for controlling flow 100A may be mass flow controllers, flow splitters, or any other device which controls the flow of a process gas in a processing system. Furthermore, the valves 1100A may be integrated into the apparatus for controlling flow 100A if so desired.

Processes that may be performed in the processing system 100A may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 43:
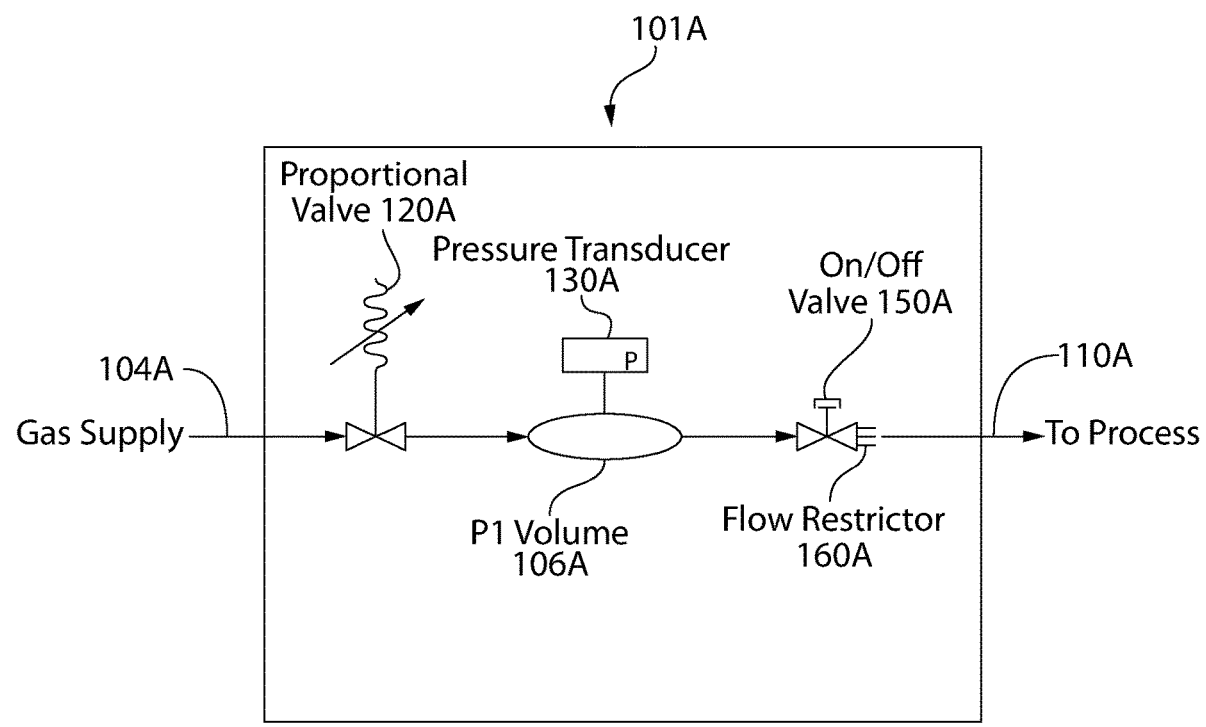
FIG. 43 is a schematic of a mass flow controller as may be utilized in the process of FIG. 42.

FIG. 43 shows a schematic of an exemplary mass flow controller 101A, which is one type of apparatus for controlling flow 100A that may be utilized in the processing system 1000A. The mass flow controller 101A has a gas supply of a process gas fluidly coupled to an inlet 104A. The inlet 104A is fluidly coupled to a proportional valve 120A which is capable of varying the volume of process gas flowing through the proportional valve 120A. The proportional valve 120A meters the mass flow of process gas which passes to the P1 volume 106A. The proportional valve 120A is capable of providing proportional control of the process gas such that it need not be fully open or closed, but instead may have intermediate states to permit control of the mass flow rate of process gas.

A P1 volume 106A is fluidly coupled to the proportional valve 120A, the P1 volume 106A being the sum of all the volume within the mass flow controller 101A between the proportional valve 120A and a flow restrictor 160A. A pressure transducer 130A is fluidly coupled to the P1 volume 106A to enable measurement of the pressure within the P1 volume 106A. An on/off valve 150A is located between the flow restrictor 160A and the proportional valve 120A and may be used to completely halt flow of the process gas out of the P1 volume 106A. Optionally, the flow restrictor 160A may be located between the on/off valve 150A and the proportional valve 120A in an alternate configuration. Finally, the flow restrictor 160A is fluidly coupled to an outlet 110A of the mass flow controller 101A. In the processing system, the outlet 110A is fluidly coupled to a valve 1100A or directly to the processing chamber 1300A. In the present embodiment, the flow restrictor 160A is located between the on/off valve 150A and the outlet 110A. In an alternate embodiment, the on/off valve 150A is located between the flow restrictor 160A and the outlet 110A. Thus, the arrangement of the on/off valve 150A and the flow restrictor 160A may be reversed.

Internal to the first on/off valve 150A is a valve seat and a closure member. When the apparatus 100A is delivering process gas, the first on/off valve 150A is in an open state, such that the valve seat and the closure member are not in contact. This permits flow of the process gas and provides a negligible restriction to fluid flow. When the first on/off valve 150A is in a closed state the closure member and the valve seat are biased into contact by a spring, stopping the flow of process gas through the first on/off valve 150A.

The flow restrictor 160A is used, in combination with the proportional valve 120A, to meter flow of the process gas. In most embodiments, the flow restrictor 160A provides a known restriction to fluid flow. The first characterized flow restrictor 160A may be selected to have a specific flow impedance so as to deliver a desired range of mass flow rates of a given process gas. The flow restrictor 160A has a greater resistance to flow than the passages upstream and downstream of the flow restrictor 160A.

Optionally, the mass flow controller 101A comprises one or more P2 pressure transducers downstream of the flow restrictor 160A and the on/off valve 150A. The P2 pressure transducer is used to measure the pressure differential across the flow restrictor 160A. In some embodiments, the P2 pressure downstream of the flow restrictor 160A may be obtained from another apparatus 100A connected to the processing chamber, with the readings communicated to the mass flow controller 101A.

Optionally, temperature sensors may be employed to further enhance the accuracy of the mass flow controller 101A. They may be mounted in the base of the mass flow controller 101A near the P1 volume 106A. Additional temperature sensors may be employed in a variety of locations, including the proportional valve 120A, the pressure transducer 130A, and the on/off valve 150A.

Figure 44:
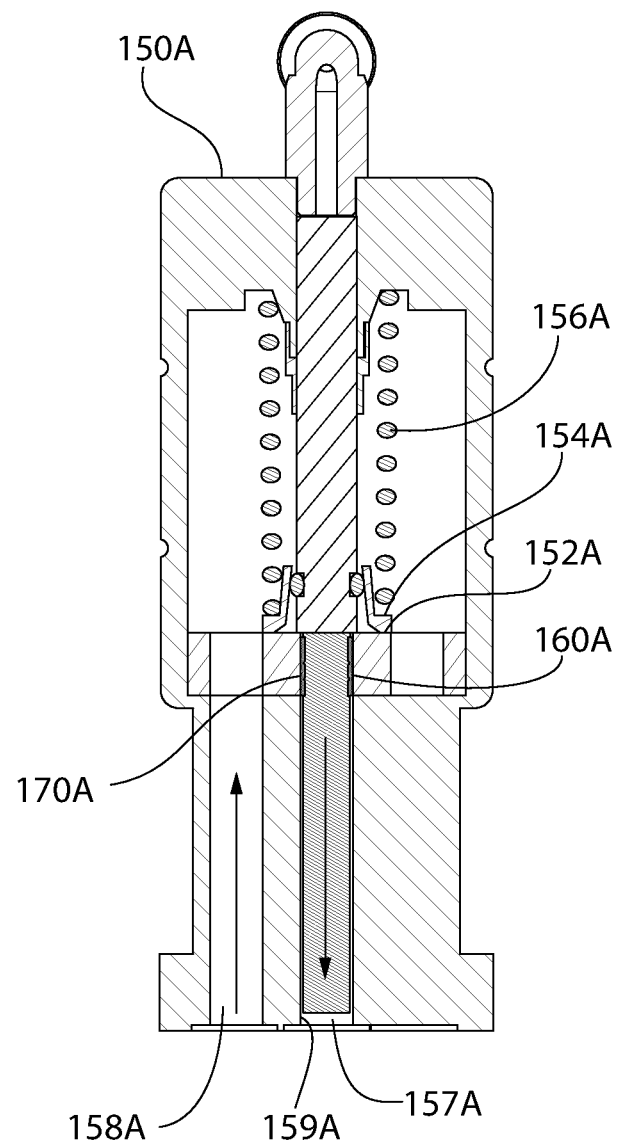
FIG. 44 is a schematic view of a valve incorporating a first embodiment of a flow restrictor and seal as may be utilized in the mass flow controller of FIG. 43.

Turning to FIG. 44, a schematic of an on/off valve 150A is shown with a first embodiment of the flow restrictor 160A located within an outlet passage 157A of the on/off valve 150A. The on/off valve 150A has an inlet passage 158A which allows process gas to flow into the valve 150A. A spring 156A biases a closure member 154A into contact with a valve seat 152A, preventing process gas from flowing when the valve 150A is in a closed state. When in an open state, the closure member 154A is moved so that it is spaced from the valve seat 152A, allowing process gas to pass the valve seat 152A into the outlet 157A. The outlet 157A is formed as a cylindrical bore, but may also be formed as an oval, polygon, or any other shape. The flow restrictor 160A is inserted into the outlet 157A with a seal 170A preventing gas flow between the flow restrictor 160A and the wall 159A of the outlet 157A.

Figure 45:
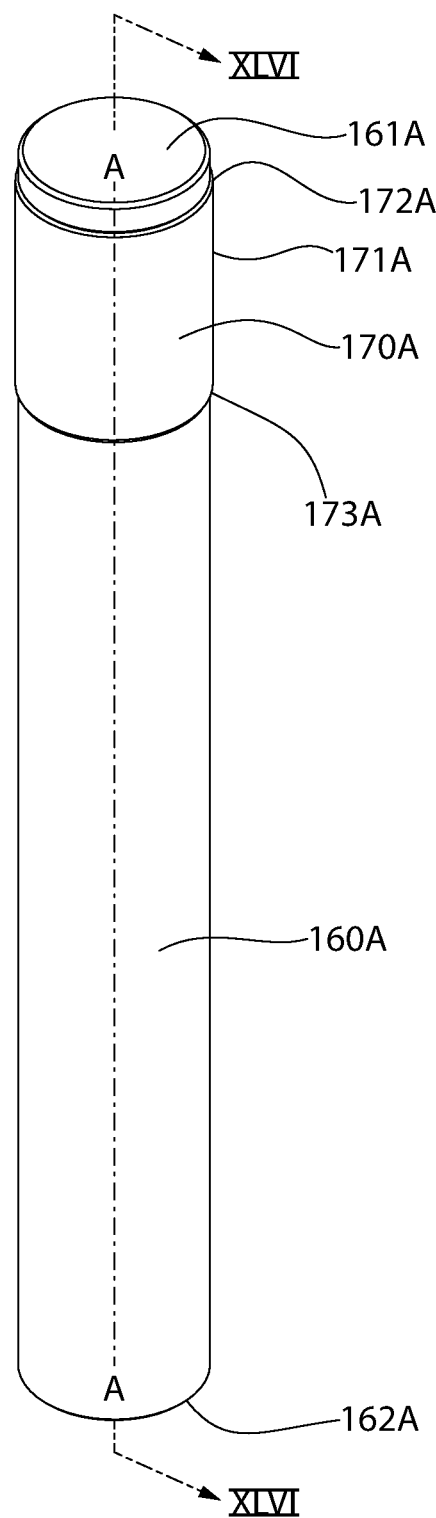
FIG. 45 is a perspective view of the first embodiment of the flow restrictor and seal as may be utilized in the valve of FIG. 44.

Turning to FIGS. 45-48, the flow restrictor 160A and the seal 170A are shown in greater detail. FIG. 45 shows a perspective view of the flow restrictor 160A and the seal 170A. The flow restrictor 160A extends from a first end 161A to a second end 162A along a longitudinal axis A-A. The seal 170A is fitted to the flow restrictor 160A. The seal 170A circumferentially surrounds the flow restrictor 160A and has an outer surface 171A. The seal 170A extends between a first end 172A and a second end 173A along a longitudinal axis B-B. The longitudinal axis B-B of the seal 170A is collinear with the longitudinal axis A-A of the flow restrictor 160A. However, in alternate embodiments, the longitudinal axis B-B of the seal 170A may not be collinear with the longitudinal axis A-A of the flow restrictor 170A. In some embodiments, the longitudinal axis B-B of the seal is angled with respect to the longitudinal axis A-A of the flow restrictor 160A. In yet other embodiments, the longitudinal axis B-B of the seal may be spaced but parallel to the longitudinal axis A-A of the flow restrictor 160A. In yet other embodiments, the axes may be both angled and spaced from one another.

Figure 46:
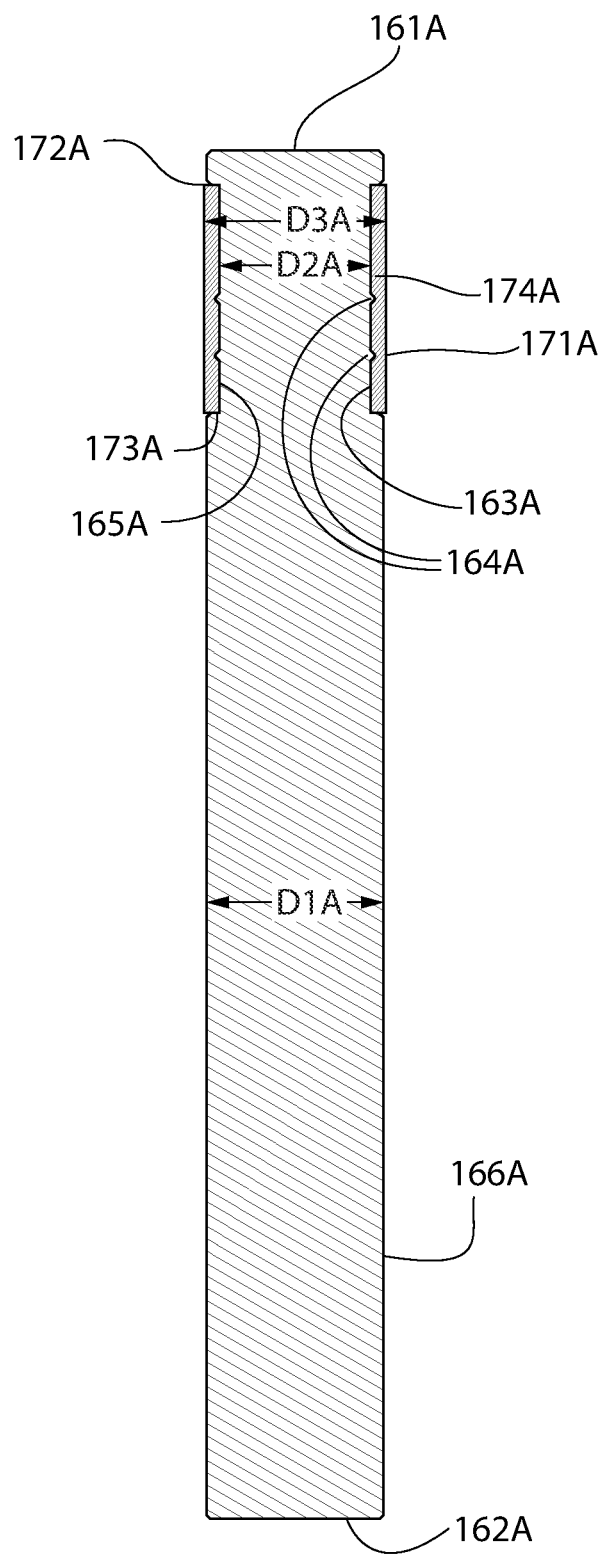
FIG. 46 is a cross-sectional view of the flow restrictor and seal of FIG. 45, taken along line XLVI-XLVI.
Figure 47:
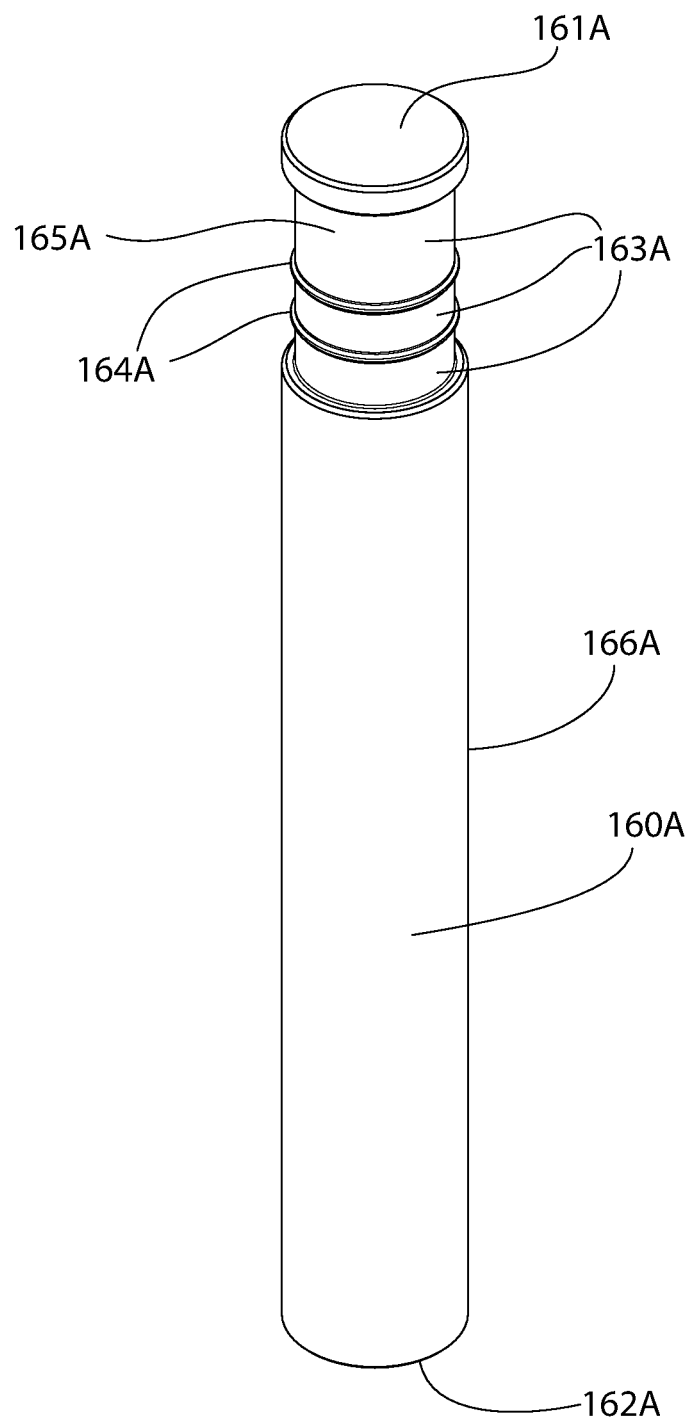
FIG. 47 is a perspective view of the flow restrictor of FIG. 45 without the seal.
Figure 48:
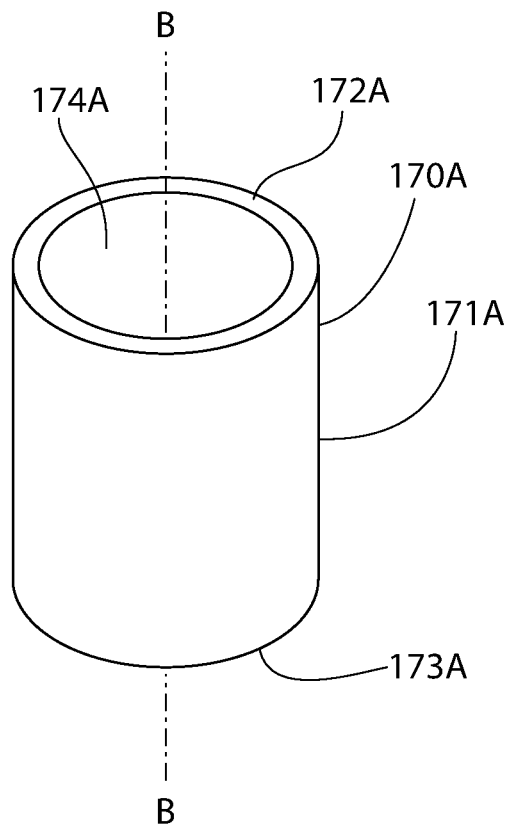
FIG. 48 is a perspective view of the seal of FIG. 45 without the flow restrictor.

As best seen in FIG. 46, the flow restrictor 160A has a sealing portion 163A and an unsealed portion 166A. The unsealed portion 166A has a first diameter D1A and the sealing portion 163A has a second diameter D2A, the first diameter D1A being greater than the second diameter D2A. The seal 170A further comprises an inner surface 174A which is in surface contact with the sealing portion 163A of the flow restrictor 160A. The outer surface 171A has a third diameter D3A which is greater than either of the first and second diameters D1A, D2A. This results in an interference fit between the wall 159A and the outer surface 171A and ensures that the seal 170A seals against the wall 159A of the outlet 157A while simultaneously preventing contact between the flow restrictor 160A and the wall 159A. The inner surface 174A defines an aperture through which the flow restrictor 160A is received and through which all gas flows generally along the axis B-B from the first end 161A to the second end 162A of the flow restrictor 160A. In yet other embodiments, the sealing portion 163A extends the entire length of the flow restrictor 160A. In yet further embodiments, the first diameter DIA may be the same diameter as the second diameter D2A. Preferably, the third diameter D3A has an interference fit with the wall 159A. The third diameter D3A may also be the same diameter as the second diameter D2A. Furthermore, the gas need not enter from the first end 161A and exit the second end 162A of the flow restrictor, but may also enter through the circumference of the flow restrictor 160A. Flow of gas within the flow restrictor 160A need not flow strictly along the axis B-B, but need only pass through the flow restrictor 160A and past the seal 170A rather than around it.

The sealing portion 163A has a seal receiving surface 165A and a plurality of ridges 164A used to improve sealing and retain the seal in place. The second diameter D2A is reduced as compared with the first diameter D1A so as to provide room for the seal 170A and enhance retention of the seal 170A on the flow restrictor 160A. The ridges 164A have a triangular cross-section and encircle the flow restrictor 160A. When the seal 170A is installed onto the sealing portion 163A of the flow restrictor 160A, the ridges 164A deform the seal 170A to further enhance the retention of the seal 170A. This ensures that the seal 170A is maintained on the flow restrictor 160A when the flow restrictor is pressed into the outlet 157A. The third diameter D3A is typically an interference fit with the outlet 157A, so substantial force may be required to press the seal 170A into the outlet 157A depending on the extent of the interference. In the exemplary embodiment, the sealing portion 163A has two ridges 164A. In alternate embodiments, the sealing portion 163A may have greater or fewer ridges 164A. The cross-sectional profile of the ridges 164A may be rectangular, trapezoidal, or any other shape. In yet further variations, a texture may be formed on the seal receiving surface 165A. This texture may be formed by knurling, grinding, or any other known process. In alternate embodiments, a single model of flow restrictor 160A may be installed into a plurality of outlets 157A having differing diameters by modifying the thickness of the seal such that the third diameter D3A is modified to have a suitable interference with the wall 159A of each of the respective outlets 157A. This configuration beneficially allows the restrictor to be installed directly against the seat of the valve, greatly reducing the volume enclosed between the valve seat and the flow restrictor 160A. In addition, multiple valve geometries, bore sizes, and fitting geometries can be accommodated by positioning the flow restrictor 160A within the outlet 157A.

In use, process gas flows through the flow restrictor 160A from the first end 161A to the second end 162A. The seal 170A provides a close fit with both the flow restrictor 160A and the wall 159A of the outlet 157A so as to prevent process gas from flowing around the flow restrictor 160A. Although some leakage of gas is possible, this leaking is reduced to at least $1 \times 10^{-7}$ atm-cc/sec when Helium is used as a process gas. This leak rate ensures that a negligible volume of process gas flows around the flow restrictor 160A rather than through the flow restrictor 160A.

The seal 170A is preferably formed of a non-metallic material such as a plastic material. One exemplary material could be Polytetrafluoroethylene (also known as "PTFE" or "Teflon"). Alternate materials may include metals, ceramics, or composite materials. The seal 170A is preferably shrunk or stretched onto the flow restrictor 160A so as to ensure a tight fit between the seal receiving surface 165A and the inner surface 174A. However, other methods are contemplated. In yet further embodiments, the seal may be welded, bonded, or pressed onto the flow restrictor 160A so as to achieve a secure gas tight connection between the seal 170A and the flow restrictor 160A. In yet another embodiment, a plurality of identical flow restrictors 160A are mounted to differing seals 170A to allow installation into different size outlets 157A.

Figure 49:
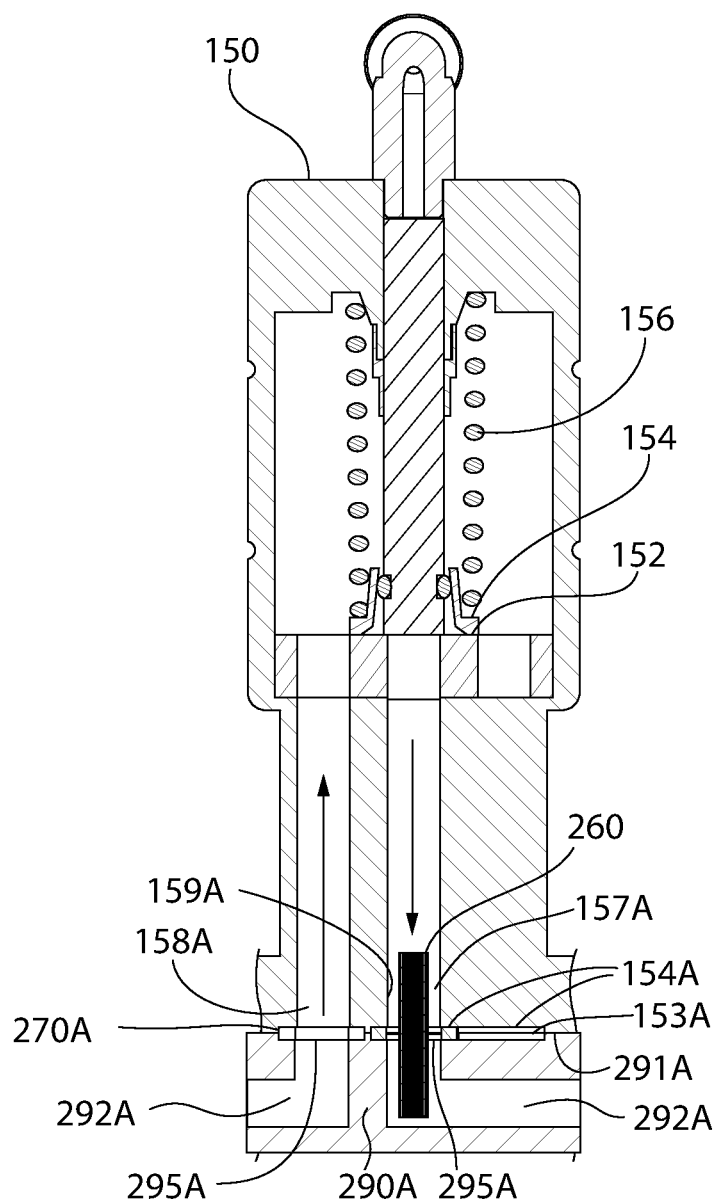
FIG. 49 is a schematic view of a valve incorporating a second embodiment of a flow restrictor and seal as may be utilized in the mass flow controller of FIG. 43.
Figure 50:
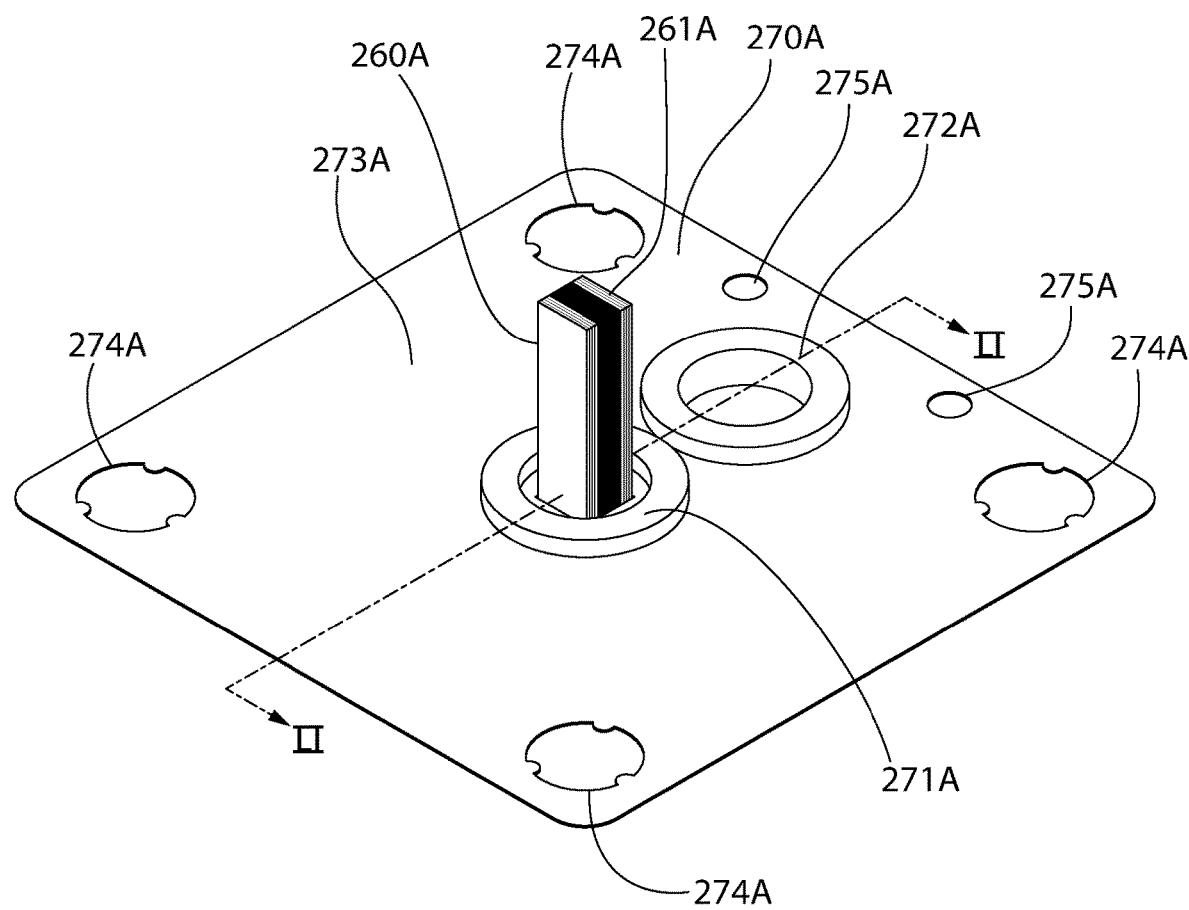
FIG. 50 is a perspective view of the second embodiment of the flow restrictor and seal as may be utilized in the valve of FIG. 49.
Figure 51:
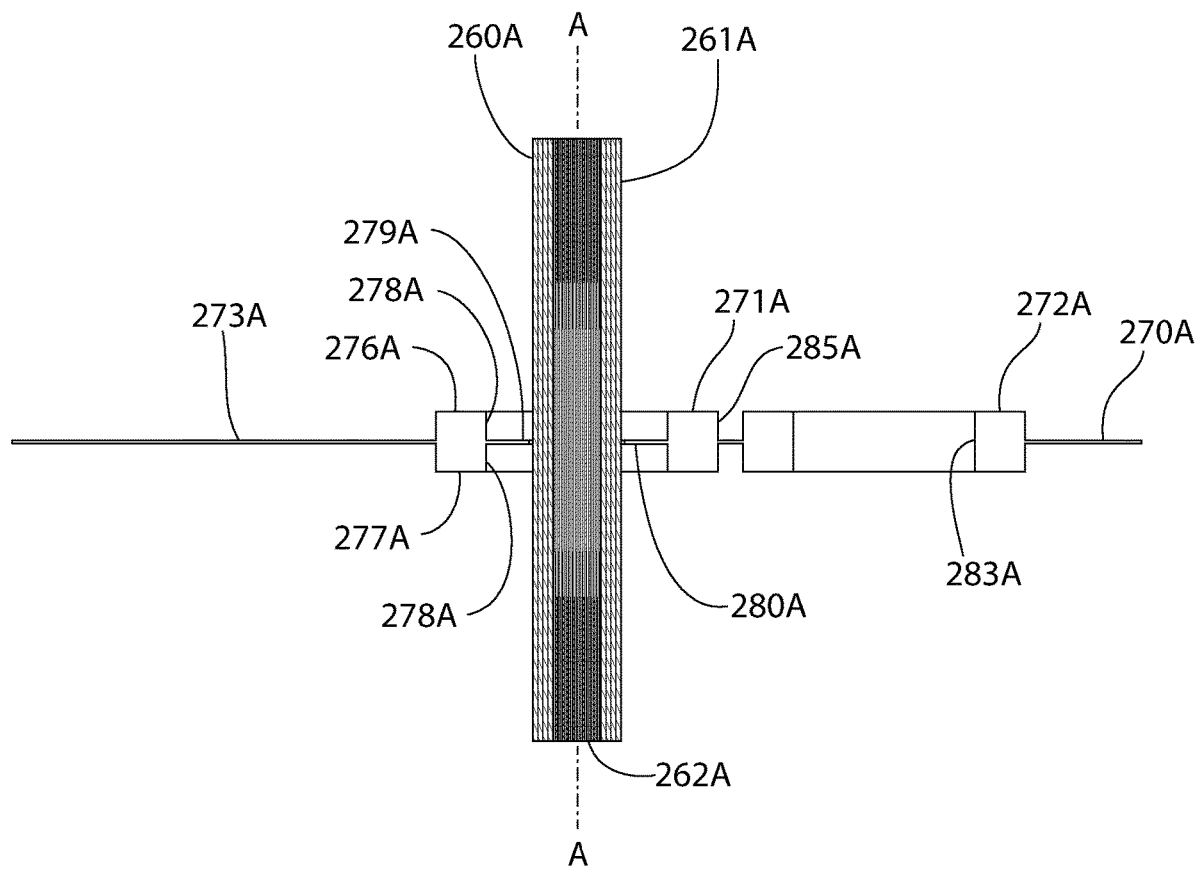
FIG. 51 is a cross-sectional view of the flow restrictor and seal of FIG. 50, taken along line LI-LI.

Turning to FIGS. 49-55, a second embodiment of a flow restrictor 260A is shown with a seal 270A. As can be seen in the schematic of FIG. 49, a valve 150A is illustrated. The valve 150A is substantially identical to the valve 150A of FIG. 44. However, instead of having a flow restrictor pressed into the outlet 157A, a seal 270A is mounted between a sealing surface 153A of the valve 150A and a sealing surface 291A of a base 290A, the base 290A comprising flow passages 292A which connect the on/off valve 150A to the various components of the mass flow controller 101A or other apparatus for controlling flow 100A. The seal 270A is installed between the sealing surface 153A and the sealing surface 291A and has a first seal ring 271A and a second seal ring 272A as best shown in FIGS. 50 and 51. The first seal ring 271A and second seal ring 272A are mounted to a gasket sheet 273A and extend beyond the gasket sheet 273A to engage sealing recesses 155A, 295A of the valve 150A and the base 290A, respectively. A plurality of apertures 274A are provided through the gasket sheet 273A to allow the passage of fasteners used to join the valve 150A to the base 290A. Additional holes 275A may be used to facilitate manufacturing of the seal 270A or for other purposes such as to seal additional flow passages.

Figure 52:
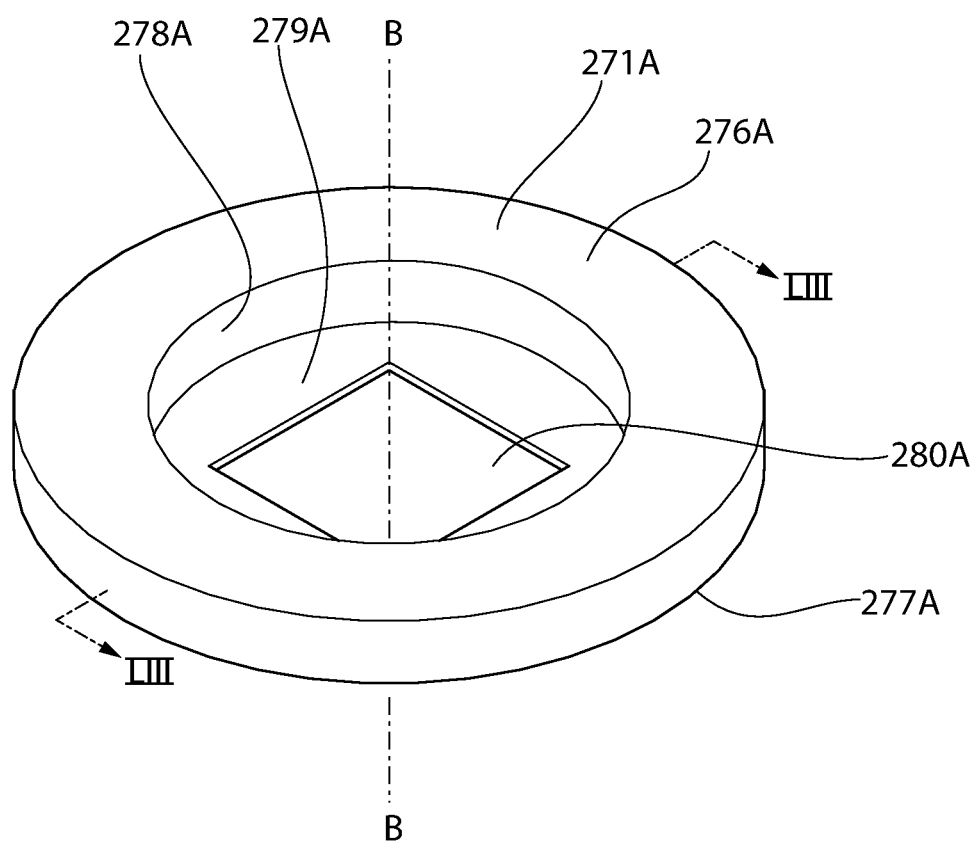
FIG. 52 is a perspective view of the seal of FIG. 50 without the flow restrictor.
Figure 53:
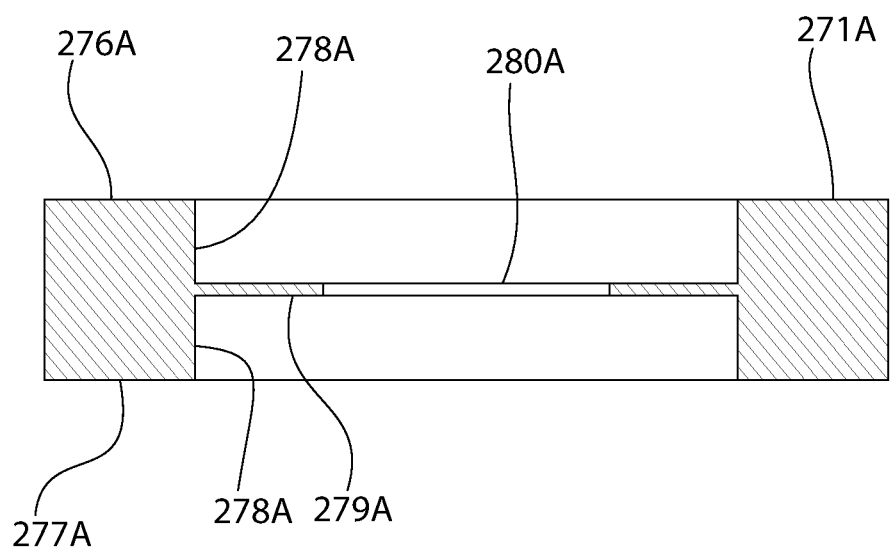
FIG. 53 is a cross-sectional view of the seal of FIG. 52, taken along line LIII-LIII.
Figure 54:
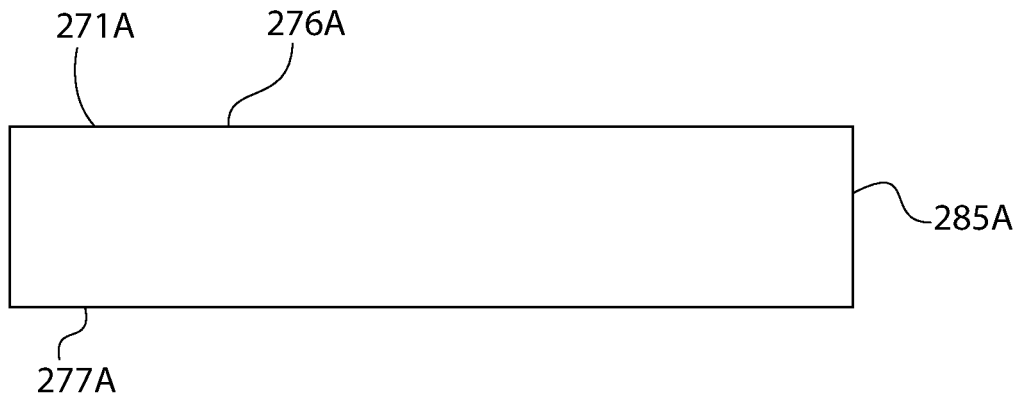
FIG. 54 is a front view of the seal of FIG. 52.
Figure 55:
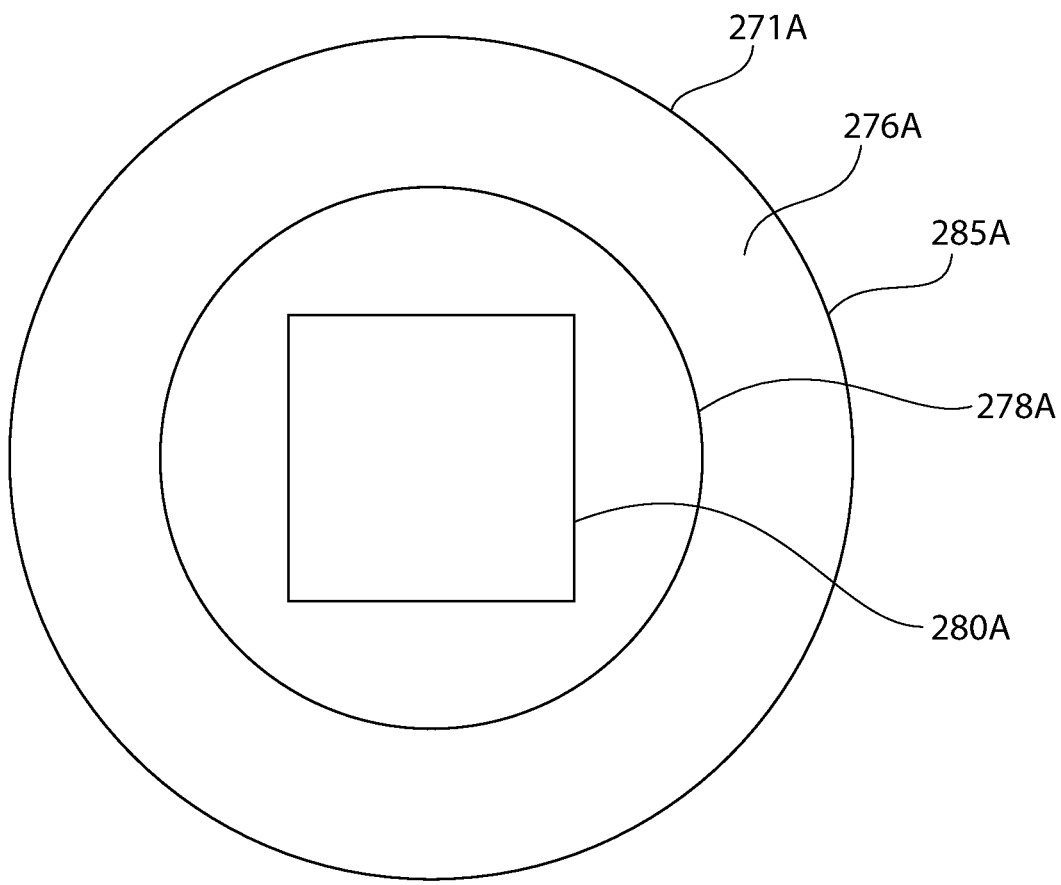
FIG. 55 is a top view of the seal of FIG. 55.

As can be seen in FIG. 51, the first seal ring 271A of the seal 270A receives the flow restrictor 260A. The flow restrictor 260A extends from a first end 261A to a second end 262A along a longitudinal axis A-A. As best seen in FIGS. 51 and 52, the first seal ring 271A has a first side 276A and a second side 277A opposite the first side 276A, a longitudinal axis B-B extending through the first seal ring 271A perpendicular to the first and second sides 276A, 277A. The first and second sides 276A, 277A engage the sealing recesses 155A, 295A and are compressed between them when the valve 150A is mounted to the base 290A. The first seal ring 271A also has an inner surface 278A which is generally cylindrical and a sealing web 279A which extends across the inner surface 278A. A flow aperture 280A is formed in the sealing web 279A to receive the flow restrictor 260A. The flow aperture 280A has a generally rectangular shape in the present embodiment, but in other embodiments it may be circular, elliptical, or any other shape suitable to accommodate a corresponding flow restrictor. The flow restrictor 260A has a generally rectangular profile along the longitudinal axis and is a close fit within the flow aperture 280A. Once the flow restrictor 260A is installed in the flow aperture 280A, it can be welded, bonded, or press fit to achieve a gas tight seal between the outer surface of the flow restrictor 260A and the sealing web 279A, ensuring that no process gas escapes past the flow restrictor 260A without passing through the flow restrictor 260A. The first seal ring 271A also has an outer surface 285A which may be of any size or diameter so long as the first seal ring 271A can nest within the sealing recesses 155A, 295A. In alternate configurations, the sealing recesses 155A, 295A may be omitted. In yet further configurations, the inner surface 278A and outer surface 285A need not be cylindrical, and may be rectangular, ellipsoid, polygonal, or any other shape.

The second seal ring 272A also has a first side 281A and a second side 282A. However, the second seal ring 272A differs from the first seal ring 271A in that it has no corresponding sealing web. Instead, the inner surface 283A defines a flow aperture that enables the passage of process gas without significant flow impedance. Ideally, the flow passages and the second seal ring 272A provide no restriction to fluid flow. In alternate embodiments, the seal 270A may comprise only the first seal ring 271A and be free of the second seal ring 272A or any other components. Alternately, there may be more than one of the first or second seal rings 271A, 272A.

In alternate embodiments, the flow aperture 280A of the first seal ring 271A may be circular, rectangular, have a polygon shape, may comprise arcs, or may have any known shape. Thus, any cross-section of flow restrictor may be accommodated in the seal ring 271A. In yet further embodiments, the seal ring 271A may be press fit, welded, bonded, or otherwise secured directly within a flow passage such as the outlet 157A of the valve 150A or the flow passages 292A of the base 290A. In yet further embodiments, the gasket sheet 273A may be omitted, such that the seal is comprised only of the seal ring 271A. The seal 270A is preferably constructed at least partially of a metal material. In the most preferred embodiments, the first and second seal rings 271A, 272A are metallic.

During assembly, the seal 270A is placed between the valve 150A and the base 290A and aligned so that the first and second seal rings 271A, 272A align with the sealing recesses 155A, 295A. The flow restrictor 260A then extends into the outlet 157A and the corresponding flow passage 292A in the base 290A. The flow restrictor 260A may be attached to the first seal ring 271A so that the seal is halfway along the length of the flow restrictor 260A, or it may be attached at any point along the length of the flow restrictor 260A. It may even be attached substantially flush with either the first or second end 261A, 262A. Furthermore, the seal 270A may be installed such that it is located within a portion of the valve 150A to minimize the distance between the valve seat 152A and the flow restrictor 260A, minimizing the volume therebetween. As noted previously, the seal 270A may also be configured so that the flow restrictor 260A is positioned upstream of the valve seat 152A and positioned in the inlet 158A instead of the outlet 157A. The seal of this embodiment can reliably produce a seal with a Helium leak rate better than $1 \times 10^{-11}$ atm-cc/sec, substantially eliminating all flow of process gas around the flow restrictor 260A.

Section III

Figure 56:
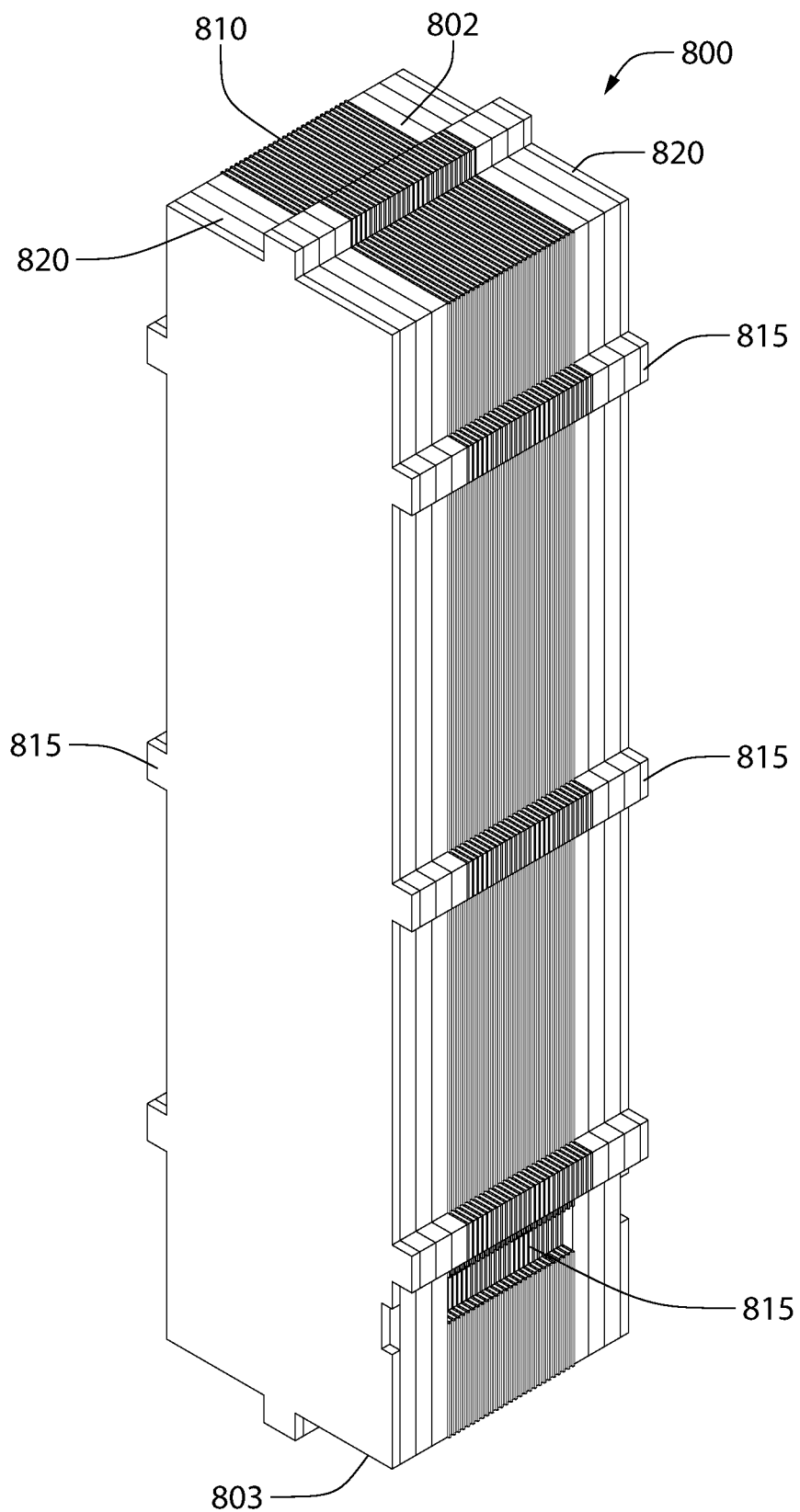
FIG. 56 is a perspective view of another embodiment of a laminar flow restrictor.
Figure 57:
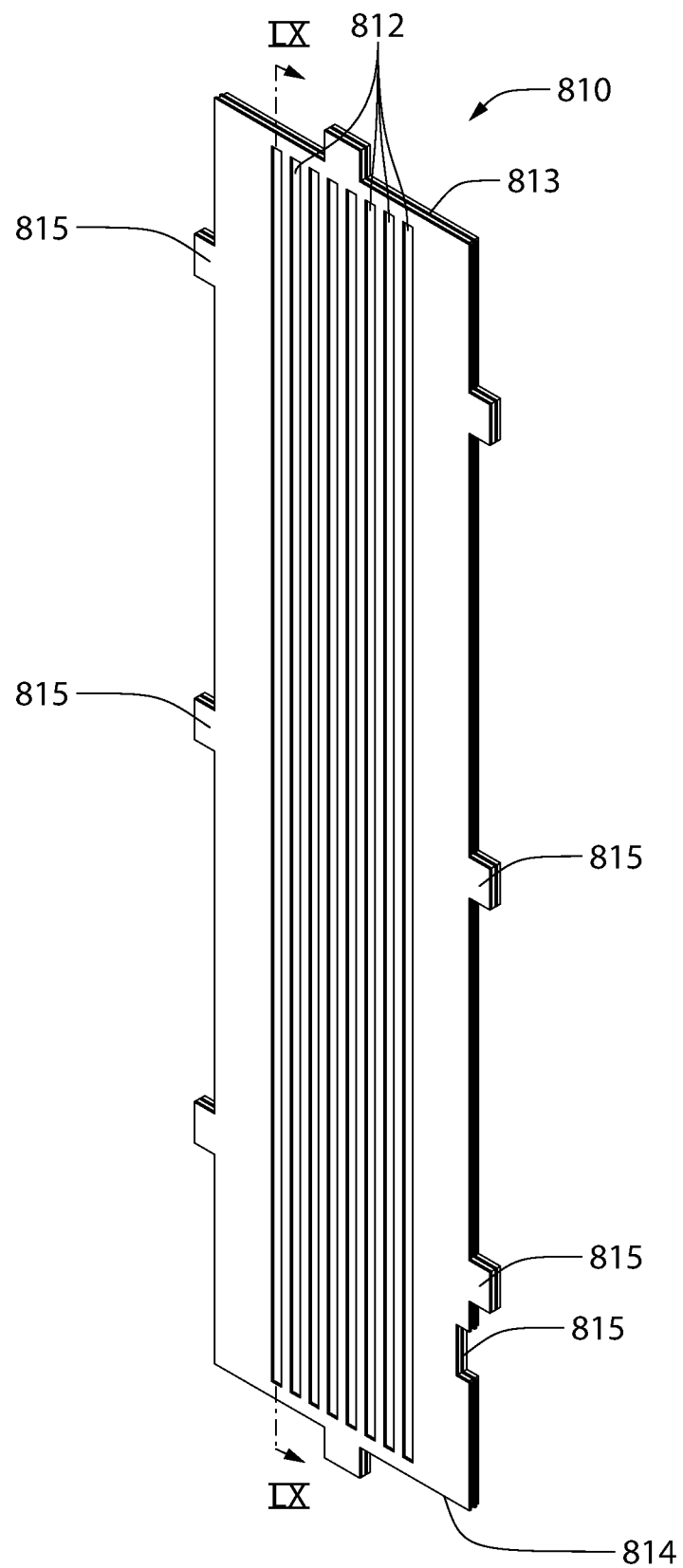
FIG. 57 is a perspective view illustrating a portion of the layers forming the flow restrictor of FIG. 56.

Yet another embodiment of a flow restrictor 800 is shown in FIGS. 56-62. FIG. 56 shows the flow restrictor 800 in perspective. The flow restrictor 800 extends from a first end 802 to a second end 803 and has outer layers 820 which surround layers 810 which have flow passages therein. A selection of the layers 810 are shown in FIG. 57 in perspective view. These layers 810 extend from a first end 813 to a second end 814, with apertures 812 on the first and second ends 813, 814. The apertures 812 are not exposed at the first and second ends 813, 814 but will be exposed during subsequent processing steps described in greater detail below. The apertures need not have a different width than the rest of the flow passage, and instead may merely be formed by exposing the flow passage in a subsequent material removal operation.

Figure 59:
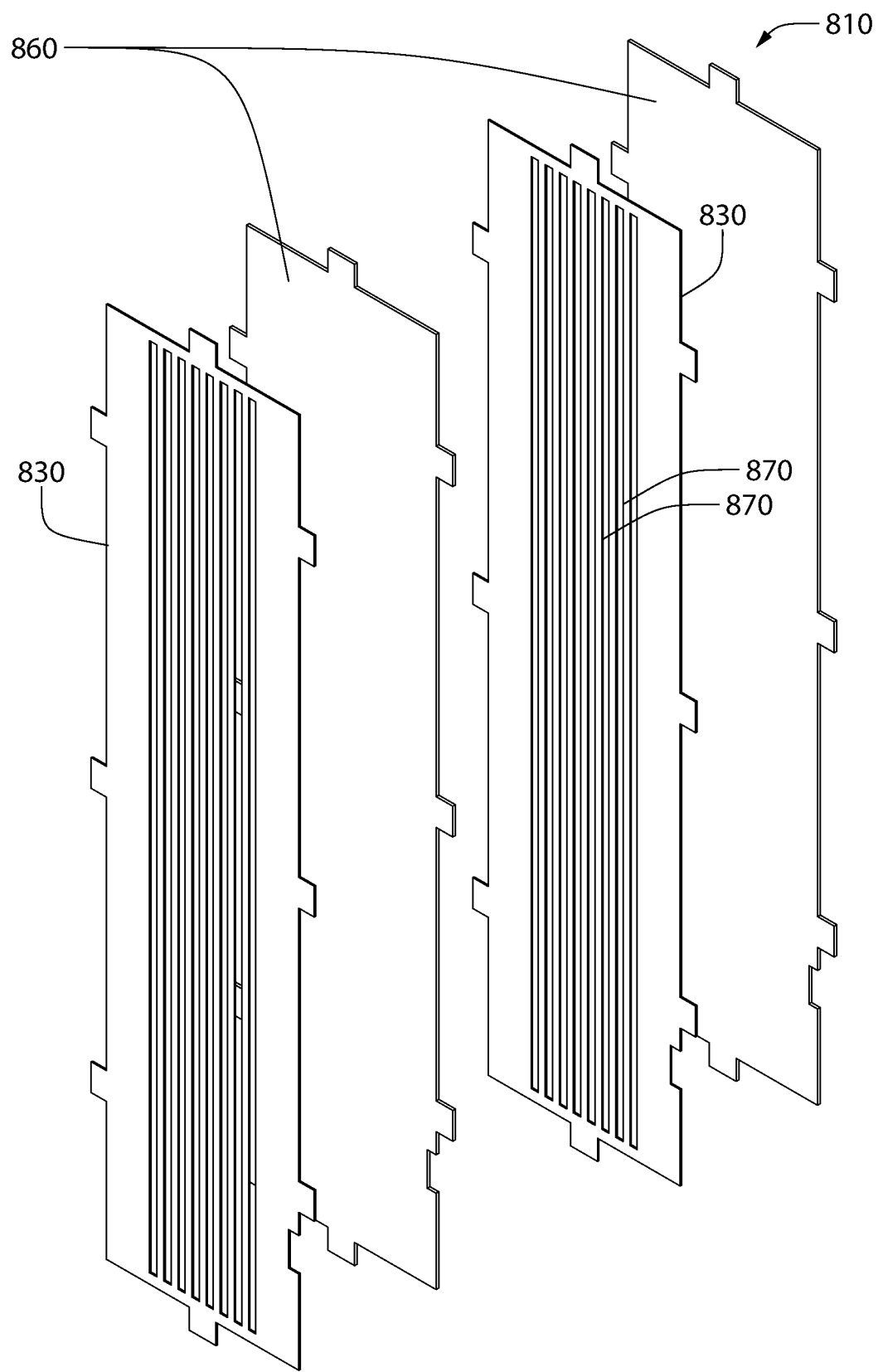
FIG. 59 is an exploded perspective view of the portion of the flow restrictor of FIG. 57.
Figure 60:
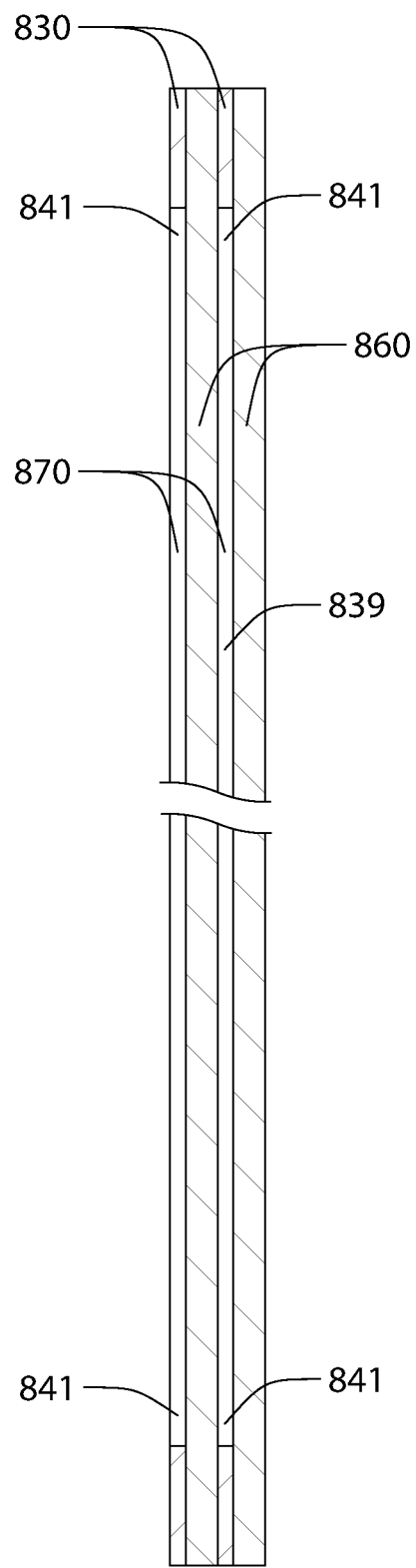
FIG. 60 is a cross-sectional view of the portion of the flow restrictor of FIG. 57, taken along line LX-LX.

A plurality of alignment features 815 are formed around the periphery of the layers 810, 820 to facilitate alignment and bonding of the layers 810, 820 to form the flow restrictor 800. The alignment features 815 may also be formed internal to the layers 810, 820 and may be formed as holes, slots, protuberances, or any other geometry that permits alignment. The alignment features 815 may also be used to facilitate mass production, ensure that layers 810, 820 are not flipped or otherwise upside-down, or for any other purpose. An exploded view of the layers 810 is shown in FIG. 59, illustrating two first layers 830 and two second layers 860. Flow passages 870 are formed in the first layers 830.

Figure 61:
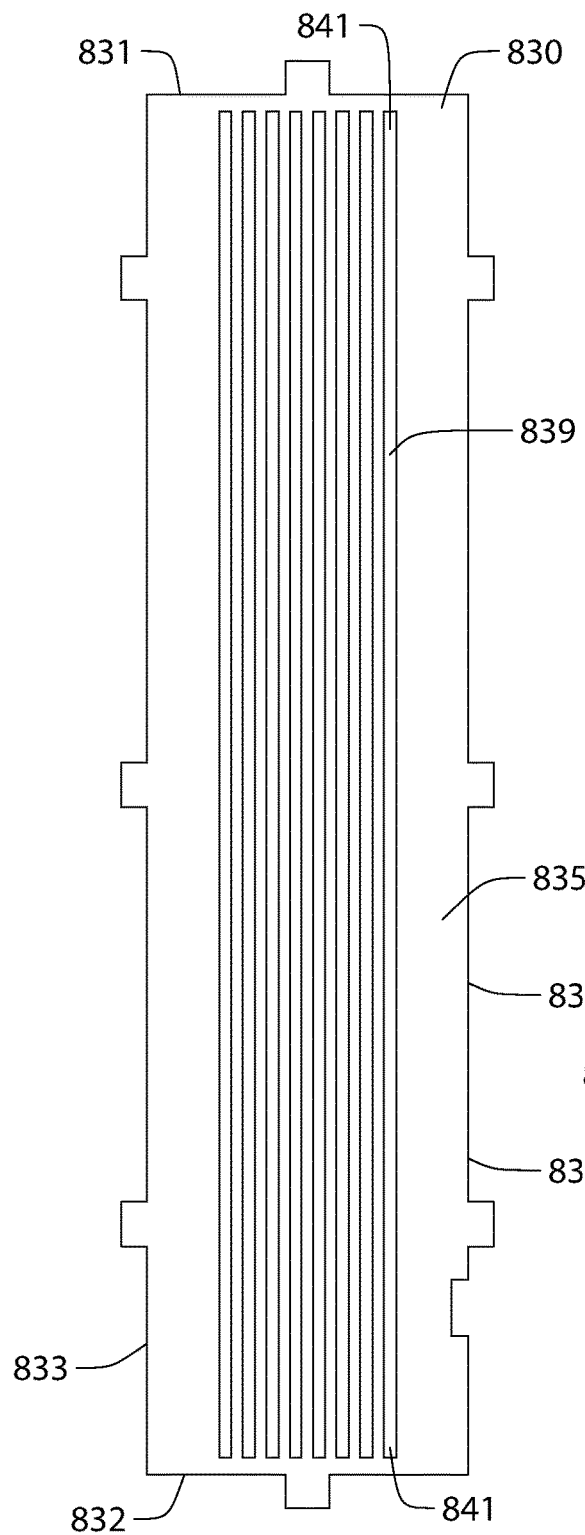
FIG. 61 is a top view a first layer of the flow restrictor of FIG. 57.
Figure 62:
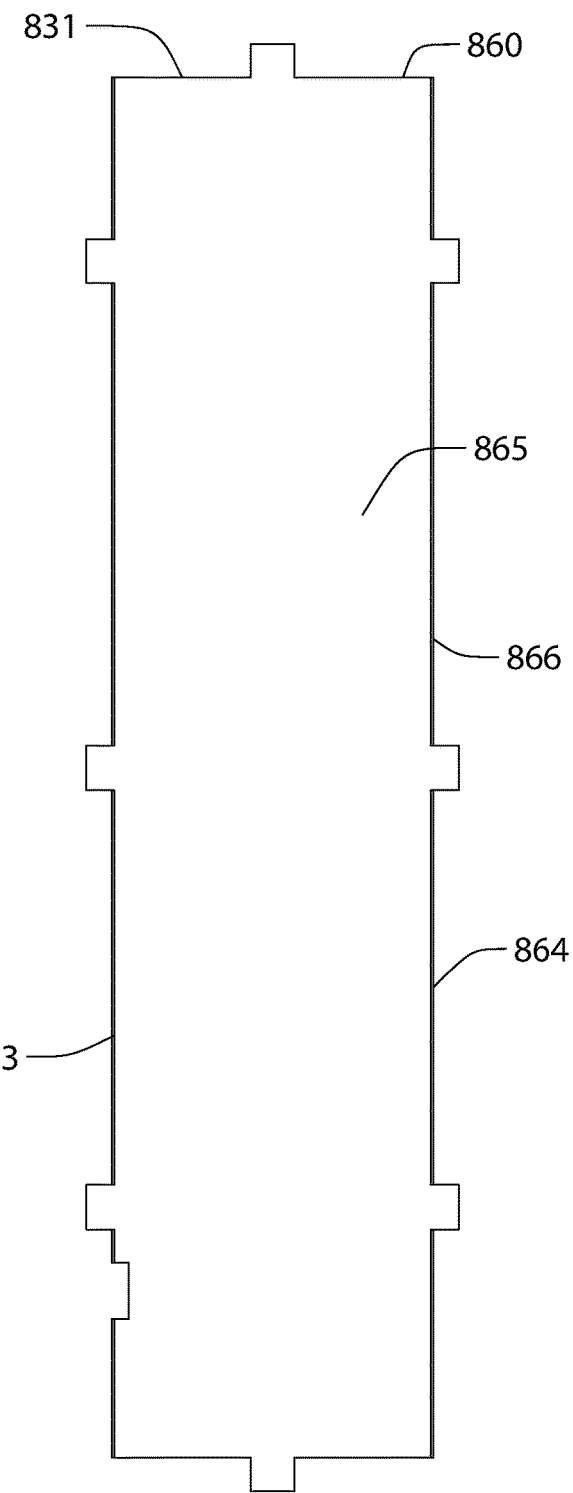
FIG. 62 is a top view a second layer of the flow restrictor of FIG. 67.

The first layer 830 and the second layer 860 are illustrated in FIGS. 61 and 62. The first layer 830 has a first side 831, a second side 832, a third side 833, a fourth side 834, a front face 835, and an opposite rear face 836. The second layer 860 has a first side 861, a second side 862, a third side 863, a fourth side 864, a front face 865, and an opposite rear face 866. The first layer 830 has a series of longitudinal passages 839 having an elongated configuration which extend from the first side 831 to the second side 832.

The second layer 860 is free of any flow passages or other features. As can be seen, in the flow restrictor 800, gas remains exclusively on a single layer 830 and does not transition between first and second layers 830, 860. The second layers form upper and lower boundaries of the flow passages, but do not have flow passages formed therein. The longitudinal passages 839 form the flow passages 870 when bounded by the second layers 860 on the front face 865 and the opposite rear face 866. Gas enters through an opening 841 at the first side 831, travels down a longitudinal passage 839, then exits through an opening 841 on the second side 832. The openings 841 are exposed in subsequent material removal operations as noted above to form the apertures 812. In some embodiments, the flow path may zig-zag, change direction, or take any other path on the layer 830. However, it never flows through the second layer 860 in this embodiment. The longitudinal passages 839 and openings 841 all extend through the entirety of the thickness of the first layer 830. In alternate configurations, single sheet flow may be obtained by forming the flow passage depth only partially through the sheet such that the sheet dimensions remain intact during assembly prior to bonding.

Figure 58:
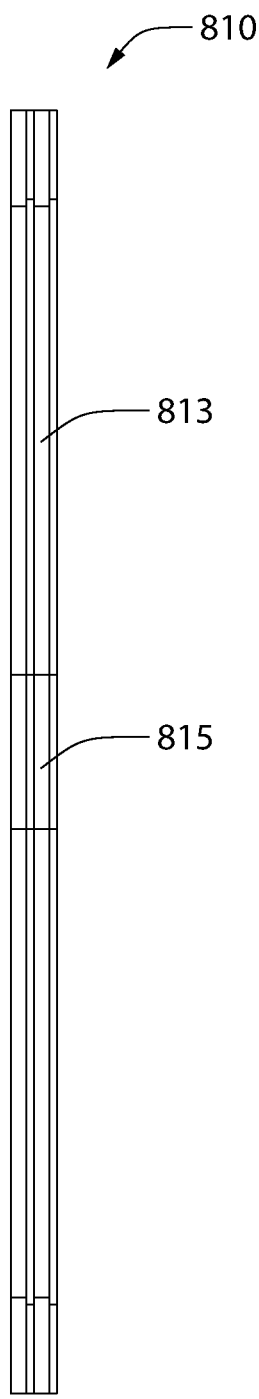
FIG. 58 is an end view of the portion of the flow restrictor of FIG. 57.

As best shown in FIG. 58, the flow passages 870 are formed by the stacking of the layers 830, 860 as shown. The layers 830, 860 are of unequal thickness in this embodiment, but may have the same thickness if desired. Furthermore, thickness of the layers 830 or the number of flow passages 870 can be altered to alter the restriction to fluid flow. Each of the first layers 830 may be etched individually, then later bonded in an alternating sequence with the second layers 860 to form the plurality of layers 810 having a plurality of flow passages 870 therein. Subsequently or concurrently, the outer layers 820 may be bonded together with the plurality of layers 810 to form the flow restrictor 800. Finally, post-processing is performed which exposes the openings 841 to form apertures 812 and allow fluid flow through the flow passages 870. Post-processing may include machining, grinding, or other techniques.

In other embodiments, the layers 830, 860 may be formed individually of different materials having a different reactivity when subjected to etching chemicals or may be formed of identical materials having the same reactivity when subjected to etching chemicals. Layers may be formed in pairs are formed by assembling one first layer 830 with one second layer 860. The layer pairs are then diffusion bonded so they cannot be readily separated. As discussed above, other bonding techniques may be utilized. Then, the layer pairs are etched so that the flow passages 870 are formed into the first layer 830 without etching the second layer 860. The layer pairs are then assembled into the plurality of layers 810 having flow passages 870. Outer layers 820 are also assembled with the plurality of layers 810 having the flow passages 870. Finally, the layers 810, 820 are diffusion bonded together. Optionally, post processing such as grinding may be used to form the flow restrictor 800 and adapt it for installation into a flow passage of a device.

In one method of finishing the flow restrictor 800, the flow restrictor 800 is formed by bonding the plurality of layers 810 and the outer layers 820 as discussed above. Subsequent to bonding of the layers 810, 820, the flow restrictor is machined to expose the outlets 841 and form the apertures 812. During the machining process, the flow restrictor 800 is machined to form a generally cylindrical shape suitable for insertion into a passage of a valve.

Subsequently, the machined flow restrictor 800 is ultrasonically cleaned. Nitrogen is then flowed through the flow passages 870 to eliminate particles. An electropolish process is then used to further clean the flow passages 870. Deionized water is used to rinse the flow passages 870 and remove any electropolish solution within the flow passages 870. A nitrogen purge is then flowed through the flow passages 870 to remove the deionized water. Nitric acid is then flowed through the flow passages 870 to further remove particles and debris, followed by another deionized water purge and nitrogen purge. Finally, another deionized water rinse is performed and the flow restrictor 800 is dried using a heated gas flow. This results in clean flow passages 870 which are free of debris or other particles such as machining remnants and the like. The flow restrictors 800 are clean and deliver highly predictable restrictions to fluid flow as a result of the processing operations performed thereon.

Figure 63:
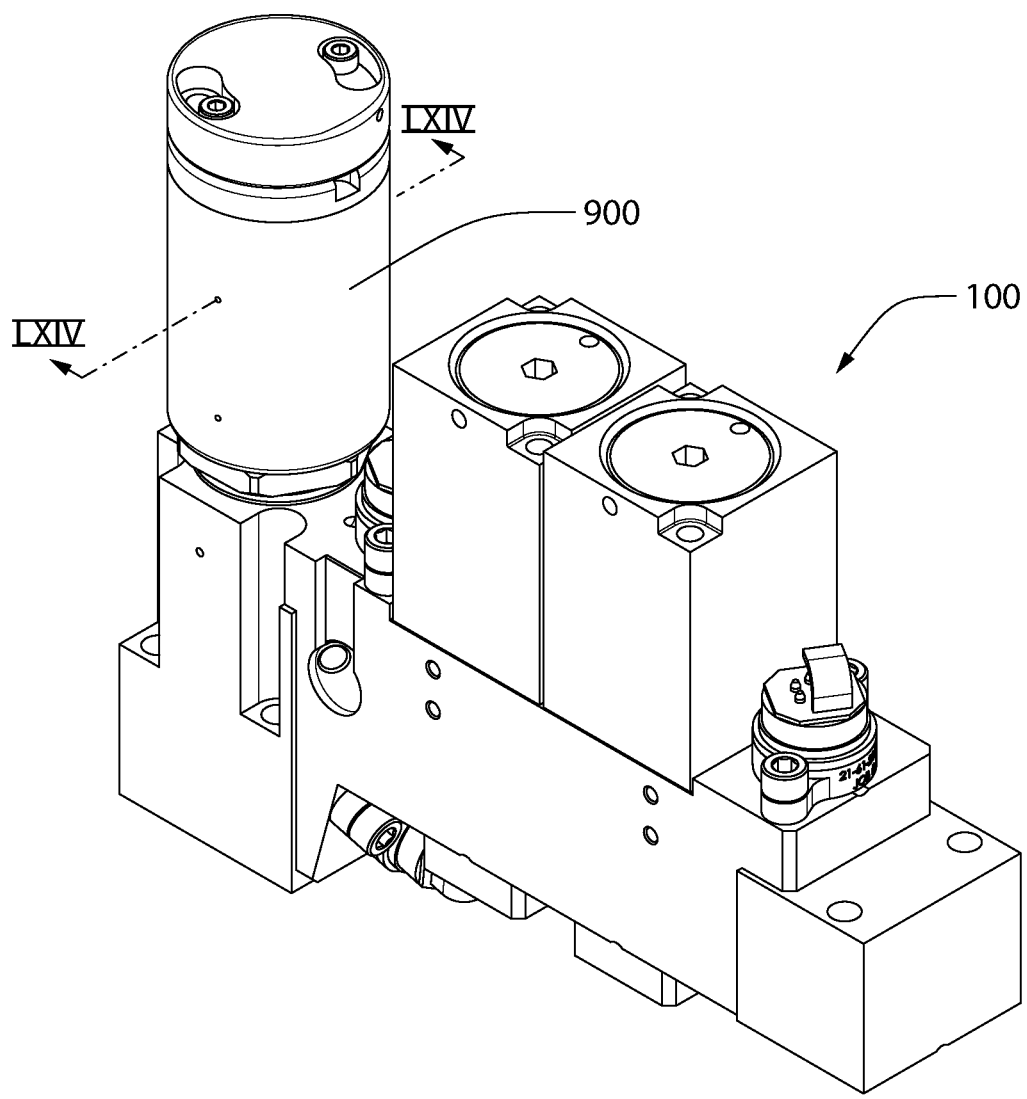
FIG. 63 is a perspective view of an apparatus for controlling flow.
Figure 64:
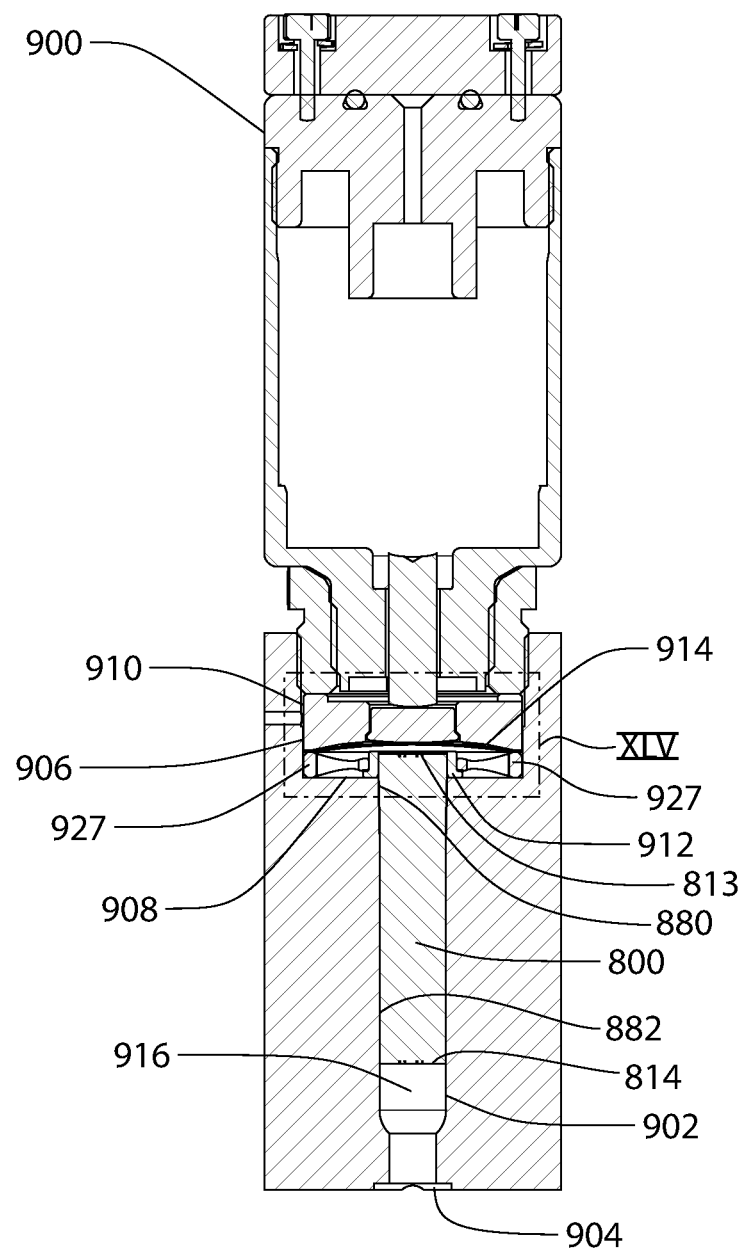
FIG. 64 is a cross-sectional view of the apparatus for controlling flow of FIG. 63, taken along line LXIV-LXIV.
Figure 65:
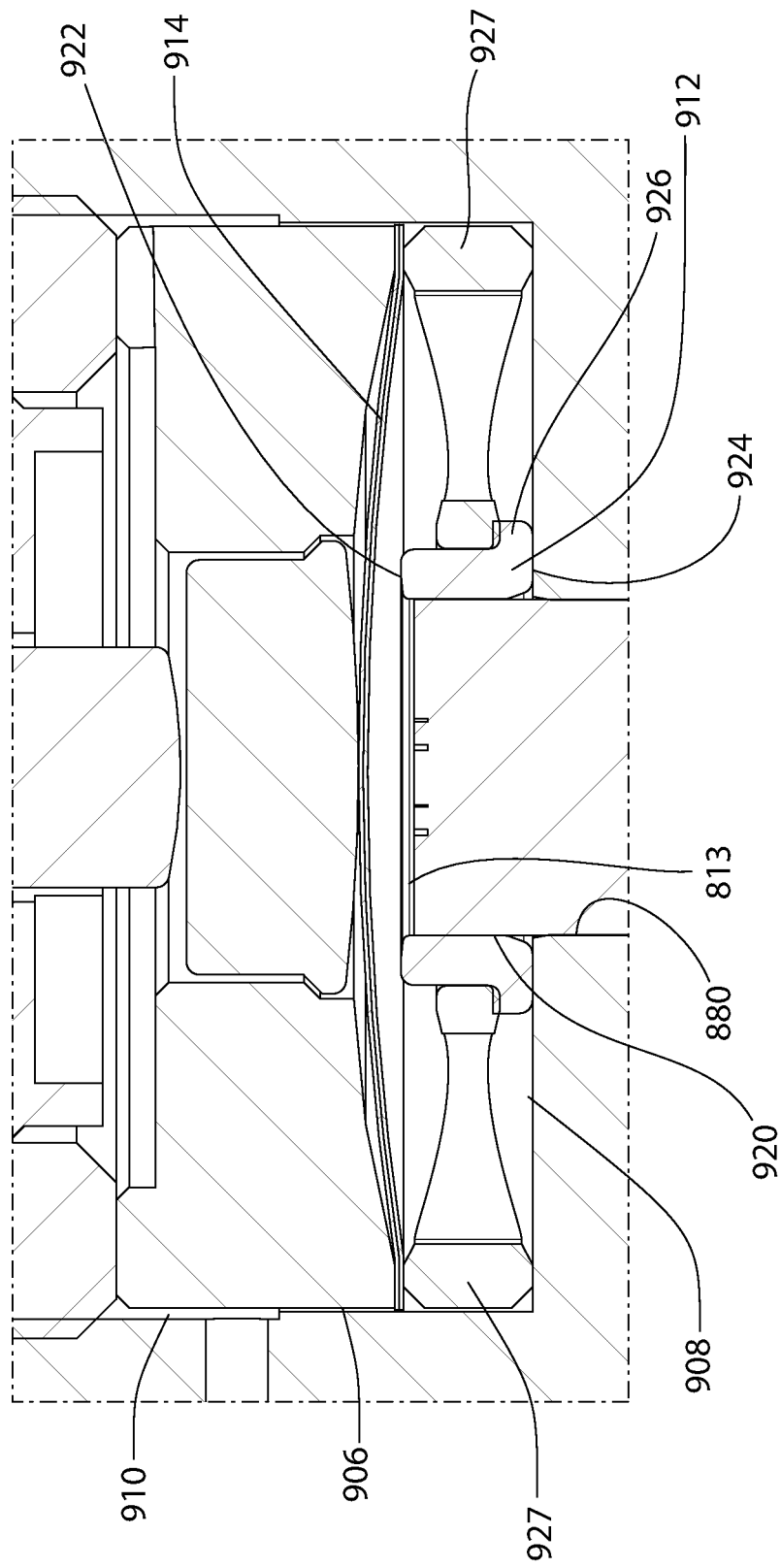
FIG. 65 is an enlarged view of a portion of the cross-sectional view of FIG. 64.

Turning to FIGS. 63 to 65, an exemplary apparatus for controlling fluid flow 100 is illustrated. The apparatus 100 has a valve 900, the valve 900 being either a proportional valve or an on/off valve. The valve 900 has a passage 902 through which a fluid flows. The passage extends from a port 904 to a basin 906. The basin 906 has a floor 908 and a sidewall 910. A seal 912 serves as a seat for the valve 900. A closure member 914 engages the seal 912 to permit or prevent fluid flow through the valve 900.

The seal 912 is illustrated in greater detail in FIG. 65. The seal 912 has an inner surface 920 which engages a sealing surface 880 of the flow restrictor 800. The inner surface 920 forms an aperture which receives the flow restrictor 800 to form a fluid-tight connection between the flow restrictor and the seal. The inner surface 920 forms a first seal which seals against the sealing surface 880 of the flow restrictor.

The sealing surface 880 also engages an inner surface 916 of the passage 902. The sealing surface 880 may form an interference fit with the passage 902 and with the inner surface 920 of the seal 912. This enables a fluid-tight connection between the flow restrictor 800 and both the passage 902 and the seal 912. Alternately, the sealing surface 880 may only be sealed against one of the inner surface 920 of the seal 912 or the inner surface 916 of the passage 902. The sealing surface 880 may also be referred to as a sealing portion because it interfaces with the inner surface 210 of the seal 912 to form the first seal.

The seal further comprises a seat surface 922, a floor surface 924, and a flange 926. The flange 926 engages a retainer component 927 which maintains the seal 912 in position within the basin 906. The floor surface 924 rests against the floor 908 of the basin 906. The interface between the floor surface 924 of the seal 912 and the floor 908 of the basin 906 may also provide a second seal to prevent leakage of fluid past the seal 912 and into the passage 902. The seat surface 922 engages the closure member 914 of the valve 900 to prevent fluid flow through the flow restrictor 800. Optionally, the seal 912 may be formed of a non-metallic material. The seal 912 may be formed of a polymer material such as polytetrafluoroethylene. Alternately, it may be formed of a metallic or composite material.

As can be seen in FIGS. 64 and 65, the flow restrictor 800 also has a clearance surface 882 which has a smaller diameter than the sealing surface 880. This is done to provide clearance for the flow restrictor 800 within the passage 902. The first end 813 of the flow restrictor 800 is recessed with respect to the seat surface 922 to ensure that the flow restrictor 800 does not interfere with the closure member 914 during operation of the valve 900. The second end 814 extends into the passage 902 and does not extend to the port 904.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A flow restrictor for restricting the flow of a gas, the flow restrictor comprising:

a first end;

a second end, a longitudinal axis extending from the first end to the second end;

a plurality of first layers extending from the first end to the second end along the longitudinal axis;

a plurality of second layers extending from the first end to the second end along the longitudinal axis;

a first aperture at the first end defined by a first one of the plurality of first layers and the plurality of second layers;

a second aperture at the second end defined by the first layer of the plurality of first layers and the plurality of second layers;

wherein a flow passage is defined by the first layer of the plurality first layers and the plurality of second layers, the flow passage extending from the first aperture to the second aperture.

2. The flow restrictor of claim 1 further comprising a plurality of first apertures, a plurality of second apertures, and a plurality of flow passages, each of the plurality of flow passages extending from a single one of the first apertures to a single one of the second apertures.

3. The flow restrictor of claim 1 wherein the plurality of first layers and the plurality of second layers are arranged in a resistor stack, the resistor stack comprising alternating ones of the plurality of first layers and the plurality of second layers.

4. The flow restrictor of claim 1 wherein each layer of the plurality of first layers is spaced and isolated from every other layer of the plurality of first layers.

5. The flow restrictor of claim 1 wherein the plurality of first layers and the plurality of second layers form a resistor stack, wherein the resistor stack further comprises a plurality of outer layers forming a front face and an opposite rear face of the flow restrictor.

6. The flow restrictor of claim 1 wherein each of the plurality of first layers comprises a first side, a second side opposite the first side, a third side, a fourth side opposite the third side, a front face, and an opposite rear face, the flow passage comprising a longitudinal passage formed into the front face of the first layer of the plurality of first layers.

7. The flow restrictor of claim 6 wherein the longitudinal passage extends from the front face of the first layer of the plurality of first layers to the rear face of the first layer of the plurality of first layers.

8. The flow restrictor of claim 1 wherein each of the plurality of first layers are identical and each of the plurality of second layers are identical.

9. The flow restrictor of claim 1 wherein the flow passage comprises a longitudinal passage extending parallel to the longitudinal axis.

10. A flow restrictor for restricting fluid flow, the flow restrictor comprising:

a first end;

a second end, a longitudinal axis extending from the first end to the second end;

a first one of a plurality of first layers extending from the first end to the second end along the longitudinal axis;

first and second ones of a plurality of second layers extending from the first end to the second end along the longitudinal axis;

a first aperture at the first end defined by the first one of the plurality of first layers and the first and second ones of the plurality of second layers;

a second aperture at the second end defined by the first layer of the plurality of first layers and the first and second ones of the plurality of second layers;

wherein a flow passage is defined by the first layer of the plurality first layers and the first and second ones of the plurality of second layers, the flow passage extending from the first aperture to the second aperture.

11. The flow restrictor of claim 10 wherein each layer of the plurality of second layers is identical.

12. The flow restrictor of claim 11 wherein the first one of the plurality of first layers is located between the first and second ones of the plurality of second layers.

13. The flow restrictor of claim 10 wherein the plurality of second layers is free of flow passages.

14. The flow restrictor of claim 10 wherein the plurality of first layers and the plurality of second layers are planar.

15. A flow restrictor for restricting fluid flow, the flow restrictor comprising:
   a first end;
   a second end, a longitudinal axis extending from the first end to the second end;
   first, second, and third layers extending from the first end to the second end along the longitudinal axis;
   a first aperture at the first end defined by the first, second, and third layers;
   a second aperture at the second end defined by the first, second, and third layers; and
   a flow passage formed in the first layer, the flow passage extending from the first aperture to the second aperture.

16. The flow restrictor of claim 15 wherein the second and third layers are identical.

17. The flow restrictor of claim 15 wherein the first layer is located between the second and third layers.

18. The flow restrictor of claim 15 wherein the second and third layers are free of flow passages.

19. The flow restrictor of claim 15 wherein the first, second, and third layers are planar.

\* \* \* \* \*